United States Patent [19]
Yamamoto et al.

[11] Patent Number: 5,751,185
[45] Date of Patent: May 12, 1998

[54] LOW PASS FILTER CIRCUIT UTILIZING TRANSISTORS AS INDUCTIVE ELEMENTS

[75] Inventors: Takuji Yamamoto; Naoki Kuwata, both of Kawasaki, Japan

[73] Assignee: Fujitsu Limited, Kanagawa, Japan

[21] Appl. No.: 827,780

[22] Filed: Apr. 11, 1997

Related U.S. Application Data

[63] Continuation of Ser. No. 689,386, Aug. 12, 1996, abandoned, which is a continuation of Ser. No. 387,876, Feb. 22, 1995, abandoned.

[30] Foreign Application Priority Data

Jul. 27, 1993 [JP] Japan .................................. 5-184256
Feb. 9, 1994 [JP] Japan .................................. 6-014733

[51] Int. Cl.$^6$ .................................................. H03H 1/00
[52] U.S. Cl. .................................................. 327/558; 327/552
[58] Field of Search .................................. 327/336, 344, 327/552, 553, 555, 558

[56] References Cited

U.S. PATENT DOCUMENTS

| | | | |
|---|---|---|---|
| 3,517,223 | 6/1970 | Gaunt, Jr. .............. | 327/552 |
| 3,577,016 | 5/1971 | Weldmann ............. | 327/558 |
| 4,087,757 | 5/1978 | Cunningham .......... | 327/553 |
| 4,363,004 | 12/1982 | Englund, Jr. et al. ... | 327/553 |
| 4,424,462 | 1/1984 | Gay ....................... | 327/558 |
| 4,877,979 | 10/1989 | Sempel .................. | 327/558 |
| 5,099,155 | 3/1992 | Mohwinkel ............ | 327/558 |
| 5,293,087 | 3/1994 | Hamano et al. ........ | 327/558 |

FOREIGN PATENT DOCUMENTS

| | | |
|---|---|---|
| 0 125 426 | 11/1984 | European Pat. Off. . |
| 49-36839 | 4/1974 | Japan . |
| 49-148838 | 12/1974 | Japan . |
| 51-40737 | 4/1976 | Japan . |
| 54-135137 | 9/1979 | Japan . |
| 56-166616 | 12/1981 | Japan . |
| 62-160809 | 7/1987 | Japan . |
| 2-44425 | 3/1990 | Japan . |
| 2-202212 | 8/1990 | Japan . |
| 4-23607 | 1/1992 | Japan . |
| 4-150513 | 5/1992 | Japan . |
| 2 077 559 | 12/1981 | United Kingdom . |

OTHER PUBLICATIONS

J. Choma et al. "Actively Peaked Broadbanded Monolithic Amplifier" *IEEE Proc.* vol. 127 Pt. G No. 2 Apr. 1980.

J. Choma et al. "A Broadbanded Common Collector Common-Base Differential Quartet" *IEEE Journal of Solid State Circuits* vol. ed-16, No. 2, Apr. 1981.

J.Choma, Jun "Output Inductance of an Emitter Follower", *Electronic Circuits and Systems*, vol. 3 No. 4 Jul. 1979.

Simpson, "Two Active Low–Pass Instrumentation Filters", Aug. 1971, p. 45.

*Primary Examiner*—Terry Cunningham
*Attorney, Agent, or Firm*—Helfgott & Karas, P.C.

[57] ABSTRACT

The present invention relates to a filter circuit which is suitable for use in an integrated circuit formed of transistors or field effect transistors, and controls the frequency band of the amplifying circuit used for the signal receiver, for example, within an optical communications system. The filter circuit includes a first transistor (T1) having a base or gate grounded with high-frequency component via a first resistor (R1); and a second resistor (R2) and a capacitor (C1) each having one end connected to the emitter or source of the first transistor (T1) and the other terminal grounded with high-frequency component. The filter circuit acts as a circuit in which the first transistor (T1) inputs the current (Iin) at a juncture at which the second resistor (R2) and the capacitor (C1) are connected therewith and outputs its collector or drain current (Iout).

2 Claims, 45 Drawing Sheets

POWER SOURCE OR GND

POWER SOURCE OR GND

POWER SOURCE OR GND

POWER SOURCE OR GND

F I G. 8(a)
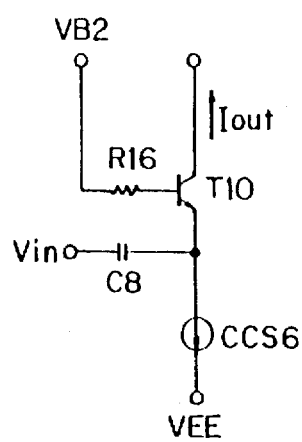
F I G. 8(b)
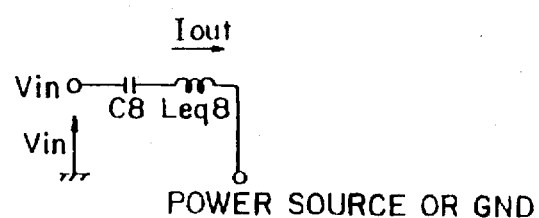

F I G. 13
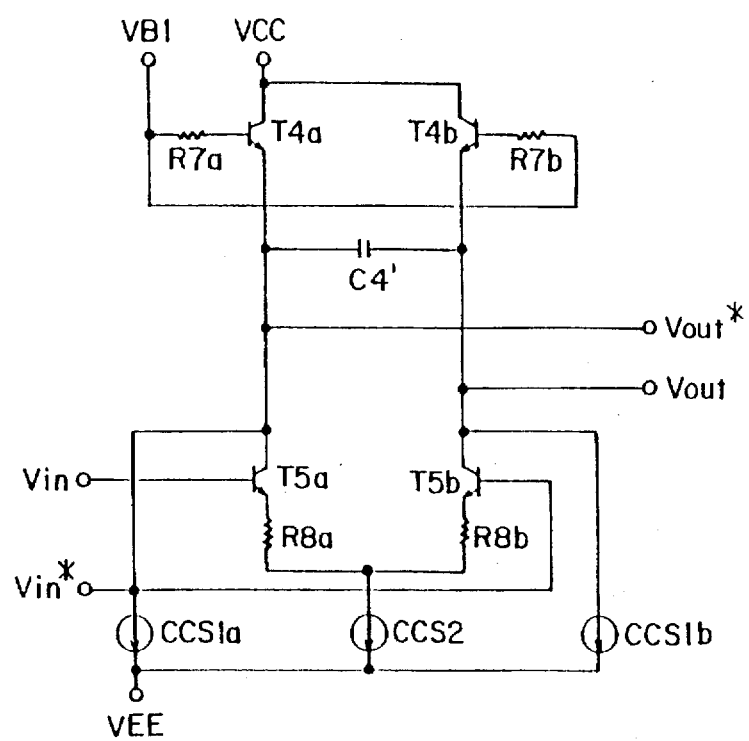

LOW PASS FILTER CIRCUIT UTILIZING TRANSISTORS AS INDUCTIVE ELEMENTS

This is a continuation of application Ser. No. 08/689,386, filed Aug. 12, 1996, now abandoned, which is a continuation of application Ser. No. 08/387,876, filed Feb. 22, 1995, now abandoned, which is a continuation of PCT/JP94/01234 filed Jul. 26, 1994.

TECHNICAL FIELD

The present invention relates to a filter circuit which is suitable for conversion to an integrated circuit formed of transistors or field-effect transistors and controls the frequency band of the amplifying circuit used for the signal receiver, for example, within an optical communications system.

BACKGROUND ART

In the receiving unit arranged in an optical communications system, plural filter circuits are used in accordance with purposes. That is, the equalizing and amplifying circuit needs a low-pass filter circuit to have the optimum frequency band and optimum cut-off characteristic determined in the waveform interference/noise band tradeoffs. The timing-clock amplifying circuit needs a low-pass filter, a high-pass filter, or a band-pass filter of which each suppresses the jitter due to circuit noises and prevents erroneous operation due to harmonic components.

Recently, the optical communications systems which operate at a high transmission speed of 2.4 Gb/s are already in an actual use. The development of the system operating as speed as 5 Gb/s to 10 Gb/s is being spurred. With this system development, the filter circuit must operate at operable frequencies of several GHz to 10 GHz to be used for the amplifying circuit.

Moreover, the filter circuit which can vary its cut-off frequency and center frequency is needed in order to share a filter circuit used in a system which operates at a different transmission speed and to suppress the characteristic deviation due to variations between the circuit forming components and characteristic variation due to characteristic drifts in circuit elements.

In the optical communications systems, the system forming circuits have evolved from discrete-parts assembled circuits into integrated circuits. Moreover, the integrating technology with which analog circuits and digital circuits are formed on a semiconductor chip has been in practical use. Hence it is desirable to match the filter circuit to the above-mentioned technology. The active filter circuit can respond to such a demand.

An active filter circuit formed of an operational amplifier and a CR circuit has been first developed. The reason is that utilizing the high gain, very high input impedance, and low output impedance of the operational amplifier allows the simple circuit design.

However, the operational amplifier cannot be used for the above-mentioned high-speed system because its effective frequency range is narrow. Hence, the art which can construct an active filter circuit formed of wide-range operable active elements has been more concerned importantly.

In order to deal with plural transmission speeds with the same integrated circuit and to provide general versatility, a filter circuit that can vary its frequency over a wide range is required.

FIG. 48 is a diagram showing the constructional example of the optical signal receiving unit arranged in an optical communications system. Referring to FIG. 48, numeral 1 represents a light receiving element, 2 represents an equalizing and amplifying circuit, 3 represents a slicing and amplifying circuit, 4 represents a timing extracting circuit, 5 represents a filter, 6 represents a limiting and amplifying circuit, and 7 represents a decision circuit.

The light receiving element 1 converts an optical signal into an electrical signal. The equalizing and amplifying circuit 2 amplifies linearly an electrical signal converted by the light receiving element 1 to a predetermined amplitude. The slicing and amplifying circuit 3 slices the signal amplified by the equalizing and amplifying circuit 2.

The timing extracting circuit 4 extracts a frequency timing of the signal amplified by the equalizing and amplifying circuit 2 to output clocks pulses. The filter 5 reduces noises included in the clock. The limiting and amplifying circuit 6 limit-amplifies the clock passed through the filter 5 to a predetermined amplitude.

The decision circuit 7 discriminates the data signal amplified by the slicing and amplifying circuit 3 in response to the clock signal amplified by the limiting and amplifying circuit 6 to output data.

The optical signal receiving unit with the above-mentioned structure can amplify the signal weakened due to the long distance transmission in an optical communications system.

In the equalizing and amplifying circuit 2, the S/N ratio is degraded because of the widened noise range in an excessively widened frequency range. On the contrary, the receiving sensitivity is degraded because of an increased waveform interference when the frequency range is excessively narrowed.

Since the equalizing and amplifying circuit 2 has the optimum frequency range according to the applicable transmission speed in the equilibrium of noise range and waveform interference, it is necessary to build an active low-pass filter circuit with good performance in the equalizing and amplifying circuit 2 in an integrated circuit form.

In order to suppress jitter due to internal noises therein and to prevent an erroneous circuit operation due to harmonic components produced in its limiting and amplification, the limiting and amplifying circuit 6 needs its tuning characteristic. In order to realize the tuning characteristic in the integrated circuit, the active filter circuit such as a low-pass filter circuit, a high-pass filter circuit, or a band-pass filter is needed.

In any cases, it is needed that the frequency-band variable filter circuit can vary its characteristic to deal with range variations or unintentional peaking due to manufactual variations of an integrated circuit including the above-mentioned amplifying circuit.

A prior-art active filter circuit and frequency-range variable filter circuit will be described below.

First, a prior-art active filter circuit will be described below.

FIG. 49 is a diagram showing a prior art active low-pass filter circuit. Referring to FIG. 49, symbols T17a and T17b represent input transistors; T18a and T18b represents resistors, or output transistors, each of which decides the cut-off frequency; T19a and T19b represent capacitors each of which decides the cut-off frequency; R18a and R18b represent resistors each of which converts an input voltage into a current; R19a and R19b represent resistors each of which converts a current into a voltage or output voltage.

The circuit, shown in FIG. 49, is a RC filter circuit with a first-order cut-off characteristic which is formed of a resistor counting each of the transistors T18a and T18b and a capacitance counting each of the transistors T19a and T19b.

If the current amplification constant βo of each of the transistors T18a and T18b is sufficiently large, the resistors counting the transistors T18a and T18b correspond to the emitter resistor $r_e$, respectively. Because the juncture between the emitters of the transistors T19a and T19b is regarded as an imaginary ground, the capacitance counting the transistors T19a and T19b is the sum of the collector junction capacitance CJC, the emitter junction capacitance CJE, and the emitter diffusion capacitor Cd. Hence the cut-off frequency fc is expressed by the following formula:

$$fc=1/[2\pi r_e(Cd+C_{JE}+C_{JC})]$$

The filter circuit, shown in FIG. 49, can adjust its cut-off frequency by controlling the bias current of each of the transistors T19a and T19b because the emitter diffusion capacitance Cd is proportional to the emitter current (in a normal bias condition of Cd>>CJE, CJC is established).

This circuit can be used as a balanced circuit in which an input voltage is applied between the base of the transistor T17a and the base of the transistor T17b to produce the output between the collector of the transistor T18a and the collector of the transistor T18b, an unbalanced circuit in which an input voltage is input between the base of the transistor T17a or T17b and the ground to produce an output between the collector of the transistor T18a or T18b and the ground, or a circuit which has a balanced input and an unbalanced output, and vice versa.

However, since the circuit, shown in FIG. 49, is a primary filter circuit (with a first-order cut-off characteristic), the secondary filter circuit (with a second-order cut-off characteristic) may be realized by cascading the same circuits (shown in FIG. 49) or by using a LCR filter circuit with secondary characteristic) including a coil (L) and a capacitor (C).

In the former case, there is a disadvantage in that cascading the primary active filter circuits decreases the cutoff frequency. The practical active filter circuit needs the voltage shift circuit added therein, shown in FIG. 49, thus causing the large circuit scale.

Turning to the latter case, in order to realize the LCR filter circuit with a secondary characteristic formed of coils and capacitors, there is a disadvantage in that a coil cannot be suited to the integrated circuit and the complicated coil equivalent circuit makes it difficult to control the characteristic.

Next, a prior art frequency band variable filter circuit will be described below.

FIGS. 50 to 52 are diagrams each showing the structural example of a prior art band variable filter circuit.

In the circuit, shown in FIG. 50, the casaded transistors 401a and 401b have emitters connected respectively to the bases of a differential pair of the transistors 501a and 501b. Thus, the frequency band control circuit is exampled that cuts frequencies by means of the emitter resistors $r_e$ of the transistors 401a and 401b and the emitter diffusion capacitance Cd (∝IE) each of the differential pair of the transistors 501a and 501b.

The frequency range of the filter circuit can be controlled by controlling the emitter current IE of each of the differential pair of the transistors 501a and 501b by means of the variable current source 701b.

The frequency range f of the filter circuit, shown with a 3dB down region, is decided by the frequency range fORG of a filter circuit with no frequency band control circuit and the frequency range fCNTL of a filter circuit with a frequency band control circuit.

In this case, the frequency range fCNTL of the filter circuit with a frequency band control circuit is expressed by the formula: fCNTL=½$\pi r_e$[Cd(Ie)+CJE+CJC], where CJE is the base-emitter junction capacitance of each of the differential pair of the transistors 501a and 501b, CJC is the base-collector capacitance of each of the differential pair of the transistors 501a and 501b, and $r_e$ is an emitter resistor of each of the transistors 401a and 401b.

The maximum frequency range fCNTL(MAX) and the minimum frequency range fCNTL(MIN) of the frequency band control circuit are respectively expressed as follows:

$$f_{CNTL(MAX)}=½\pi r_e(C_{JE}+C_{JC})$$

$$f_{CNTL(MIN)}=½r_e\ Cd(I_{E(MAX)})$$

As apparent from the above-formulas, the frequency band control circuit is formed so as to satisfy the relationship of fCNTL(MIN)<fORG<fCNTL(MAX), the frequency range f of the entire circuit can be controlled within fCNTL(MIN)<f<fORG.

FIG. 51 is a graph showing an example of the result of the frequency band variable characteristics, simulated by means of the SPICE. As shown in FIG. 50, the frequency band can be narrowed as the emitter current IE increases.

The structural example of the filter circuit, shown in FIG. 52, utilizes that the transition frequency fT (a frequency at which the current amplification factor β is 1 in the case of the emitter ground) of a transistor depends on the collector current thereof. Thus, two differential pairs are connected in parallel. The current varying circuit controls the current branching through the two differential pairs at a distribution ratio so that the frequency band is controlled.

In order to spread the variable frequency band width of the filter shown in FIG. 50, it is needed to narrow more the minimum frequency range by increasing the emitter current IE.

However, increasing the emitter current IE requires enlarging the sizes of the transistors 501a and 501b in the control circuit. As a result, the increased parasitic capacitance (CJE, CJC) of each of the control circuit transistors 501a and 501b may degrade the maximum frequency band fCNTL(MAX).

Since the frequency band f of the entire circuit becomes fCNTL(MIN)<f<fCNTL(MAX) (<fORG), the maximum frequency range is narrowed, compared with no control circuit. Hence there is a disadvantage in that it is difficult to control the frequency variable width over a wide range.

Furthermore, there is a disadvantage in that the filter circuit shown in FIG. 52 cannot stably set the frequency range because it is difficult to control the current distribution ratio to adjust the frequency range.

The present invention is made to overcome the above mentioned problems. An object of the present invention is to provide a filter circuit suitable for integrated circuits which has a secondary cut-off characteristic showing a wide, stable, variable frequency range without deteriorating the maximum frequency range of the entire circuit.

DISCLOSURE OF INVENTION

According to the present invention, the filter circuit is characterized by a first transistor having a base or gate grounded with a high-frequency component via a first resistor; and a second resistor and a capacitor each having one end connected to an emitter or source of the first transistor and the other terminal grounded with a high-frequency component; whereby a current is input at a juncture at which the second resistor, the capacitor, and the first transistor are connected together and a collector or drain current is output from the first transistor.

According to the present invention, the filter circuit is characterized by a first transistor having a base or gate connected to a first resistor, a collector or drain grounded with a high frequency component via an impedance of zero ohms or more, and an emitter or source connected to an equivalent current source; and a second resistor and a capacitor each having one terminal connected to the emitter or source of the first transistor and the other terminal grounded with a high frequency; whereby a voltage is input to the other terminal of the first resistor and the emitter or source voltage of the first transistor is output.

Furthermore, according to the present invention, the filter circuit is characterized by a first transistor having a base or gate grounded with a high frequency component via a first resistor, and a collector or drain grounded with a high frequency component via an impedance of zero ohms or more; and a second resistor having one terminal connected to the emitter or source of the first transistor and the other terminal grounded with a high frequency component; and a capacitor connected to the emitter or source of the first transistor; whereby a current is input at a juncture at which the second resistor and the emitter or source of the first transistor are connected together and a current is output from the other terminal of the capacitor.

According to the present invention, the filter circuit is characterized by a first transistor having a base or gate grounded with a high frequency component via a first resistor, a collector or drain grounded with a high-frequency component via an impedance of zero ohms or more, and an emitter or source connected to an equivalent current source; a second resistor having one terminal connected to the emitter or source of the first transistor and the other terminal grounded with a high-frequency component; and a capacitor having one terminal connected to the emitter of source of the first transistor; whereby a voltage is input to the other terminal of the capacitor and the emitter or source voltage of the first transistor is output.

Furthermore, according to the present invention, the filter circuit is characterized by a first transistor having a base or gate grounded with a high-frequency component via a first resistor, a collector or drain grounded with a high-frequency component via an impedance of zero ohms or more; a capacitor having one terminal connected to the emitter or source of the first transistor and the other terminal grounded with a high-frequency component; and a second resistor having one terminal connected to the emitter or source of the first transistor; whereby a current is input at a juncture at which the capacitor and the emitter or source of the first transistor are connected together and a current is output at the other terminal of the second resistor.

According to the present invention, the filter circuit is characterized by a first transistor having a base or gate grounded with a high-frequency component via a first resistor, a collector or drain grounded with high-frequency component via an impedance of zero ohms or more, and an emitter or source connected to an equivalent current circuit; a capacitor having one terminal connected to the emitter or source of the first transistor and the other terminal grounded with a high-frequency component; and a second resistor having one terminal connected to the emitter or source of the first transistor; whereby a voltage is input to the other terminal of the second resistor and the emitter or source voltage of the first transistor is output.

Moreover, according to the present invention, the filter circuit is characterized by a first transistor having a base or gate grounded with a high-frequency component via a first resistor and a collector or drain grounded with a high-frequency via an impedance of zero ohms or more; and a capacitor having one terminal connected to an emitter or source of the first transistor and the other terminal grounded with a high-frequency component; whereby a current is input at a juncture at which the capacitor and the emitter or source of the first transistor are connected together and the emitter or source voltage of the first transistor is output.

According to the present invention, the filter circuit is characterized by a first transistor having a base or gate grounded with a high-frequency component via a first resistor and an emitter or source connected to an equivalent current source; and a capacitor having one terminal connected to the emitter or source of the first transistor; whereby a voltage is input to the other terminal of said capacitor and the collector or drain current from the first transistor is output.

According to the present invention, the filter circuit may further include a second transistor which has a collector or drain, and a base or gate grounded with a high-frequency component via an impedance of zero ohms or more; and an emitter or source connected to an equivalent variable current source and connected to the base or gate of the first transistor.

The filter circuit according to the present invention may further include a second transistor which has a collector or drain grounded with a high-frequency component via an impedance of zero ohms or more and an emitter or source connected to an equivalent variable current source and connected to the base or gate the first transistor; whereby a voltage is input to the base or gate of the second transistor.

Furthermore, according to the present invention, the filter circuit is characterized by a signal path switching unit for switching input signal transmission paths by varying the control voltage to be applied; frequency band control units connected to the signal transmission path, each having a different range of bandwidth; and a cascade transistor having an emitter or source connected to the signal path switching unit via the frequency band control units.

According to the present invention, the signal path switching unit includes a common-emitter or common-source ground transistor having an emitter or source grounded via a resistor of zero ohms and more, and transistors each connected to the collector or drain of the common-emitter or common-source ground transistor; and the frequency band control units includes a frequency band control circuit connected respectively to the collectors or drains of the transistors, and resistors with different impedances connected respectively to the collectors or drains of the transistor; and the cascode transistor has an emitter or source connected to the collectors or drains of the transistors via the resistors; whereby a signal voltage is applied to the base or gate of the common-emitter or common-source ground transistor and control voltages are respectively applied to the bases or gates of the transistors.

Furthermore, the present invention is characterized in that the filter circuit may further include a differential pair configuration which consists of common-emitter or common-source ground transistors each having an emitter or source connected to a constant current source via the resistors and at the juncture therebetween; transistors; resistors; the frequency band control circuits; and the cascaded transistors.

The present invention is characterized in that the signal path switching unit is formed of the common-emitter or common-source transistor grounded via the resistor of zero ohms or more, whereby a signal voltage plus a control voltage are input to the bases or gates of the common-emitter or common-source transistors.

Furthermore, the present invention is characterized in that the filter circuit may further include a differential pair configuration which consists of common-emitter or common-source transistors each having an emitter or source connected to a current source via resistors; the common-emitter or common-source transistor; resistors; the frequency band control circuits; and transistors.

According to the present invention, the signal switching unit includes a differential pair of transistors; transistors each having a collector or drain connected in common to the emitters or sources of said transistors and an emitter or source connected in common; and a current source connected to the emitters or sources of said transistors; and a signal voltage is input to the bases or gates of transistors in a differential pair configuration and control voltages are input respectively to the bases or gates of said transistors.

Moreover, the cascode transistors have collectors or drains connected in common to the emitter or source of the cascode transistor; emitters or drains connected respectively to the collectors or drains of the transistors and to the resistors; and bases or drains connected in common to a bias power source.

The filter circuit may further include a differential pair configuration which consists of a current source connected to the emitters or sources of the emitters or sources ground transistors via the resistors at the juncture thereof; transistors; resistors; frequency band control circuits; and cascade arranged transistors.

Furthermore, the filter circuit may further include the cascode transistors having collectors or drains connected in common to the emitter or source of the cascode transistor; emitters or sources connected in common to the collector or drain of the common-emitter or common-source transistor and to the resistor; and bases or gates connected in common to the bias power source.

The filter circuit may further include a differential pair configuration which consists of common-emitter or common-source transistor having emitters or sources connected to the current source via the resistors; the resistors; the frequency band control circuits; and the cascode transistors.

Furthermore, the filter circuit may further include cascode transistors in a differential pair configuration having collectors or drains connected in common respectively to the emitters or sources of the cascode transistors in a differential pair configuration, emitters or sources connected respectively to the collectors or drains of the source ground transistors and to the resistors in a differential pair configuration, and bases or gates connected in common to the bias power source.

The frequency band control units may have a different cut-off order, respectively.

Furthermore, control voltages may be input to the frequency band variable circuit to activate plural signal transmission paths at the same time.

The frequency band variable circuits are cascoded to control independently the respective frequency bands.

The frequency band control units are of different cut-off order, respectively; and the control voltages input to the frequency band variable circuit control activate simultaneously the plural signal transmission paths.

The frequency band control units are a different cut-off order, respectively; and the frequency-band variable circuits are cascoded and controled independently respective frequency bands.

Moreover, the frequency band control units are of different cut-off order, respectively; and the frequency-band variable circuits are cascoded to input control voltages which activate simultaneously the plural signal transmission paths to the control voltages added to the frequency band variable circuit, respectively, whereby respective frequency bands are independently controlled.

As described above, according to the present invention, the filter circuit can constitute an active secondary low-pass filter circuit, an active secondary high-pass filter circuit, an active band-pass filter circuit, and an active resonance circuit, thus varying broadly its cut-off frequency and resonance frequency.

Furthermore, the filter circuit according to the present invention uses the input capacitance of a transistor of which the collector and the emitter are grounded with high-frequency components. This feature can eliminate the use of the discrete capacitor, thus realizing easily an integrated filter circuit.

Hence, there is an advantage in that the entire system can be miniaturized and the system performance can be largely improved.

BRIEF DESCRIPTION OF DRAWINGS

FIGS. 8(a) and 8(b) are diagrams each explaining the eighth aspect of the active filter according to the present invention;

FIG. 13 is a diagram explaining the active filter circuit according to the fifth embodiment of the present invention;

BEST MODE FOR CARRYING OUT THE INVENTION

Figure 1A:
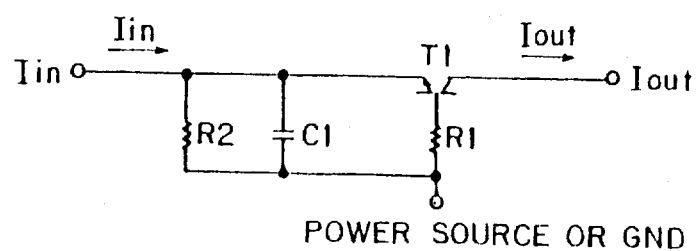
FIGS. 1(a) and 1(b) are diagrams each explaining the first aspect of the active filter according to the present invention.
Figure 1B:
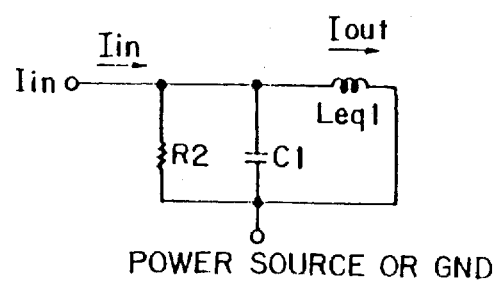

The embodiments according to the present invention will be described below with reference to the attached drawings.
(a) The fundamental explanation of the portion related to the active filter circuit according to the present invention:

FIG. 1 is a diagram showing a first aspect of the present invention. FIG. 1(a) is a structural diagram showing the secondary low-pass filter circuit. FIG. 1(b) is a diagram showing the equivalent circuit of the secondary low-pass filter circuit.

Referring to FIG. 1(a), symbol T1 represents a transistor forming a coil, R1 and R2 represent resistors, and C1 represents a capacitor. Now when it is assumed that an input current is the current flowing into the emitter of the transistor T1, the resistor R2, and the capacitor C1 and an output current is the current derived from the collector of the transistor T1, the current transfer function of the circuit shown in FIG. 1(a) is calculated with reference to FIG. 23.

Figure 23:
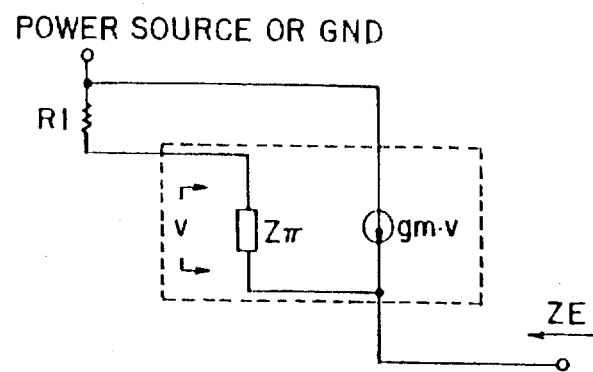
FIG. 23 is a diagram showing an equivalent circuit to calculate the impedance in expectation of the emitter.

That is, FIG. 23 is a diagram showing an equivalent circuit used for calculating the impedance counting the emitter of the transistor T1 shown in FIG. 1(a). Referring to FIG. 23, R1 corresponds to the resistor R1 shown in FIG. 1(a) and $Z\pi$ is the base to emitter impedance of the $\pi$-type equivalent circuit of a transistor; gm is a transconductance of the transistor, v is the terminal voltage of the impedance $Z_\pi$, and gm·V is a collector current source of the transistor.

Referring to the equivalent circuit shown in FIG. 23, the impedance counting the emitter of the transistor is expressed as follows:

$$Z_E=1/gm+R1(1/\beta o+\Omega^2)/(1+\Omega^2)+j\Omega(R1-1/gm)/(1+\Omega^2) \quad (1)$$

where $\Omega=\omega/\omega T$, $\omega=2\pi f$(fT is a frequency), $\omega T=2\pi fT$(fT is the transition frequency of a transistor), $\beta o$ is a common-emitter current gain, and R1 is the resistance value of the resistor R1. Hereinafter, the resistance of the resistor RN is denoted as Rn and the capacitance of the capacitor CN is denoted as Cn.

Now, by setting R1>>1/gm and applying 1>>1/$\beta o$, usually applicable, to the formula (1), the following approximate formula holds within the frequency range of 1>>($\omega/\omega T$)$^2$:

$$Z_E=j\omega R1/\omega T \quad (2)$$

Hence, the equivalent element forming $Z_E$ shown in FIG. 23 is an equivalent inductance expressed by the following formula:

$$Leq\ R1/\omega T \quad (3)$$

The equivalent circuit shown in FIG. 1(b) is obtained by substituting the equivalent inductance expressed by the formula (3) for the transistor T1 shown in FIG. 1(a).

The current transfer function (Iout/Iin) of the equivalent circuit shown in FIG. 1(b) is expressed as follows:

$$Iout/Iin=(1/C_1Leq1)/[s^2+(1/C_1R2)s+1/C1Leq1] \quad (4)$$

where Leq1=R1/$\omega T$.

The cut-off frequency ($\omega o$ and Q of the low-pass filter circuit are expressed by the following formulas:

$$\omega o=1/C_1^{1/2}Leq_1^{1/2} \quad (5)$$

$$Q=\omega o R_2 C1 \quad (6)$$

In other words, the circuit shown in FIG. 1(a) is a low-pass filter circuit having a secondary cut-off characteristic in which current is input and output.

As described above, in the filter circuit according to the first aspect of the present invention, the characteristic of a coil is realized by a transistor. Hence a current input/output type LCR low-pass filter circuit with a secondary cut-off characteristic can be constructed without using a discrete coil (L) component. There is an advantage in that this feature allows the current input/output type low-pass filter circuit to be integrated very easily.

In the following description, the equivalent circuits shown in FIGS. 2(b) to 8(b) correspond to circuits in which the transistors in the circuits shown in FIGS. 2(a) to 8(a) are substituted for the equivalent inductances.

Figure 2A:
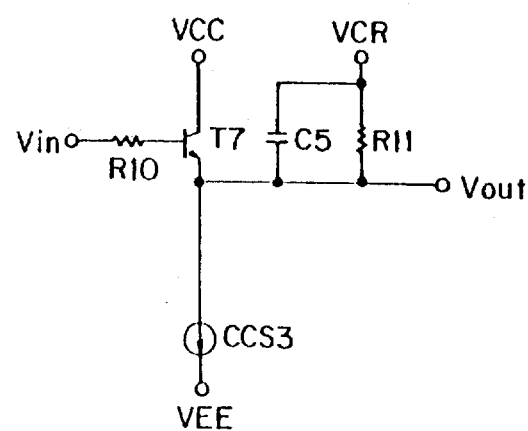
FIGS. 2(a) and 2(b) are diagrams each explaining the second aspect of the active filter according to the present invention.
Figure 2B:
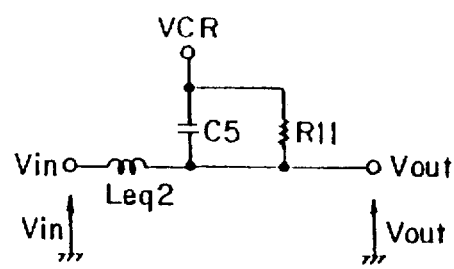

FIG. 2 is a diagram showing the second aspect of the present invention. FIG. 2(a) is a diagram showing the configuration of the secondary low-pass filter circuit. FIG. 2(b) is a diagram showing the equivalent circuit.

In FIG. 2(a), symbol T7 represents a transistor forming an inductance, R10 and R11 represent resistors; C5 represents a capacitor, and CCS3 represents a constant current source.

In this case, the resistor R10 has one terminal connected to the base of the transistor T7 and the other terminal connected to an input voltage and the transistor T7 outputs its emitter voltage. By calculating with the equivalent circuit shown in FIG. 2(b), the voltage transfer function (Vout/Vin) of the circuit shown in FIG. 2(a) is expressed by the following formula:

$$Vout/Vin=(1/C_5Leq_2)/[s^2+(1/C_5R_{11})s+1/C_5Leq_2] \quad (7)$$

where Leq2=R10 /$\omega T$.

The cut-off frequency $\omega o$ and Q of the low-pass filter circuit are expressed by the following formulas:

$$\omega o=1/C_5^{1/2}Leq_2^{1/2} \quad (8)$$

$$Q=\omega o\ R_{11}C_5 \quad (9)$$

The circuit shown in FIG. 2(a) is a current input/output type low-pass filter circuit having a secondary cut-off frequency.

As described above, according to the filter circuit of the second aspect of the present invention, since the coil characteristic is realized, like the first aspect, using a transistor, a voltage input/output type LCR filter circuit with a secondary cut-off characteristic can be formed without using a discrete coil. Hence, a voltage input/output type secondary low-pass filter can be integrated very easily in a monolithic form.

In the filter circuit shown in FIG. 2(a), the transistor T7 has the collector connected to the power source VCC. However, it is possible to make a secondary low-pass filter circuit by connecting a certain impedance between the collector of the transistor T7 and the power source VCC. In this case, the equivalent inductance is not R10/$\omega T$ at the frequency at which the Miller capacitance of the transistor T7 is comparable with the resistor R10. Hence it should be noted that the frequency band over which the secondary low-pass filter circuit can be used is narrowed.

Figure 3A:
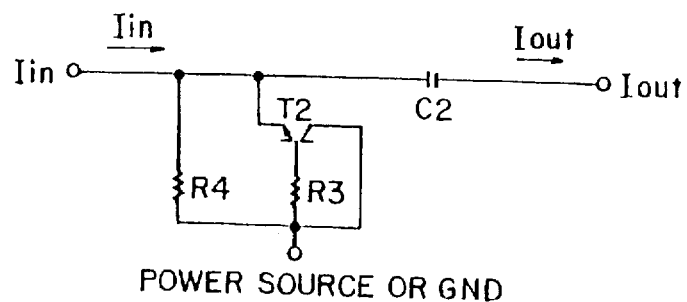
FIGS. 3(a) and 3(b) are diagrams each explaining the third aspect of the active filter according to the present invention.
Figure 3B:
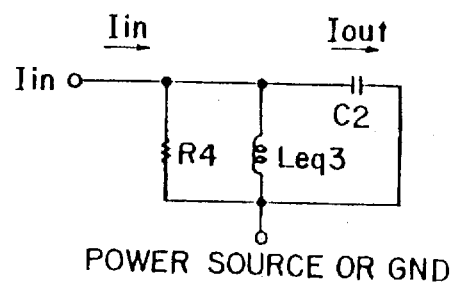

FIG. 3 is a diagram showing the third aspect of the present invention. FIG. 3(a) is a diagram showing the configuration of the secondary high-pass filter circuit. FIG. 3(b) is a diagram showing the equivalent circuit of the secondary high-pass filter circuit.

Referring to FIG. 3(a), symbol T2 represents an inductance forming transistor, R3 and R4 represent resistors, and C2 represents a capacitor.

It is assumed that an input current is the sum of the current flowing through both the emitter of the transistor T2 and the resistor R4 and the output current is the current derived from the capacitor C2. In this case, by calculating with the equivalent circuit shown in FIG. 3(b), the current transfer function (Iout/Iin) of the equivalent circuit shown in FIG. 3(b) is expressed by the following formula:

$$Iout/Iin=(1/C_2)s^2/[s^2+(1/C_2R_4)s+1/C_2Leq3] \quad (10)$$

where Leq3=R3/$\omega T$. The cut-off frequency $\omega o$ and Q of the high-pass filter circuit are expressed by the following formulas:

$$\omega o=1/C_2^{1/2}Leq_3^{1/2} \quad (11)$$

$$Q=\omega o\ R_4C_2 \quad (12)$$

In other words, the circuit shown in FIG. 3(a) is a current input/output type high-pass filter circuit having a secondary cut-off characteristic.

As described above, in the filter circuit of the third aspect of the present invention, a transistor can realize the characteristic of a coil. Hence a current input/output type LCR high-pass filter circuit with a secondary cut-off characteristic can be constituted without using a coil. This feature allows a current input/output type secondary low-pass filter of to be integrated very easily in a monolithic form.

In this case, it is possible to make a secondary low-pass filter circuit by connecting a certain impedance between the collector of the transistor T2 and the power source or GND. However it should be noted that the effective frequency band is narrowed.

Figure 4A:
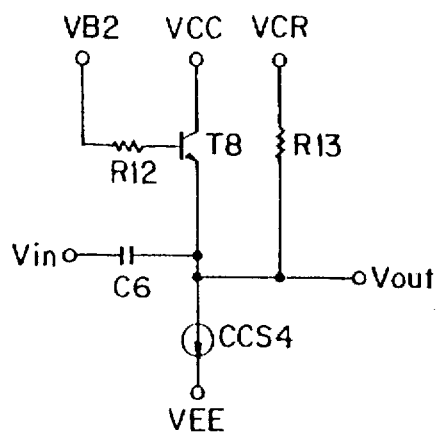
FIGS. 4(a) and 4(b) are diagrams each explaining the fourth aspect of the active filter according to the present invention.
Figure 4B:
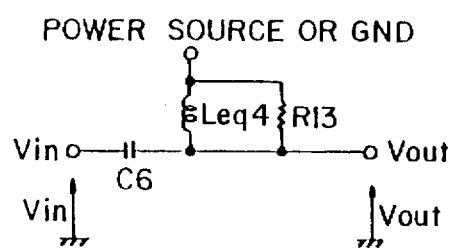

FIG. 4 is a diagram showing the fourth aspect of the present invention. FIG. 4(a) is a diagram showing the configuration of the secondary high-pass filter circuit. FIG. 4(b) is a diagram showing the equivalent circuit of the secondary high-pass filter circuit.

Referring to FIG. 4(a), symbol T8 represents a transistor forming an inductance, R12 and R13 represent resistors, and C6 represents a capacitor, and CCS4 represents a constant current source.

It is assumed that the capacitor C6 has one terminal at which a voltage is input and the other terminal connected to the emitter of the transistor T8 and the transistor T8 outputs its emitter voltage. In this case, by calculating with the equivalent circuit shown in FIG. 4(b), the voltage transfer function (Vout/Vin) of the equivalent circuit shown in FIG. 4(a) is expressed by the following formula:

$$Vout/Vin=(1/C_6)s^2/[s^2+(1/C_6R_{13})s+1/C_6Leq_4] \quad (13)$$

where $Leq4 = R12/\omega T$. The cut-off frequency $\omega_o$ and Q of the high-pass filter circuit are respectively expressed by the following formulas:

$$\omega_o=1/C_6^{1/2}Leq_4^{1/2} \quad (14)$$

$$Q=\omega_o R_{13} C_6 \quad (15)$$

That is, the circuit shown in FIG. 4(a) is a voltage input/output type high-pass filter circuit having a secondary cut-off frequency.

As described above, in the filter circuit of the fourth aspect of the present invention, a transistor can realize the characteristic of a coil. Hence a voltage input/output type LCR high-pass filter circuit with a secondary cut-off characteristic can be constituted without using a discrete coil. This feature allows a voltage input/output type secondary low-pass filter to be integrated very easily in a monolithic form.

In this case, a certain impedance may be connected between the collector of the transistor T8 and the power source VCC. However it should be noted that the effective frequency band is narrowed.

Figure 5A:
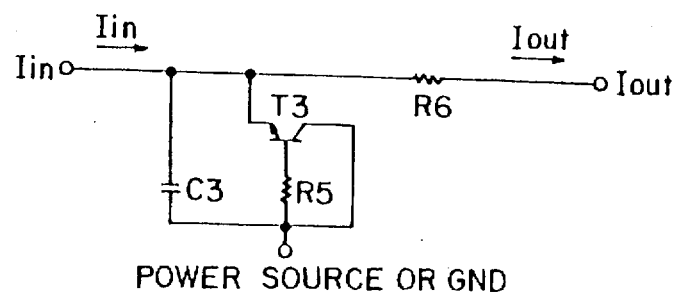
FIGS. 5(a) and 5(b) are diagrams each explaining the fifth aspect of the active filter according to the present invention.
Figure 5B:
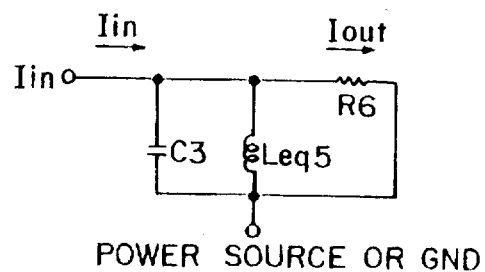

FIG. 5 is a diagram showing the fifth aspect of the present invention. FIG. 5(a) is a diagram showing the configuration of the secondary band-pass filter. FIG. 5(b) is a diagram showing the equivalent circuit of the secondary band-pass filter.

Referring to FIG. 5(a), symbol T3 represents a transistor forming an inductance, R5 and R6 represent resistors, and C3 represents a capacitor.

It is assumed that an input current flows into the emitter of the transistor T3 and the capacitor C3 and an output current flows out through the resistor 6. In this case, by calculating with the equivalent circuit shown in FIG. 5(b), the voltage transfer function (Iout/Iin) of the circuit shown in FIG. 5(a) is expressed by the following formula:

$$Iout/Iin=(1/C_3R_6)s/[s^2+(1/C_3R_6)s+1/C_3Leq_5] \quad (16)$$

where $Leq5=R5/\omega T$. The cut-off frequency $\omega_o$ and Q of the band-pass filter circuit are respectively expressed by the following formulas:

$$\omega_o=1/C_3^{1/2}Leq_5^{1/2} \quad (17)$$

$$Q=\omega_o R_6 C_3 \quad (18)$$

That is, the circuit shown in FIG. 5(a) is a current input/output type high-pass filter circuit having a secondary cut-off frequency.

As described above, in the filter circuit of the fifth aspect of the present invention, a transistor can realize the characteristic of a coil. Hence a current input/output type LCR band-pass filter circuit with a secondary cut-off characteristic can be constituted without using a discrete coil. Thus, a current input/output type secondary low-pass filter can be integrated very easily in a monolithic form.

In this case, a certain impedance can be connected between the collector of the transistor T3 and the power source VCC. However it should be noted that the effective frequency band is narrowed.

Figure 6A:
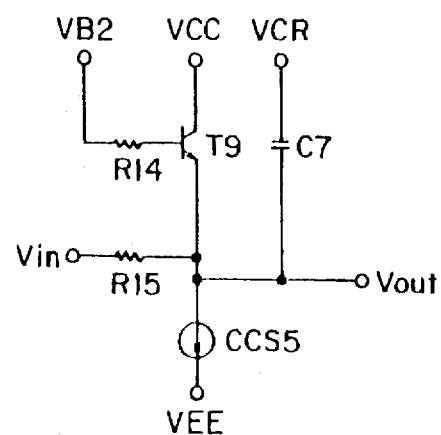
FIGS. 6(a) and 6(b) are diagrams each explaining the sixth aspect of the active filter according to the present invention.
Figure 6B:
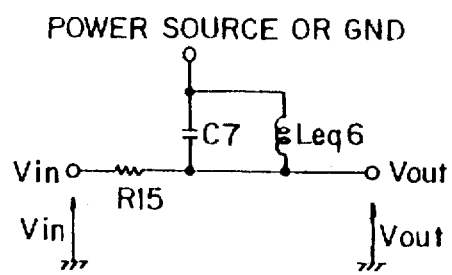

FIG. 6 is a diagram showing the sixth aspect of the present invention. FIG. 6(a) is a diagram showing the configuration of the secondary band-pass filter. FIG. 6(b) is a diagram showing the equivalent circuit of the secondary band-pass filter.

Referring to FIG. 6(a), symbol T9 represents a transistor forming an inductance, R14 and R15 represent resistors, C7 represents a capacitor; and CCS5 represents a current source.

It is assumed that an input voltage is applied to the emitter of the transistor T9 via the resistor R15 and an output voltage is output as an emitter voltage. In this case, by using the equivalent circuit shown in FIG. 6(b), the voltage transfer function (Vout/Vin) of the equivalent circuit shown in FIG. 6(a) is expressed by the following formula:

$$Vout/Vin=(1/C_7)s/[s^2+(1/C_7R_{15})s+1/C_7Leq_6] \quad (19)$$

where $Leq_6=R_{14}/\omega T$.

The cut-off frequency $\omega_o$ and Q of the band-pass filter circuit are expressed by the following formulas:

$$\omega_o=1/C_7^{1/2}Leq_6^{1/2} \quad (20)$$

$$Q=\omega_o R_{15} C_7 \quad (21)$$

That is, the circuit shown in FIG. 6(a) is a voltage input/output type band-pass filter circuit having a secondary cut-off frequency.

As described above, in the filter circuit of the sixth aspect of the present invention, a transistor can realize the characteristic of a coil. Hence a voltage input/output type LCR band-pass filter circuit with a secondary cut-off characteristic can be constituted without using a discrete coil component. This feature allows the voltage input/output type secondary band-pass filter to be integrated very easily.

In this case, a certain impedance can be connected between the collector of the transistor T9 and the power source VCC. However it should be noted that the effective frequency band is narrowed.

Figure 7A:
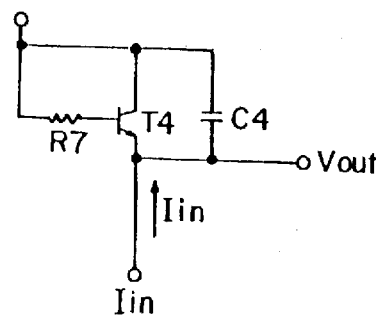
FIGS. 7(a) and 7(b) are diagrams each explaining the seventh aspect of the active filter according to the present invention.
Figure 7B:
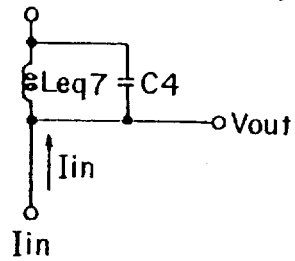

FIG. 7 is a diagram for explaining the seventh aspect of the present invention. FIG. 7(a) is a diagram showing a circuit forming a resonator. FIG. 7(b) is a diagram showing the equivalent circuit of the resonator.

Referring to FIG. 7(a), symbol T4 represents a transistor forming an inductance, R7 represents a resistor, and C4 represents a capacitor.

It is assumed that an input current is the sum of the current flowing into the emitter of the transistor T4 and the capacitor C4 and an output voltage is output as an emitter voltage of the transistor T4. In this case, by using the equivalent circuit shown in FIG. 7(b), the voltage transfer function (Vout/Vin) of the equivalent circuit shown in FIG. 7(a) is expressed by the following formula:

$$Vout/Vin = (1/C_4)s/[s^2 + 1/C_4 Leq_7] \quad (22)$$

where $Leq_7 = R_7/\omega T$.

The resonance frequency $\omega_0$ of the resonator is expressed by the following formula:

$$\omega_0 = 1/C_4^{1/2} Leq_7^{1/2} \quad (23)$$

That is, the circuit shown in FIG. 7(a) is a resonator in which current is input and voltage is output.

As described above, in the filter circuit of the seventh aspect of the present invention, a transistor can realize the characteristic of a coil. Hence a current-input/ voltage-output type LCR resonator can be constituted without using a discrete coil component. There is an advantage in that the current-input/ voltage-output type resonator can be integrated very easily in a monolithic form.

In this case, a certain impedance can be connected between the collector of the transistor T4 and the power source VCC. However it should be noted that the effective frequency band is narrowed.

FIG. 8 is a diagram showing the eighth aspect of the present invention. FIG. 8(a) is a diagram showing a resonator forming circuit. FIG. 8(b) is a diagram showing the equivalent circuit of the resonator.

Referring to FIG. 8(a), symbol T10 represents a transistor forming an inductance, R16 represents a resistor, C8 represents a capacitor; and CCS6 represents a constant current source.

An input voltage is applied to the emitter of the transistor T10 via the capacitor C8 and an output current is derived from the collector of the transistor T10. In this case, by using the equivalent circuit shown in FIG. 8(b), the voltage transfer function (Iout/Vin) of the equivalent circuit shown in FIG. 8(a) is expressed by the following formula:

$$Iout/Vin = (1/Leq8)s/(s^2 + 1/C_8 Leq_8) \quad (24)$$

where $Leq_8 = R_{16}/\omega T$. The resonance frequency $\omega_0$ of the resonator is expressed by the following formula:

$$\omega_0 = 1/C_8^{1/2} Leq_8^{1/2} \quad (25)$$

That is, unlike the resonator shown in FIG. 7(a), the circuit shown in FIG. 8(a) is a voltage-input/ current-output type resonator.

As described above, in the filter circuit of the eighth aspect of the present invention, a transistor can realize the characteristic of a coil. Hence a voltage-input/ current-output type LCR resonator can be constituted without using a discrete coil component. This feature allows an integrated resonator to be manufactured very easily.

Figure 9:
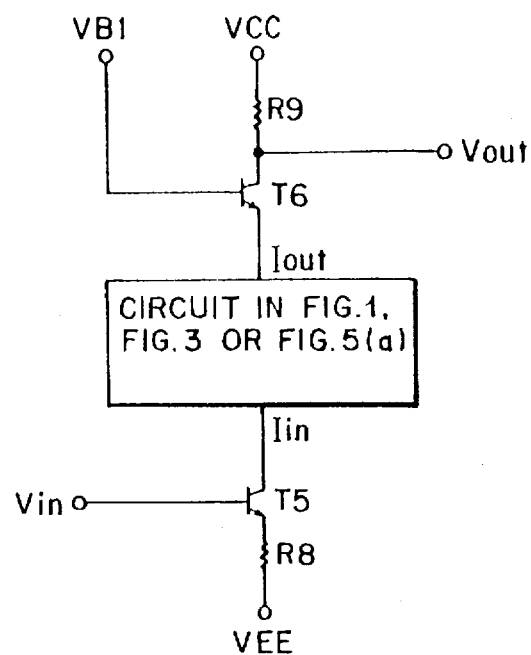
FIG. 9 is a diagram explaining the active filter circuit according to the first embodiment of the present invention.

(b) Explanation of the Embodiment of the Active Filter Circuit:

FIG. 9 is a diagram showing the active filter circuit according to the first embodiment of the present invention. Referring to FIG. 9, symbol T5 represents an input transistor, T6 represents an output transistor, and R8 and R9 represent resistors. The input terminal of the circuit shown in FIG. 1(a), FIG. 3(a), or FIG. 5(a) is connected to the collector of the transistor T5. The output terminal of the circuit shown in FIG. 1(a), FIG. 3(a), or FIG. 5(a) is connected to the emitter of the transistor T6.

If current Iin and Iout are ignored, Vin = Iin R8 and Vout = Iout R9.

Hence, $Vout/Vin = (R_9/R_8)(Iout/Iin) \quad (26)$

The first, third and fifth aspects of the active filter circuit according to the present invention correspond respectively to the secondary low-pass filter circuit, the secondary high-pass filter circuit, and the secondary band-pass filter circuit which are respectively expressed as the current transfer functions of the formulas (5), (11) and (16). However, actual filter circuits can be easily realized by converting each of the transfer functions into a voltage transfer function. This feature enables the down-sized system, in addition to a largely improved performance of the system such as an optical communications system.

Figure 10:
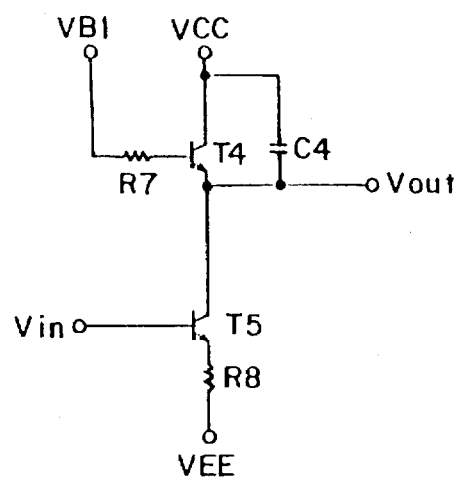
FIG. 10 is a diagram explaining the active filter circuit according to the second embodiment of the present invention.

FIG. 10 is a diagram showing the active filter circuit according to the second embodiment of the present invention. Referring to FIG. 10, symbol T5 represents an input transistor, T4 represents a transistor forming an inductance, R8 and R7 are resistors, and C4 represents a capacitor. The circuit shown in FIG. 10 is formed of the transistor T5 having the collector connected to the input terminal of the circuit shown in FIG. 7(a).

Like for the circuit shown in FIG. 9, since Vin = Iin R8, the following formula is held:

$$Vout/Vin = (1/R_8)(Vout/Iin) \quad (27)$$

According to the active filter circuit of the second embodiment of the present invention, in the resonator expressed as the transfer impedance formula (2) in the seventh aspect thereof, the transfer function can be converted into a voltage transfer function. This feature allows the resonator to be easily realized as an actual circuit.

Figure 11:
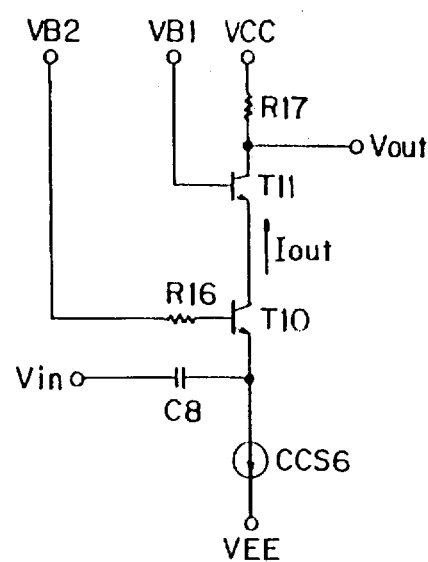
FIG. 11 is a diagram explaining the active filter circuit according to the third embodiment of the present invention.

FIG. 11. is a diagram showing the active filter circuit according to the third embodiment of the present invention.

Referring to FIG. 11, symbol T10 represents a transistor forming an inductance, T11 represents an output transistor, R16 and R17 represent resistors, C8 represents a capacitor, and CCS6 represents a constant current source.

Since Vout = Iout R17, the following formula is held:

$$Vout/Vin = R_{17} Iout/Vin \quad (28)$$

According to the active filter circuit of the third embodiment of the present invention, the transfer admittance formula (22) for the resonator can be converted into the above voltage transfer function in the eighth aspect of the present invention. This feature the resonator to be easily realized as an actual circuit.

Figure 12:
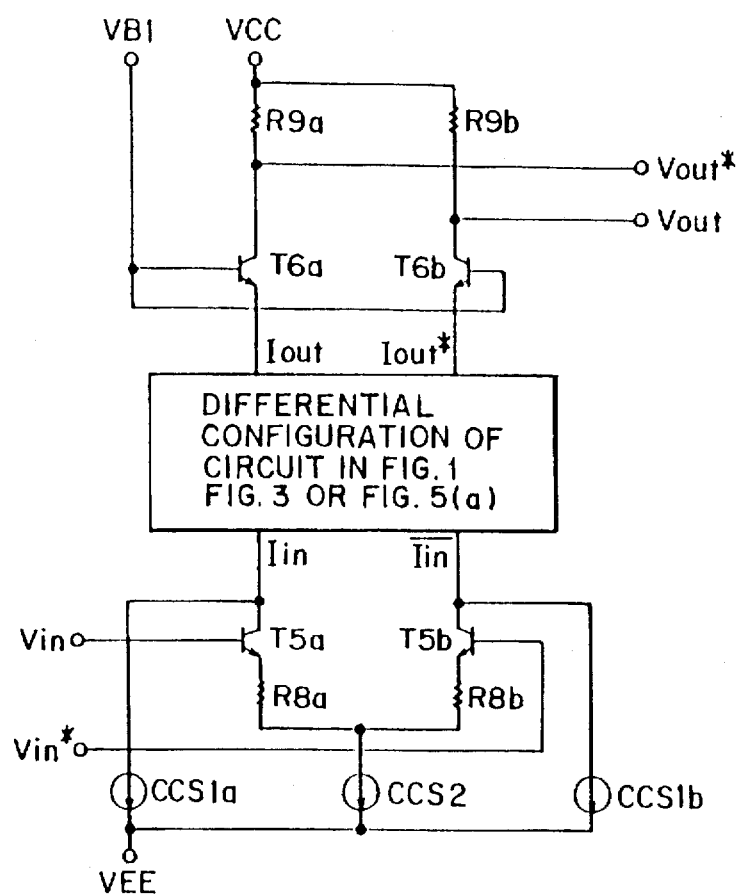
FIG. 12 is a diagram explaining the active filter circuit according to the fourth embodiment of the present invention.

FIG. 12 is a diagram showing the active filter circuit of the fourth embodiment of the present invention. Referring to FIG. 12, T5a and T5b represent input transistors, T6a and T6b represent output transistors, R8a, R8b, R9a and R9b represent resistors, and CCS1a, CCS1b, and CCS3 represent constant current sources.

The input terminal of the circuit shown in FIG. 1(a), FIG. 3(a), or FIG. 5(a) is connected to the collectors of the transistors T5a and T5b. The output terminal of the circuit shown in FIG. 1(a), FIG. 3(a), or FIG. 5(t) are connected to the emitters of the transistors T6a and T6b.

In the circuit shown in FIG. 12, when the base voltage Vin of the transistor T5a and the base voltage Vin* of the transistor T5b are equal in amplitude but opposite in phase, the collector current of the transistor T5a and the collector current of the transistor T5b are equal in amplitude but opposite in phase while the collector voltages Vout of the transistors T6a and T6b are equal in amplitude but opposite in phase. Hence $$(Vout - Vout^*)/(Vin - Vin^*) = (R_9/R_8)(Iout/Iin) \quad (29)$$

Like in the circuit shown in FIG. 9, the current transfer function is converted into the voltage transfer function in the circuit shown in FIG. 12. Thus the secondary low-pass filter shown in FIG. 1, the secondary high-pass filter shown in FIG. 3, and the secondary band-pass filter shown in FIG. 5 can be easily realized as actual circuits. There is an advantage in that the amplifier built in the optical communications system can be largely improved in performance and the entire system can be miniaturized.

The circuit shown in FIG. 12 which has the bases of the transistors T5a and T5b acting as input terminals and the collectors of the transistors T6a and T6b acting as output terminals makes a balanced filter circuit. The circuit which has the bases of the transistors T5a and T5b acting as input terminals and the collector of the transistors T6a or T6b acting as output terminals makes a balanced-input / unbalanced-output type filter circuit.

Moreover, with the base of the transistor T5a or T5b acting as an input terminal and the base of the transistor T5b or T5a alternately grounded, and the collector of the transistors T6a or T6b acting as an output terminal, an unbalanced-input / balanced-output type filter circuit can be formed. With one of the transistors T5a and T5b having the base acting as an input terminal and the other of the transistor T5b and T5a having the base alternately grounded, and the transistors T6a and T6b having the collectors acting as output terminals, a balanced-input / unbalanced-output type filter circuit can be formed.

With one of the transistors T5a and T5b having the base acting as an input terminal and the other of the transistor T5b and T5a having the base alternately grounded, and the transistors T6a and T6b having the collectors acting as output terminals, an unbalanced/unbalanced-type filter circuit can be formed.

The constant current sources CCS1a and CCS1b supply a bias current to the inductance forming transistor and the output transistor arranged in the black box within the circuit shown in FIG. 12 to enlarge the dynamic range thereof.

FIG. 13 is a diagram used for explaining the active filter circuit according to the fifth embodiment of the present invention. Referring to FIG. 13, symbols T5a and T5b represent input transistors, T4a and T4b represent transistors forming coils, R8a, R8b, R7a and R7b represent resistors, C4' represents a capacitor, CCS1a, CCS1b and CCS2 represent constant current sources.

The circuit shown in FIG. 13 corresponds to the circuit in which the input terminal of the circuit shown in FIG. 7 is connected to the collectors of the input transistors T5a and T5b. The original circuit configuration resembles the circuit shown in FIG. 14. However, in consideration that the input transistors T5a and T5b form a differential amplifier driven with the constant current circuit CCS2, the circuit portion of the capacitors C4a and C4b shown in FIG. 14 is modified.

Figure 14:
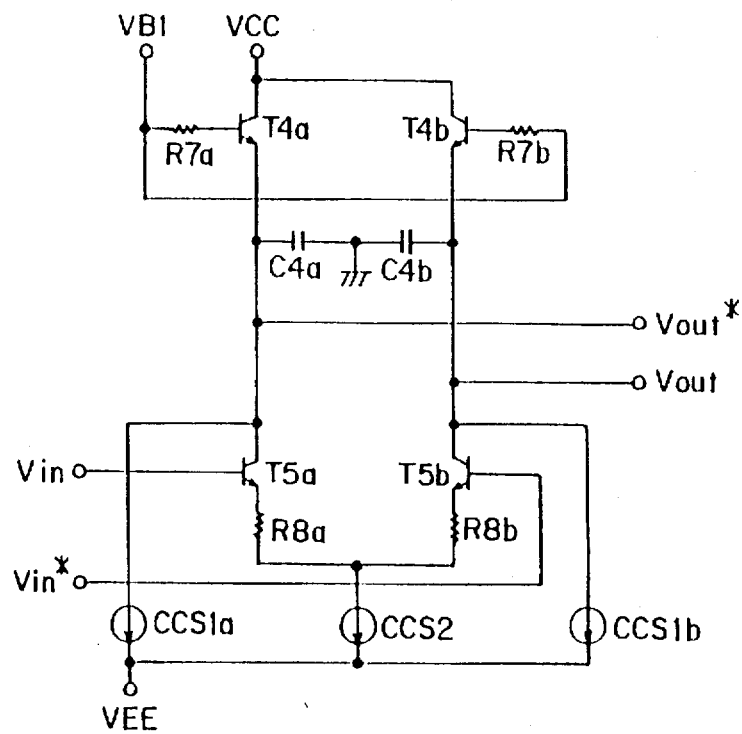
FIG. 14 is a diagram showing the original configuration of the circuit shown in FIG. 13.

For that reason, in the input transistors T5a and T5b shown in FIG. 14, the ac components of the collector voltages are equal in amplitude and opposite in phase.

Hence, current does not flow between the juncture between the capacitors C4a and C4b and the ground. Even if the juncture is not ground, the current distribution of the circuit does not change. Hence, the circuit of the capacitors C4a and C4b can be substituted for the capacitor C4' shown in FIG. 13.

If the total capacitance of the capacitors C4a and C4b shown in FIG. 14 is C4 and the capacitance C4' shown in FIG. 13 has a capacitance of $C_4/2$, the voltage transfer function of the circuit shown in FIG. 13 has the same frequency characteristic as that of the transfer function of the circuit shown in FIG. 7.

The resonator shown in FIG. 7 can be easily realized as an actual circuit, particularly, an integrated circuit.

Like the circuit shown in FIG. 12, the circuit shown in FIG. 13 can be used for a balanced filter circuit, a balanced/unbalanced filter circuit, an unbalanced/balanced filter circuit, or an unbalanced filter circuit. The constant current sources CCS1a and CCS1b are used to expand the dynamic range of the circuit shown in FIG. 13.

Figure 15:
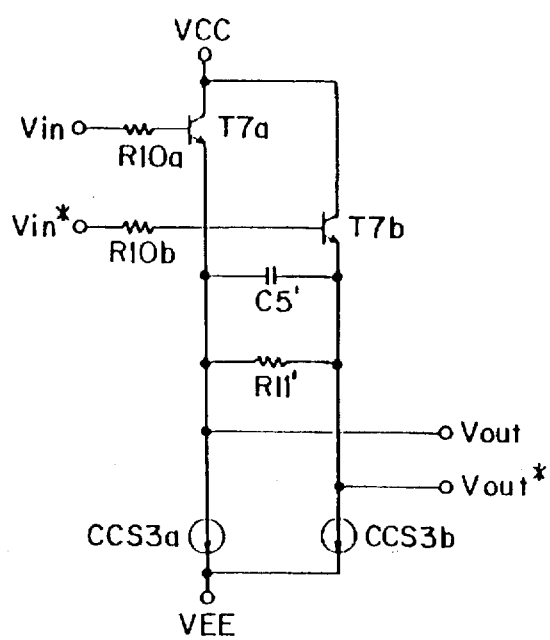
FIG. 15 is a diagram explaining the active filter circuit according to the sixth embodiment of the present invention.

FIG. 15 is a diagram showing the active filter circuit according to the sixth embodiment of the present invention. Referring to FIG. 15, symbols T7a and T7b represent input and inductance-forming transistors, R10a, R10b, and R11' represent resistors, C5' represents a capacitor, and CCS3a and CCS3b represent constant current sources.

The circuit shown in FIG. 15 includes two circuits each shown in FIG. 2. The parallel circuit of the capacitor C5 and the resistor R11 shown in FIG. 2 is modified by utilizing that the emitter voltages of respective transistors are the same amplitude and in opposite phase and the collector voltages of respective transistors are the same amplitude and in opposite phase.

By selecting the capacitance of the capacitor C5' to ½ of the capacitance of the capacitor C5 and selecting the resistance value of the resistor R11' to a value twice the resistance value of the resistor R11, the voltage transfer function of the circuit shown in FIG. 15 has the same frequency characteristic as that of the circuit shown in FIG. 2.

That is, according to the circuit shown in FIG. 15, a voltage-input/voltage-output type secondary low-pass filter circuit can be easily realized as an actual circuit, particularly, an integrated circuit.

As described above, according to the active filter circuit of the sixth embodiment of the present invention, the secondary low-pass filter with no coil can be easily realized as actual integrated circuit. Hence, the performance of the amplifier used for the optical communications system can be largely improved and the system can be effectively downsized.

Like the circuit shown in FIG. 12, the circuit shown in FIG. 15 can be used as a balanced filter circuit, a balanced/unbalanced filter circuit, an unbalanced/balanced filter circuit, or an unbalanced filter circuit.

Figure 16:
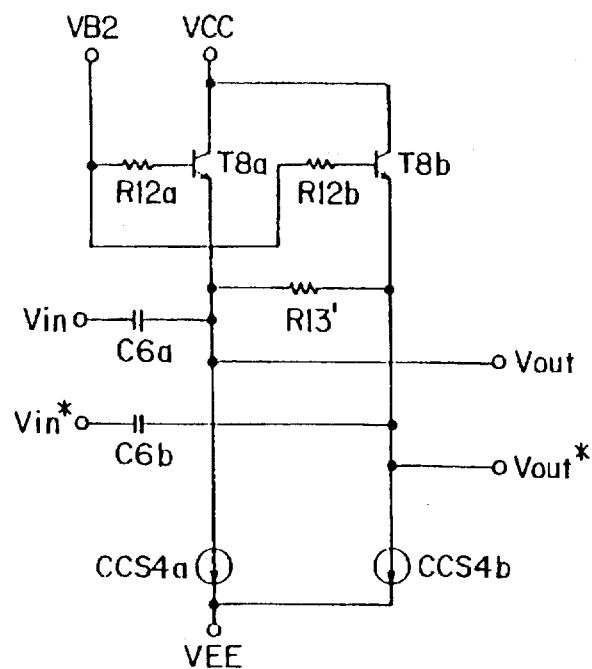
FIG. 16 is a diagram explaining the active filter circuit according to the seventh embodiment of the present invention.

FIG. 16 is a diagram showing the active filter circuit according to the seventh embodiment of the present invention. Referring to FIG. 16, symbols T8a and T8b represent inductance-forming transistors, R12a, R12b and R13' represent resistors, C6a and C6b represent capacitors, and CCS4a and CCS4b represent constant current sources.

Like the modification to the circuit shown in FIG. 14, the circuit shown in FIG. 16 is formed by using two circuits each shown in FIG. 4(a).

By selecting the resistance value of the resistor R13' to a value twice the resistance value of the resistor R13, the voltage transfer function of the circuit shown in FIG. 16 has the same frequency characteristic as that of the voltage transfer function of the circuit shown in FIG. 4(a).

According to the circuit configuration shown in FIG. 16, the voltage-input / voltage-output type secondary high-pass filter circuit, shown in FIG. 4, can be easily realized as an actual circuit.

As described above, according to the active filter circuit of the seventh embodiment of the present invention, a secondary high-pass filter with no coil can be easily realized as an actual circuit such as an integrated circuit. Hence, the performance of the amplifier used for the optical communications system can be largely improved and the system can be effectively small-sized.

Like the circuit shown in FIG. 12, the circuit shown in FIG. 16 can be used for a balanced filter circuit, a balanced/ unbalanced filter circuit, an unbalanced/balanced filter circuit, or an unbalanced filter circuit.

Figure 17:
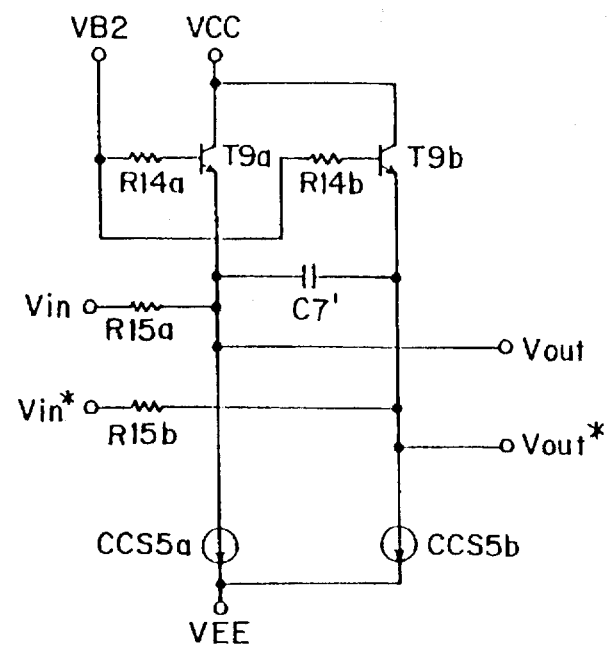
FIG. 17 is a diagram explaining the active filter circuit according to the eighth embodiment of the present invention.

FIG. 17 is a diagram showing the active filter circuit according to the eighth embodiment of the present invention. Referring to FIG. 17, symbols T9a and T9b represent inductance forming transistors, R14a, R14b, R15a and R15b represent resistors, C7' represents a capacitor, and CCS5a and CCS5b represent constant current sources.

Like the modification to the circuit shown in FIG. 14, the circuit shown in FIG. 17 is formed of two circuits shown in FIG. 6.

By selecting the capacitance of the capacitor C7' shown in FIG. 17 to a half value of the capacitance of the capacitor C7 shown in FIG. 6, the voltage transfer function of the circuit shown in FIG. 17 has the same frequency characteristic as that of the voltage transfer function of the circuit shown in FIG. 6.

According to the circuit configuration shown in FIG. 17, the voltage-input/voltage-output type secondary band-pass filter circuit, shown in FIG. 6, can be easily realized as an actual circuit.

As described above, according to the active filter circuit according to the eighth embodiment of the present invention, a secondary band-pass filter with no coil can be easily realized as an actual circuit such as an integrated circuit. Hence, the performance of the amplifier used for the optical communications system can be largely improved and the entire system can be effectively small-sized.

Like the circuit shown in FIG. 12, the circuit shown in FIG. 17 can be used for a balanced filter circuit, a balanced/unbalanced filter circuit, an unbalanced/balanced filter circuit, or an unbalanced filter circuit.

Figure 18:
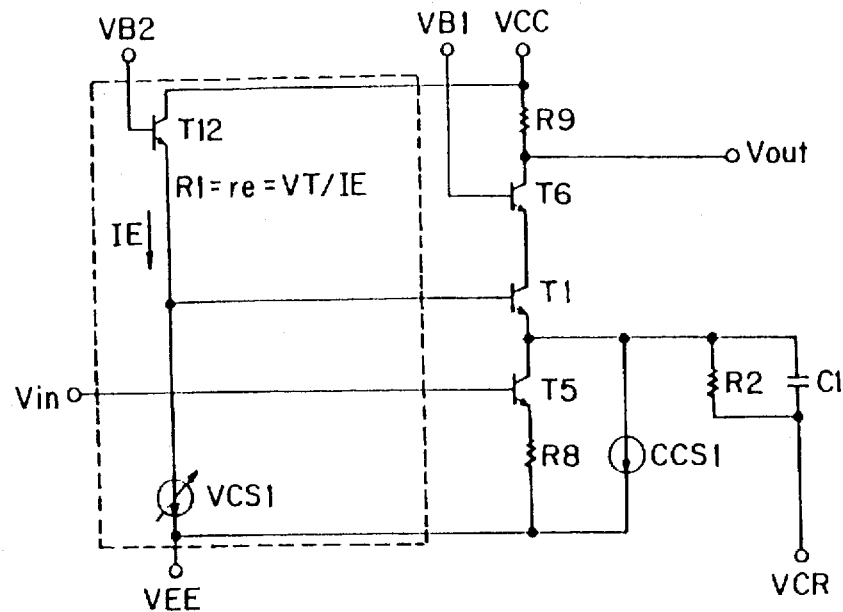
FIG. 18 is a diagram explaining the active filter circuit according to the ninth embodiment of the present invention.

FIG. 18 is a diagram showing the active filter circuit according to the ninth embodiment of the present invention. Referring to FIG. 18, symbol T5 represents an input transistor, T1 represents an inductance forming transistor, T12 represents a transistor which forms a resistor connected to the base of the transistor T1, R8, R2, and R9 represent resistors, C1 represents a capacitor, CCS1 represents a constant current source, and VCS1 represents a variable constant current source which supplies the emitter current to the transistor T12.

The circuit shown in FIG. 18 corresponds to the circuit shown in FIG. 1 arranged in the black-box shown in FIG. 9. The resistor R1 in FIG. 1 is substituted for the emitter resistor $r_e$ of the transistor T12 in FIG. 18.

When the emitter current is Ie (mA), the emitter resistor $r_e$ is expressed as follows:

$$r_e = V_T/Ie \text{ (here, } V_T = 26\text{mV)} \tag{30}$$

$r_e$ of the formula (30) is substituted for the formula (4) and then the result is substituted for the formula (5). Thus the resultant frequency characteristic is the same as that of the circuit shown in FIG. 18.

As a result, in the circuit shown in FIG. 18, the resistor R1 of a fixed value in the circuit shown in FIG. 1 can be varied with the emitter current of the transistor T12. That is, according to the circuit shown in FIG. 18, a low-pass filter circuit with a secondary cut-off characteristic and a cut-off frequency capability can be realized as an actual circuit by varying the emitter current of the transistor T12 by means of the variable current source VCS1.

As described above, according to the active filter circuit of the ninth embodiment of the present invention, a secondary low-pass filter which can vary the cut-off frequency can be easily realized as an actual circuit such as an integrated circuit. Hence, the performance of the amplifier used for the optical communications system can be largely improved and the system can be effectively small-sized.

As for the circuit shown in FIG. 18 embodying the first aspect of the present invention, the resistor connected to the base of the transistor forming an inductance is substituted for the emitter resistor $r_e$ of the transistor driven by means of the variable current source. Similar substitution can be applied to the active filter circuit according to the third to eighth aspects of the present invention.

Figure 19:
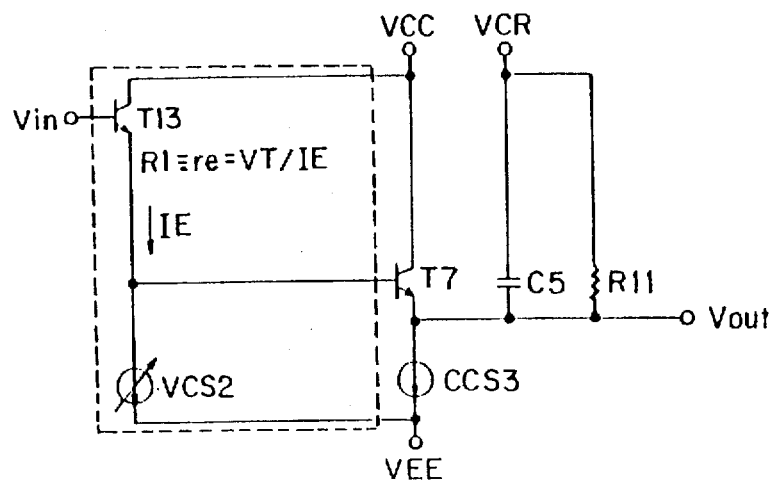
FIG. 19 is a diagram explaining the active filter circuit according to the tenth embodiment of the present invention.

FIG. 19 is a diagram showing the active filter circuit according to the tenth embodiment of the present invention. Referring to FIG. 19, T13 represents a transistor which functions as an input transistor and a resistor forming transistor connected to the base of the transistor T7 (to be described later), T7 represents a transistor forming an inductance, R11 represents a resistor, C5 represents a capacitor, CCS3 represents a constant current source, and VCS2 represents a variable current source.

In the circuit shown in FIG. 19, the emitter resistor of the transistor T13 is substituted for the resistor R10 in the circuit shown in FIG. 2.

Since the transistor T13 acts as an emitter follower stage for amplifying the signal, the ac base potential of the transistor T13 equals to that of the transistor T7. The frequency characteristic of the circuit shown in FIG. 19 is similar to that of the circuit shown in FIG. 2.

The circuit shown in FIG. 19 is a low-pass filter with a secondary cut-off characteristic. The cut-off frequency can be varied with the current from the variable current source VCS2.

As described above, according to the active filter circuit of the tenth embodiment of the present invention, the secondary low-pass filter circuit which can vary the cut-off frequency, like the ninth embodiment, can be easily realized as an actual circuit, particularly, an integrated circuit. Hence, a cut-off frequency range controllable low-pass filter circuit can be realized as an integrated circuit. The performance of the amplifier used for the optical communications system can be largely improved and the system can be effectively small-sized.

FIGS. 18 and 19 show a signal-input and single-output type circuit. However, the substitution to a variable resistor can be applied to the differential amplifier-type circuit.

Figure 20:
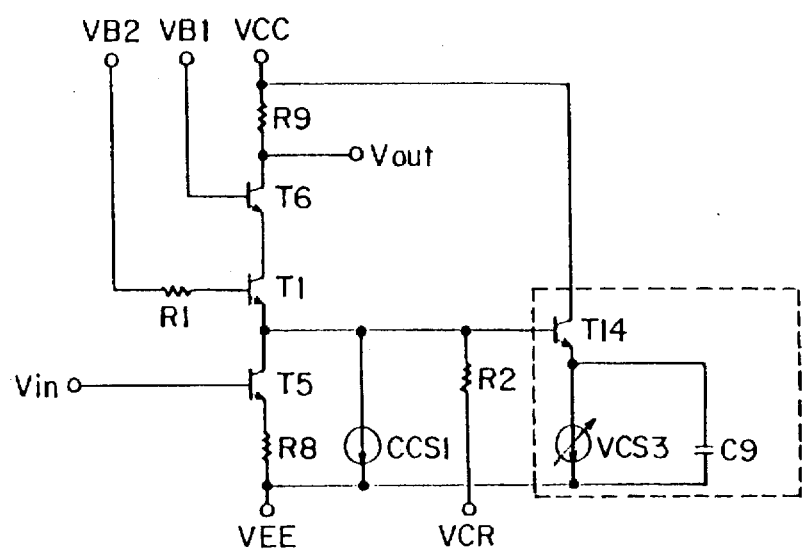
FIG. 20 is a diagram explaining the active filter circuit according to the eleventh embodiment of the present invention.

FIG. 20 is a diagram showing the active filter circuit according to the eleventh embodiment of the present invention. Referring to FIG. 20, T5 represents an input transistor, T1 represents a transistor forming an inductance, T6 represents an output transistor, T1 represents a transistor forming a capacitance, $R_8$, $R_1$, $R_9$ and $R_2$ represent resistors, C9 represents a bypass capacitor which ac-grounds the emitter of the transistor T14, CCS1 represents a constant current source expanding the dynamic range, and VCS3 represents a variable current source which varies the emitter current.

The circuit shown in FIG. 20 can be formed by inserting the circuit shown in FIG. 1 in the black-box shown in FIG. 9. The capacitor C1 shown in FIG. 1 is substituted for the input capacitance of the transistor T14 in FIG. 20.

Since the frequency characteristic is the same as that expressed by the formula (5), the circuit shown in FIG. 20 is a low-pass filter with a secondary cut-off characteristic.

As shown in FIG. 20, the transistor T14 has the input capacitance of $(Cd+C_{JE}+C_{JC})$ because the collector and emitter thereof are grounded alternatingly.

$Cd>>C_{JE}$, $C_{JC}$ at a normal bias. Since depending on the electric charges injected from the emitter into the base and the emitter to base voltage, the emitter diffusion capacitance Cd is proportional to the emitter current.

Hence, since the input capacitance of the transistor T14 varies substantially and proportionally the current from the variable current source VCS3, the secondary low-pass filter shown in FIG. 20 can vary its cut-off frequency with the current from the variable current source VCS3.

According to the active filter circuit of the eleventh embodiment of the present invention, the capacitance of the capacitor can be realized with the input capacitance of the transistor grounded with high-frequency. Hence the secondary low-pass filter circuit which can vary the cut-off frequency can be easily realized as an actual circuit, particularly, an integrated circuit without using a discrete coil. A cut-off frequency controllable low-pass filter circuit can be realized as an integrated circuit. Thus, the performance of the amplifier arranged in the optical communications system is more improved and the entire system can be effectively small-sized.

The circuit shown in FIG. 20 is a single-input and single-output type circuit. Substituting the above-mentioned capacitor for a variable capacitor can be applied to the differential amplifier-type circuit.

Figure 21:
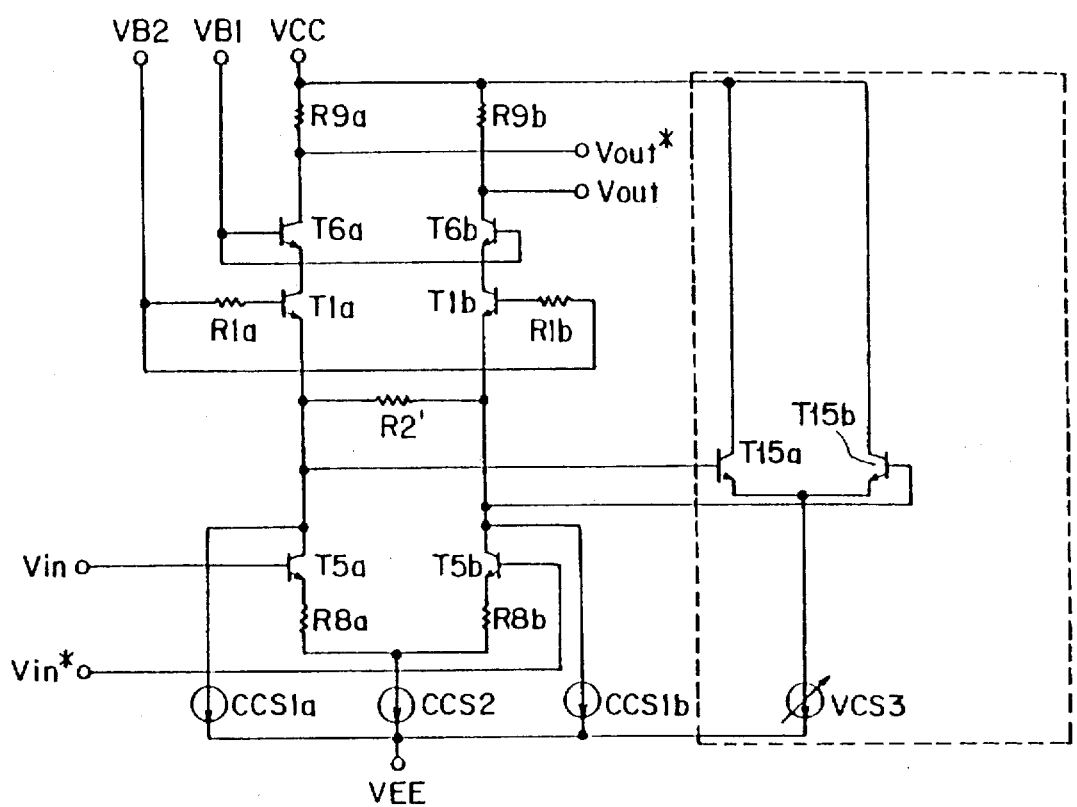
FIG. 21 is a diagram explaining the active filter circuit according to the twelfth embodiment of the present invention.

FIG. 21 is a diagram showing the active filter circuit according to the twelfth embodiment of the present invention. Referring to FIG. 21, T5a and T5b represent input transistors, T1a and T1b represent transistors forming inductances, T6a and T6b represent output transistors, T15a and T15b represent transistors forming variable capacitors, R8a, R8b, R2', R1a, R1b, R9a and R9b represent resistors, CCS2 represents a constant current source, CCS1a and CCS1b represent constant current sources each expanding the dynamic range, and VCS3 represents a variable current source each which varies the emitter current.

The circuit, shown in FIG. 21, is formed by applying the circuit shown in FIG. 1 to the black-box shown in FIG. 12. The capacitor C1 shown in FIG. 1 is substituted for the input capacitance of each of the transistors T15a and T15b.

The circuit shown in FIG. 21 has the same transfer function as that of the circuit shown in FIG. 1. The circuit shown in FIG. 21 is a low-pass filter having a secondary cut-off characteristic.

As shown in FIG. 21, the input capacitance of each of the transistors T15a and T15a is the sum of (Cd+CJE+CJC) because the juncture between the emitters of the transistors T15a and T15b is virtually grounded. Hence, the secondary low-pass filter circuit shown in FIG. 21 can vary the cut-off frequency in accordance with the current from the variable current source VCS3.

According to the active filter circuit of the twelfth embodiment of the present invention, the secondary low-pass filter circuit which can vary the cut-off frequency can be easily realized as an actual circuit, particularly, an integrated circuit without using a discrete coil. Hence a low-pass filter circuit which can control the cut-off frequency can be realized as an integrated circuit. Thus, the performance of the amplifier arranged in the optical communications system is more improved and the entire system can be effectively small-sized.

According to the present embodiment, as described above, a pair of the active filter circuits embodying the first aspect of the present invention forms, as an example, a differential amplifying circuit. However, the method for varying a capacitance with a transistor can be applied to the circuit according to other aspects but should not be limited to the mode of the differential amplifier.

Figure 22:
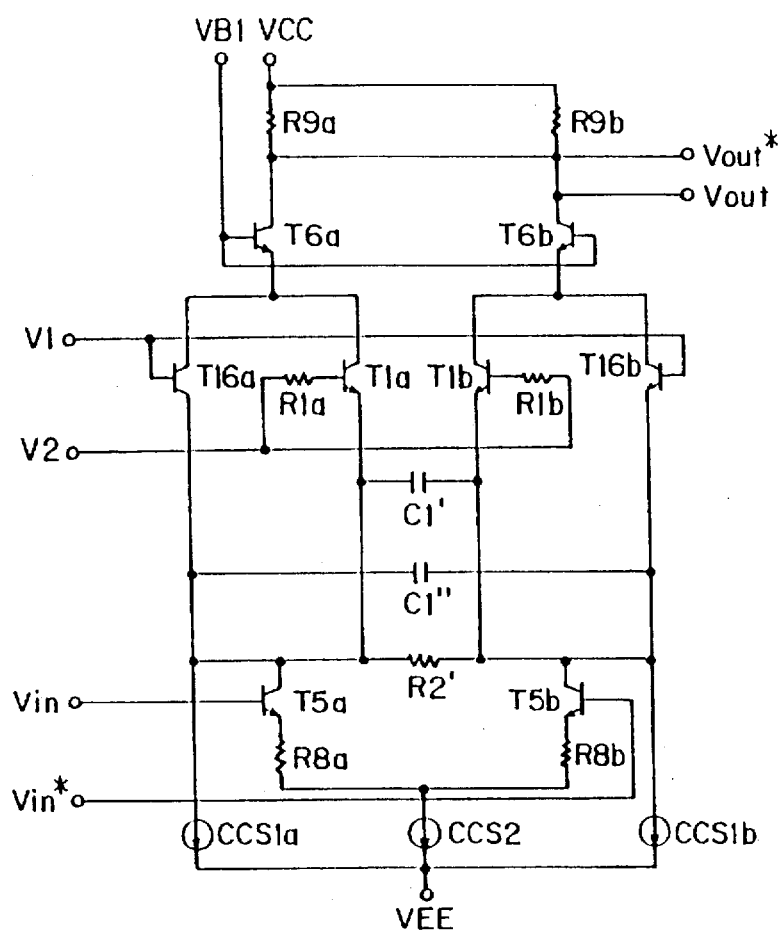
FIG. 22 is a diagram explaining the active filter circuit according to the thirteenth embodiment of the present invention.

FIG. 22 is a diagram showing the active filter circuit according to the thirteenth embodiment of the present invention. Referring to FIG. 22, T5a and T5b represent input transistors, T1a and T1b represent transistors forming inductances, T16a and T16b represent transistors having the emitter resistors acting as resistors, T6a and T6b represent output transistors; R8a, R8b, R2', R1a, R1b, R9a and R9b represent resistors, C1' and C1" represent capacitors, CCS2 represents a constant current source, and CCS1a and CCS1b represent constant current sources each expanding the dynamic range.

The circuit of the transistors T5a, T1a and T6a (or of the transistors T5b, T16b and T6b) corresponds to the circuit in the black box shown in FIG. 1 to form a low pass filter circuit with a secondary cut-off frequency.

Figure 49:
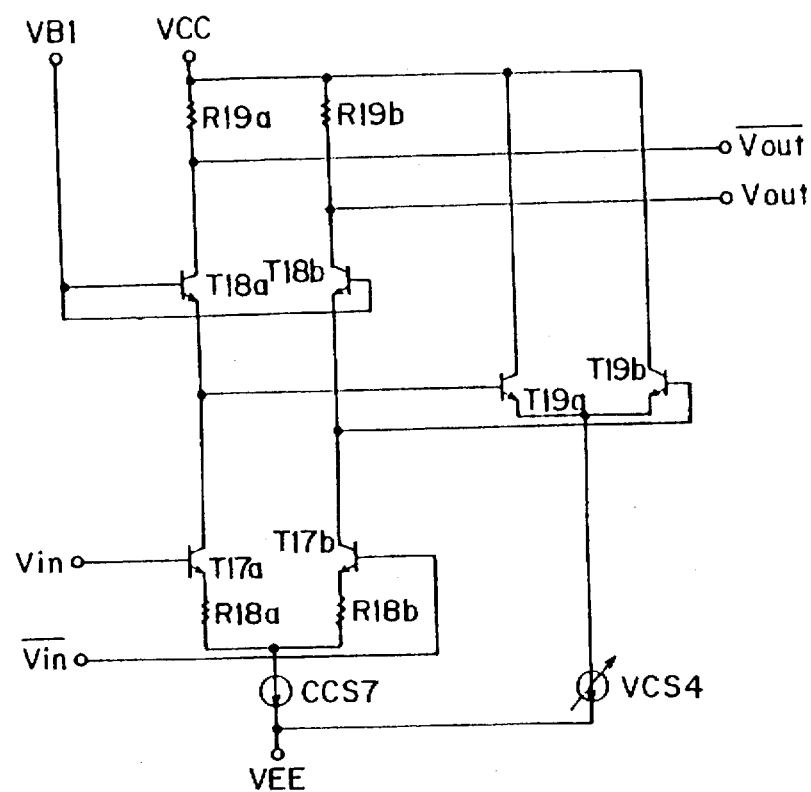
FIG. 49 is a diagram showing an example of a conventional active filter circuit.
Figure 50:
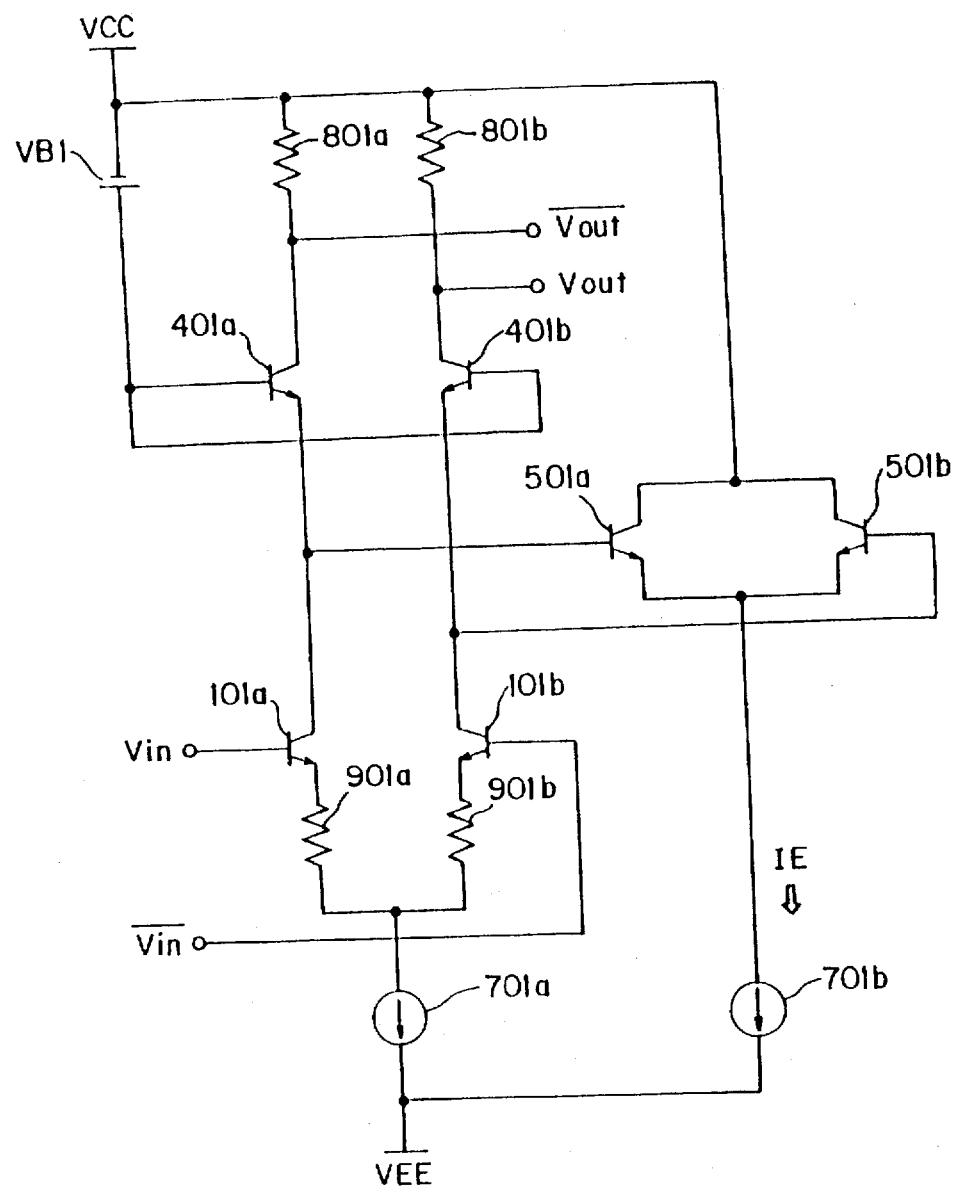
FIG. 50 is a diagram showing a first conventional frequency band variable filter circuit.
Figure 51:
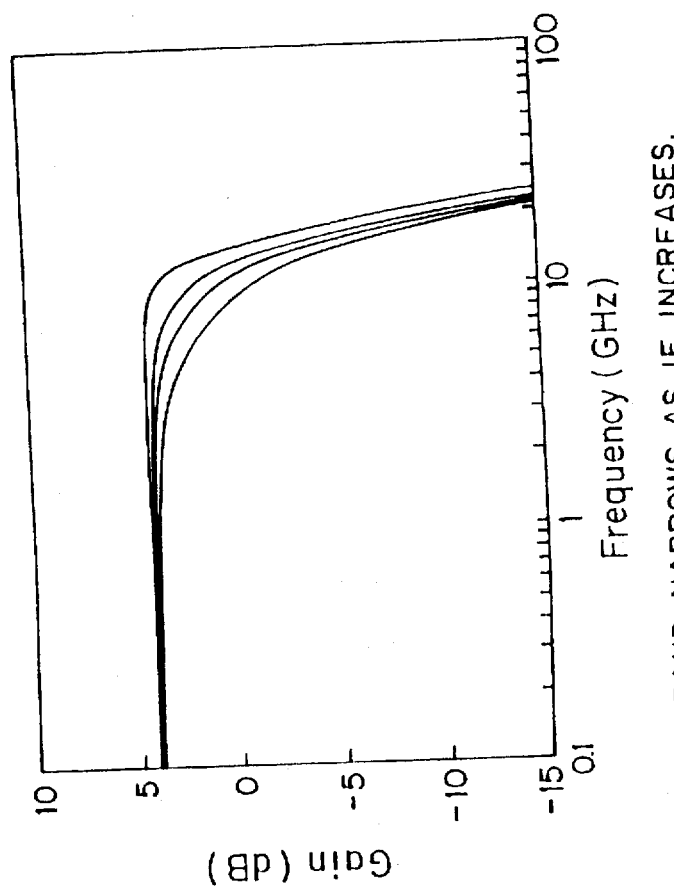
FIG. 51 is a graph showing the result simulated by SPICE.
Figure 52:
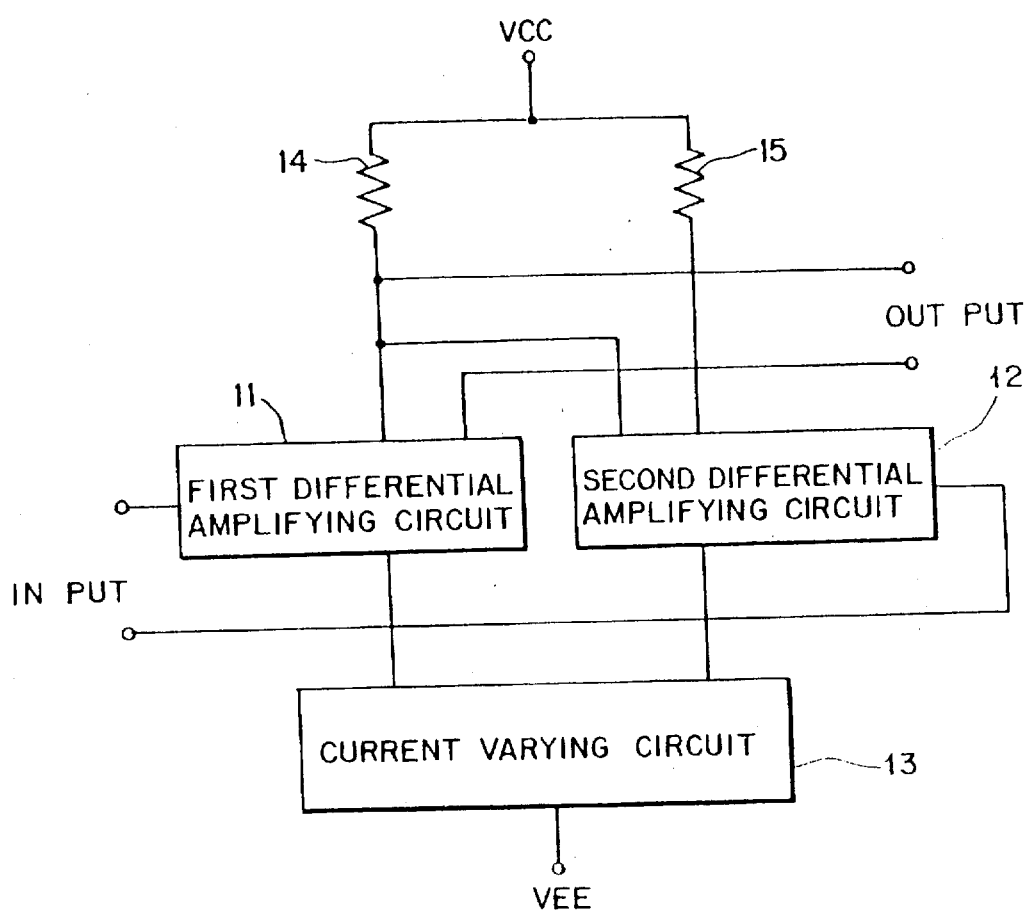
FIG. 52 is a diagram showing a second conventional frequency band variable filter circuit.

The circuit of the transistors T5a, T16a and T6a (or of the transistors T5b, T1b and T6b) corresponds basically to a low pass filter circuit with a first cut-off frequency characteristic shown in FIG. 49.

The circuit shown in FIG. 22 can switch the secondary low-pass filter circuit and the primary low-pass filter circuit by selectively setting the base bias voltage V2 for the transistors T1a and T1b and the base bias voltage V1 for the transistors T16a and T16b. In the circuit shown in FIG. 22, the secondary low-pass filter circuit is selected by flowing current through the transistors T1a and T1b, with the base bias voltage V1 set to a low value, the transistors T16a and T16b cut off, and the base bias voltage V2 set to a high value. On the contrary, the primary low-pass filter circuit is selected by supplying current through the transistors T16a and T16b, with the transistors T1a and T1b cut off.

As described above, the active filter circuit of the thirteenth embodiment of the present invention allows the same integrated circuit to have different functions, together with the effect of the secondary low-pass filter circuit. Hence there is an advantage in that the circuit designing flexibility can be improved.

In the circuit shown in FIG. 22, the resistors R1a and R1b can be replaced by the emitter resistance $r_e$ of the transistor to which current is supplied from the variable current source. The capacitors C1' and C1" can be replaced by the capacitance counting the base capacitance of the transistor to which current is supplied from the variable current source.

According to the present embodiment, the circuit where the primary low-pass filter circuit and the secondary low-pass filter circuit are combined and separated has been described as an example. However, the filter circuits combined should not be limited only to the above embodiment. Filter circuits with arbitrary characteristics can be combined. The filter circuit also should not be limited to the differential amplifier-type filter.

Figure 24:
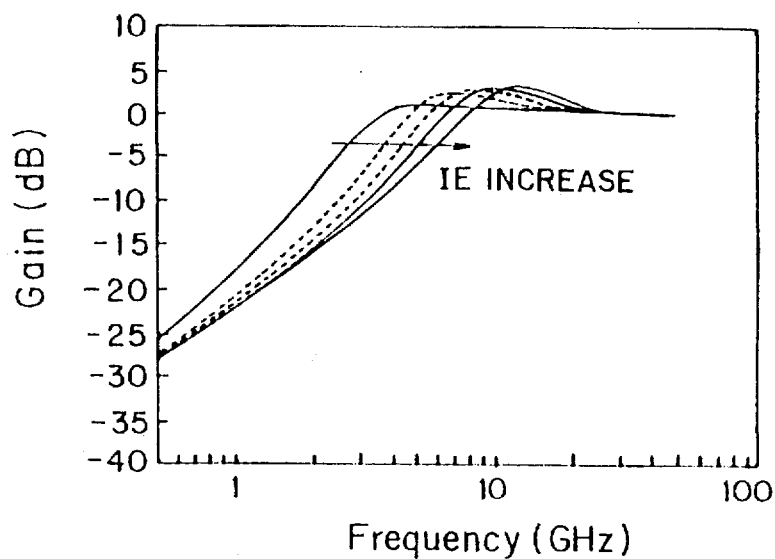
FIG. 24 is a graph showing the first resultant simulation.
Figure 25:
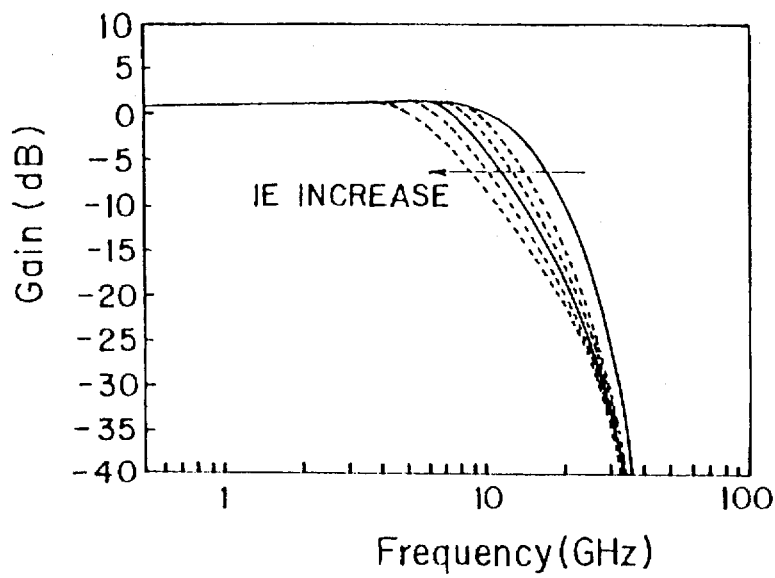
FIG. 25 is a graph showing the second resultant simulation.

FIGS. 24 and 25 are graphs each showing the result simulated by using SPICE (circuit simulator). FIG. 24 shows the characteristic of the high-pass filter circuit in which the resistor R12 of the circuit shown in FIG. 4(a) is replaced by the emitter resistor $r_e$ of the transistor to which current is supplied from the variable current source. As shown in FIG. 24, the cutoff frequency increases (because of the decreasing resistance of $r_e$) as the current from the variable current source increases.

FIG. 25 shows the characteristic of the low-pass filter circuit shown in FIG. 21. As shown in FIG. 25, the cut-off frequency decreases (because Cd increases proportionally) as the emitter current of the variable capacitance forming transistor increases.

In the above-mentioned embodiments, active filter circuits including bipolar transistors (referred to as normal transistors) acting as active elements have been described. Similar circuits having the basic operation can be formed using field-effect transistors.

The reason is that the impedance viewed from the source of the field effect transistor which has the gate grounded via a resistor can be expressed with the equivalent circuit shown in FIG. 23.

Because of a relatively low value of gm, it cannot be avoided that the filter circuit formed of field-effect transistors is inferior in the characteristic to the filter circuit formed of transistors. However, there is an advantage in that the filter circuit can be very easily formed with digital circuits on the same chip.

Figure 26:
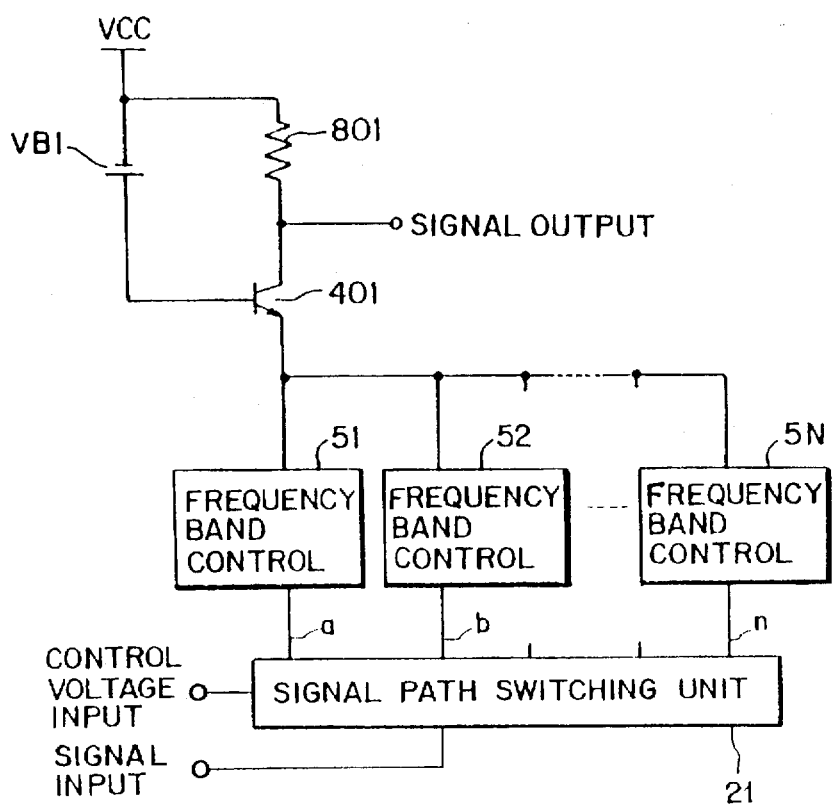
FIG. 26 is a block diagram explaining the aspect of the frequency band variable filter circuit according to the present invention.

(c) Basic Explanation of the Frequency-band Variable Filter Circuit according to the Invention:

FIG. 26 is a block diagram showing the frequency range variable filter circuit according to an aspect of the present invention. Referring to FIG. 26, numeral 21 represents a signal path switching unit; 51, 52, . . . , 5N represent frequency range control units; 401 represents a cascode transistor, 801 represents a resistor, VB1 is a bias power source, and a, b, . . . , and n are signal transmission lines.

FIG. 26 shows the frequency band variable filter circuit is used in the signal receiving unit arranged in the optical communications system. The frequency band variable filter circuit consists of a signal path switching unit 21 which switches an input signal to the signal transmission line a, b, . . . or n by changing the applied control voltage; frequency band control units 51, 52, . . . , and 5N connected respectively to the signal transmission lines a, b, . . . , and n and each having a different range of bandwidth; and cascode transistor 401 having the emitter connected to the signal path switching unit 21 via the frequency range control units 51, 52, . . . , and 5N.

In order to achieve the purpose, the input signal transmission path is switched by changing the control voltage applied to the signal path switching unit 21 so that the frequency range of each of the signal transmission lines a, b, . . . , and n is controlled.

According to the first method which realizes the above-mentioned frequency range variable filter circuit, the signal path switching unit 21 is formed of a common-emitter transistor 101 having the common-emitter via the resistor 901, and transistors 201, 202, . . . , 20N each having the collector connected to the common-emitter transistors 101.

The frequency range control units 51, 52, . . . , and 5N are formed of frequency range control circuits 501, 502, . . . , and 50N connected respectively to the collectors of the transistors 201, 202, . . . , and 20N, and resistors having different impedances R2, . . . RN connected respectively to the collectors of the transistors 202, . . . , and 20N.

The cascode transistor 401 has the emitter connected to the collector of the common-emitter transistor 101 and respectively to the collectors of the transistors 202, . . . , and 20N via the resistors 302, . . . , and 30N.

The transmission path which flows the collector signal current of the common-emitter transistor 101 is switched by inputting the signal voltage Vin to the base of the common-emitter transistor 101 and the control voltages V1, V2, . . . , and VN to the bases of the transistors 201, 202, . . . , and 20N. Thus the frequency range variable circuits 501, 502, . . . , and 50N are selectively controlled to a signal current path.

In the first method, the signal path switching unit is formed of the common-emitter transistor 101 grounded via the resistor 901; the transistors 201, 202, . . . , and 20N; resistors 302, . . . , and 30N; the frequency range control units 501, 502, . . . , and 50N, and the cascode transistor 401. However, according to the second method, the signal path switching unit can be formed of the differential pair configuration which includes common-emitter transistors 101a and 101b having the emitters connected respectively to the resistors 901a and 901b; a current source 701 connected to the juncture of the resistors 901a and 901b; transistors 201a, 201b, . . . , 20Na, and 20Nb; resistors 302a and 302b, . . . , 30Na, and 30Nb; frequency range control circuits 501, 502, . . . , and 50N; and cascade-arranged transistors 401a and 401b.

Moreover, according to the third method, the signal path switching unit 21 is formed of the emitter ground transistor 101 grounded via the resistor 901; and the emitter ground transistors 102, . . . , and 10N grounded via the resistors 902, . . . , and 90N.

In order to control the frequency range control circuits 501, 502, . . . , and 50N, the signal path is switched by applying the signal voltage Vin and the control voltages V1, V2, . . . , and VN to the bases of the emitter ground transistors 101, 102, . . . , and 10N.

The signal path switching unit consists of the emitter ground transistors 101, 102, . . . , and 10N; the resistors 302, . . . , and 30N; the frequency range control circuits 501, 502, . . . , and 50N; and the cascode transistor 401. However, according to the fourth method, the signal path switching unit can be formed of the differential pair configuration which includes the emitter ground transistors 101a, 101b, 102a, 102b, . . . , 10Na, and 10Nb connected respectively to the constant current source 701 via the resistors 901a, 902a, . . . , 90Na, and 901b, 902b, . . . , and 90Nb; the resistors 302a, 302b, . . . , 30Na, and 30Nb; the frequency range control circuits 501, 502, . . . , and 50N; and the cascade transistors 401a and 401b.

The signal path switching unit 21 is formed of the emitter ground transistors 101a, 102a, . . . , 10Na, and 101b, 102b, . . . , 10Nb. However, according to the fifth method, the signal path switching unit can be formed of a differential pair configuration which includes emitter ground transistors 10a, 102a, . . . , 10Na, and 101b, 102b, . . . , 10Nb; the transistors 201, 202, . . . , and 20N having the collectors connected in common to the emitters of the transistors 110a, 101b, 102a, 102b, . . . , 10Na, and 10Nb and the emitters connected in common; and the current source 701 connected in common to the emitters of the transistors 201, 202, . . . , and 20N.

The signal voltage Vin is applied to the bases of the differential transistor pairs 101a and 101b, 102a and 102b, . . . , and 10Na and 10Nb. The control voltages V1, V2, . . , and VN are applied respectively to the bases of the transistors 201, 202, . . . , and 20N. In order to control a specific one among the frequency range control circuits 501, 502, . . . , and 50N, the signal path is switched by setting the control voltages V1, V2, . . . and VN.

According to the sixth method, the system includes the transistors 401', 402', . . . , and 40N' have the collectors connected in common to the emitter of the transistor 401, the emitters connected in common to the collectors of the transistor 201 and to the resistors 302, . . . , and 30N, and the bases connected to the bias power source VB2.

The signal transmission path switching unit is formed of the emitter ground transistor 101 grounded via the resistor 901; the transistors 201, 202, . . . , and 20N; the resistors 302, . . . , and 30N; the frequency range control circuits 501, 502, . . . , and 50N; and the cascade-arranged transistors 401, 401', 402', . . . , and 40N'. However, according to the seventh method, the signal transmission path switching unit can be formed of the differential pair configuration which includes the emitter ground transistors 101a and 101b grounded respectively via the resistors 901a and 901b; the constant current source 701 connected to the juncture between the resistors 901a and 901b; the transistors 201a, 201b, 202a, 202b, . . . , 20Na, and 20Nb; the resistors 302a, 302b, . . . , 30Na, and 30Nb; the frequency range control circuits 501, 502, . . . , and 50N; and the cascode transistors 401a, 401b, 401a', 401b', . . . , 40Na', and 40Nb'.

In the eighth embodiment, the third embodiment may be modified in such a manner the cascode transistors 401', 402', . . . , and 40N' have collectors connected in common to the emitter of the cascode transistor 401, the emitters connected to the collector of the emitter grounded transistor 101 and the resistors 302, . . . , and 30N, respectively, and the base connected in common to the bias power source VB2.

In the eighth embodiment, the signal transmission path switching unit includes the emitter ground transistors 101, 102, . . . , and 10N, the resistors 302, . . . , and 30N, the frequency range control circuits 501, 502, . . . , and 50N, and the cascade-arranged transistors 401, 401', 402', . . . , and 40N'. In the ninth embodiment. However, in the ninth embodiment, the signal transmission path switching unit may be formed of a differential pair configuration which includes the emitter ground transistors 101a, 102a, . . . , 10Na, and 101b, 102b, . . . , 10Nb having the emitters connected to the constant current source 701 via the resistors 901a, 901b, 902a, 902b, . . . , 90Na, and 90Nb; the resistors 302a, 302b, . . . , 30Na, and 30Nb; the frequency range control circuits 501, 502, . . . , and 5ON; the cascade-arranged transistors 401a, 401b, 401a', 401b', 402a', 402b', . . . , 40Na', and 40Nb'.

According to the tenth method, the fifth method may be modified in such a manner that the cascade transistors 401a', 401b', 402a', 402b', . . . , 40Na', and 40Nb', have the collectors connected in common to the emitter of the cascade transistors 401a and 401b, the emitters connected to the collector of the emitter grounded transistors 101a and 101b and to the resistors 302a, . . . , and 30Na, 302b, . . . , and 30Nb, respectively, and the bases connected in common to the bias power source VB2.

According to the eleventh method, the first to tenth methods may be modified in such a manner the control voltages V1, V2, . . . , and VN may be applied to the frequency band variable filter circuit while plural signal transmission paths can be activated simultaneously.

According to the twelfth method, the first to tenth methods may be modified in such a manner that the frequency band variable filter circuits may be cascaded so as to control independently the frequency ranges thereof.

According to the thirteenth method, the first to tenth methods may be modified in such a manner that the control voltages V1, V2, . . . , and VN are applied to the frequency band variable filter circuits so as to activate simultaneously plural signal transmission paths while the frequency band variable filter circuits may be cascaded so as to control independently the frequency ranges thereof.

According to the fourteenth method, in the first to tenth methods, the frequency range control units (51, 52, . . . , and 5N) may act as frequency range control units (51, 52, . . . , and 5N) each with a different cut-off frequency order.

According to the fifteenth method, in the first to tenth methods, the frequency range control units (51, 52, . . . , and 5N) may act as frequency range control units (51, 52, . . . , and 5N) each with a different order cut-off characteristic while the control voltages V1, V2, . . . , and VN may be applied to the frequency range variable filter circuit so as to activate simultaneously plural signal transmission paths.

According to the sixteenth method, in the first to tenth methods, the frequency range control units (51, 52, . . . , and 5N) may act as frequency range control units (51, 52, . . . , and 5N) each with a different order cut-off characteristic while the frequency band variable filter circuits may be cascaded so as to control independently the frequency ranges thereof.

According to the seventeenth method, in the first to tenth methods, the frequency range control units (51, 52, . . . , and 5N) may act as frequency range control units (51, 52, . . . , and 5N) each with a different cut-off frequency order while the frequency band variable filter circuits are cascaded so as to activate simultaneously plural signal transmission paths, whereby the frequency ranges of the control voltages V1, V2, and VN are independently controlled.

Next, the function of the frequency variable band filter circuit according to the present invention will be described below.

According to the aspect of the frequency variable band filter circuit of the invention described with FIG. 26, an input signal is output from the cascade transistor 401 via the signal path switching unit 21 which switches the signal transmission paths a, b, . . . , and n by changing the applied control signal and one of the signal transmission paths a, b, . . . , and n connected to the frequency range control units 51, 52, . . . , and 5N each having a different frequency range variable width. To pass an input signal, the signal transmission paths a, b, . . . , and n can be switched by varying the control voltage, thus controlling the frequency range to an input signal.

According to the first method which realizes the aspect of the invention, the signal path switching unit 21 is formed of the emitter ground transistor having the emitter grounded via the resistor 901, and the transistors 201, 202, . . . , and 20N connected to the collector of the common-emitter transistor 101.

The frequency range control units 51, 52, . . . , and 5N is formed of the frequency range control circuits 501, 502, . . . , and 50N connected to the collectors to the transistors 201, 202, . . . , and 20N, and the resistors 302, . . . , and 30N with different impedances R2, . . . , and RN connected respectively to the collectors of the transistors 202, . . . , and 20N.

The same effect can be obtained by using diodes, instead of the resistors 302, . . . , and 30N. The replacement are applicable to all the aspect of the present invention. Hence, the diodes used instead of the resistors 302, . . . , and 30N will be omitted in the following explanation.

The cascade transistor 401 has the emitter connected to the collector of the common-emitter transistor 101 and any one of the collectors to the transistors 202, . . . , and 20N via the resistors 302, . . , and 30N.

In such a configuration, the signal voltage Vin is input to the base of the common-emitter transistor 101 and the control voltages V1, V2, . . . , and VN are input to the bases of the transistors 201, 202, . . . , and 20N.

When the control voltages V1, V2, . . . , and VN are controlled, a suitable path with a desired frequency range variable width through which the collector-signal current of the common-emitter transistor flows can be selected among the signal transmission paths a, b, . . . , and n.

In the first method, the signal transmission path switching unit includes the common-emitter transistor 101 having the emitter grounded via the resistor 901, the transistors 201, 202, . . . , and 20N, the resistors 302, . . . , and 30N, the frequency range control circuits 501, 502, . . . , and 50N, and the transistor 401. However, according to the second method realizing the aspect of the present invention, the signal transmission path switching unit can be formed of a differential pair configuration which includes the common-emitter transistors 101a and 101b having the emitters grounded via the resistors 901a and 901b; the transistors 201, 202, . . . , and 20N; the resistors 302a, 302b, . . . , 30Na, and 30Nb; the frequency range control circuits 501, 502, . . . , and 50N; and the cascade transistors 401a and 401b.

The input signal Vin is input to the base of the common-emitter transistor 101a and the inverted input signal Vin is input to the base of the common-emitter transistor 101b. The control signals V1, V2, . . . , and VN are input to the transistors 201a, 202a, . . . , 20Na, . . . , 201b, 202b, . . . , 20Nb, respectively.

The collector signal current of the common-emitter transistor 101a and the inverted signal of the common-emitter transistor 101b can be switched to the optimum signal transmission path with a desired frequency range variable width by controlling the control signals V1, V2, . . . , and VN.

In the third method realizing the aspect of the present invention, the signal path switching unit 21 is formed of the common-emitter transistor 101 having the emitter grounded via the resistor 901 and the common-emitter transistors 102, . . . , and 10N grounded via the resistors 902, . . . , and 90N.

The signal voltage Vin plus each of the control voltages V1, V2, . . . , and VN are input respectively to the base of the common-emitter transistors 101, 102, . . . , and 10N.

The transmission path is switched to the optimum path having a desired frequency range variable width by controlling the control voltages V1, V2, . . . , and VN.

In the third method, the signal transmission path switching unit includes the common-emitter transistors 101, 102, . . . , and ION, the resistors 302, . . . , and 30N, the frequency range control circuits 501, 502, . . . , and 50N, and the cascade transistor 401. According to the fourth method realizing the aspect of the present invention, the signal transmission path switching unit can be formed of a differential pair configuration which includes the common-emitter transistors 101a, 101b, 102a, 102b, . . . , 10Na, and 10N having the emitters connected to the constant current source 701; the transistors 302a, 302b, . . . , 30Na, and 30Nb; the resistors 302a, 302b, . . . , 30Na, and 30Nb; the frequency range control circuits 501, 502, . . . , and 50N; and the cascade transistors 401a and 401b.

The input signal and the control signal are superimposed to input to the common-emitter transistors 101a, 102a, . . . , 10Na, 101b, 102b, . . . , and 10Nb.

The transmission path is switched to the optimum path having a desired frequency range variable width by controlling the control voltages V1, V2, . . . , and VN.

In the fifth method realizing the aspect of the present invention, the signal path switching unit 21 formed of the common-emitter transistors 101a, 102a, . . . , 10Na, and 101b, 102b, . . . , and 10Nb is formed of the differential transistor pairs 101a, 101b, 102a, 102b, . . . , 10Na and 10Nb; the transistors 201, 202, . . . , and 20N having the collectors connected in common to the emitters of the transistors 101a, 101b, 102a, 102b, . . . , 10Na, and 10Nb and the emitter connected to the transistors 201, 202, . . . , and 20N; and the current source 701 connected to the emitters of the transistors 201, 202, . . . , and 20N.

The input voltage Vin is input in common to the bases of the transistors 101a, 101b, 102a, 102b, . . . , 10Na, and 10Nb. The control voltages V1, V2, . . . , and VN are respectively input to the bases of the transistors 201, 202, . . ., and 20N.

The transmission path can be switched to the optimum path with a desired frequency range variable width by setting the control voltages V1, V2, . . . , and VN.

According to the first method, the cascade transistors 401', 402', . . . , and 40N' has respectively the collectors connected in common to the emitter of the cascade transistor 401, the emitters connected to the collector of the transistor 201 and to the resistors 302, . . . , and 30N in the other signal transmission paths, the bases connected to the bias power source VB2. Hence, according to the sixth method realizing the aspect of the present invention, like the first embodiment of the invention, the transmission path can be switched to the optimum path with a desired frequency range variable width.

According to the sixth method, like the differential pair configuration in the second method applied to the first method, the differential pair configuration is formed of the transistors 101, 201, 202, . . . , 20N, 401, 401', 402', . . . , and 40N'. Hence according to the seventh method realizing the present invention, like the second method, the transmission path is switched to the optimum path with a desired frequency range variable width by setting the control voltages V1, V2, . . . , and VN.

According to the third method, the cascade transistors 401', 402', . . . , and 40N' have the collectors connected in common to the emitter of the transistor 401, the emitters connected to the collector of the common-emitter transistor 101 and to the resistors 302, . . . , and 30N, and the bases connected in common to the bias power source VB2. Hence according to the eighth method realizing the present invention, like the third method, the transmission path can be switched to the optimum path with a desired frequency range variable width by setting the control voltages V1, V2, . . . , and VN.

According to the eighth method, like the differential configuration relating to the fourth method applied to the third method, the differential pair configuration is formed of the transistors 101, 102, . . . , 10N, 401, 401', 402', . . . , and 40N'. Hence according to the ninth method realizing the present invention, the transmission path can be switched to the optimum path with a desired frequency range variable width by setting the control voltages V1, V2, . . . , and VN.

According to the fifth method, the cascade transistors 401a', 401b', 402a', 402b', . . . , 40Na', and 40Nb', have respectively the collectors connected in common to the emitters of the cascade transistors 401a and 401b, the emitters connected to the collector of the common-emitter transistors 101a and 101b and to the resistors 302a and 302b, and the bases connected to the bias power source VB2. Hence, according to the tenth method realizing the aspect of the present invention, like the fifth invention, the transmission path can be switched to the optimum path with a desired frequency range variable width.

According to the first to tenth methods, the control voltages V1, V2, . . . , and VN are input to activate simultaneously the plural signal transmission paths. Hence, according to the eleventh method realizing the aspect of the present invention, the frequency range can be controlled by controlling the signal current ratio between plural transmission paths operated on the control voltages V1, V2, . . . , and VN, without controlling the frequency range control circuits 501, 502, . . . , and 50N.

According to all the first to tenth methods, the frequency range control circuits are cascaded to control independently the frequency range thereof. Hence, according to the twelfth method realizing the aspect of the present invention, like the first to tenth methods, the transmission path can be switched to the optimum path to vary the frequency range thereof.

According to all the first to tenth methods, a voltage is added respectively to the control voltages V1, V2, . . . , and VN so as to operate simultaneously the plural signal transmission paths. The frequency range variable circuits are cascaded to control independently their frequency ranges. Hence, according to the thirteenth method realizing the aspect of the present invention, the transmission path can be switched selectively to the optimum path to control and vary the frequency range thereof, whereby the frequency characteristics with a more-squared shoulder can be obtained.

According to all the first to tenth methods, the frequency range control units (51, 52, ..., 5N) can act as frequency range control units (51, 52, ..., and 5N) having different cut-off orders.

Hence, according to the fourteenth method realizing the aspect of the present invention, the frequency range control units (51, 52, ..., and 5N) can be switched to a desired cut-off order, respectively.

According to all the first to tenth methods, the frequency range control units (51, 52, ..., and 5N) can act as the frequency range control units (51, 52, ..., and 5N) with different cut-off orders and a voltage is added to the control voltages V1, V2, ..., and VN to activate simultaneously plural signal transmission paths. Hence, according to the fifteenth method realizing the aspect of the present invention, the frequency range control units (51, 52, ..., and 5N) can be switched to different cut-off orders while the signal current ratio between the plural transmission paths operated on the control voltages V1, V2, ..., and VN can be controlled without controlling the frequency range control circuits 501, 502, ..., and 50N.

According to all the first to tenth methods, the frequency range control units (51, 52, ..., and 5N) is the frequency range control units (51, 52, ... and 5N) with different cut-off orders and the frequency range varying circuits are cascoded to control independently their frequency ranges. Hence, according to the sixteenth method realizing the aspect of the present invention, the frequency range control units (51, 52, ..., and 5N) are switched to desired cut-off orders and the optimum signal path is selected to control and vary the frequency range thereof.

According to the first to tenth method, the frequency range control units (51, 52, ..., and 5N) are frequency range control units (51, 52, ..., and 5N) having different cut-off orders. A voltage is added respectively to the control voltages V1, V2, ..., and VN to activate simultaneously plural signal transmission paths, and the frequency range control units are cascaded to control independently their frequency ranges. Hence according to the seventeenth method realizing the aspect of the invention, the frequency range control circuits (51, 52, ..., and 5N) can be switched to a desired cut-off order and can control the signal current ratio between the plural transmission paths, without controlling the frequency range control circuits 501, 502, ..., and 50N. The signal path can be switched selectively to the optimum signal one, thus controlling and varying the frequency range thereof.

The first to seventeenth methods using bipolar transistors have been described throughout the above explanations. The above-mentioned methods can applicable to circuit systems using field effect transistors. In this case, the base, emitter, and collector of the bipolar transistor correspond to the gate, source, and drain of a field-effect transistor, respectively.

(d) Explanation of the Embodiment of the Frequency Range Variable Filter Circuit:

Next, the frequency-band variable filter circuit according to the embodiment of the present invention will be described below with reference to FIGS. 27 to 47.

In FIGS. 27 to 47, like symbols are attached to the same elements as those shown in FIG. 26. Numerals 100 and 200 represent frequency band variable filter circuits; 101, 101a, 101b, 102, 102a, 102b, 10N, 10Na, and 10Nb represent emitter ground transistors; 201, 201a, 201b, 202, 202a, 202b, 20N, 20Na, 20Nb, 41 to 46, TR71, and TR72 represent transistors; 301, 301a, 301b, 302, 302a, 302b, 30N, 30Na, and 30Nb represent resistors (or diodes); 401, 401a, 401a', 401b, 401b', 402, 402a, 402a', 402b, 402b', 40N, 40Na, 40Na', 40Nb, and 40Nb', represent cascade transistors; 501, 502, and 50N represent frequency range control circuits; 701 and 701a represent constant current sources; 701b represents a variable current source; 801, 801a, 801b, 901, 901a, 901b, 902, 902a, 902b, 90N, 90Na, 90Nb, and R71 to R73 represent resistors; R74 represents a variable resistor; and VB1 and VB2 represent bias power sources.

Figure 27:
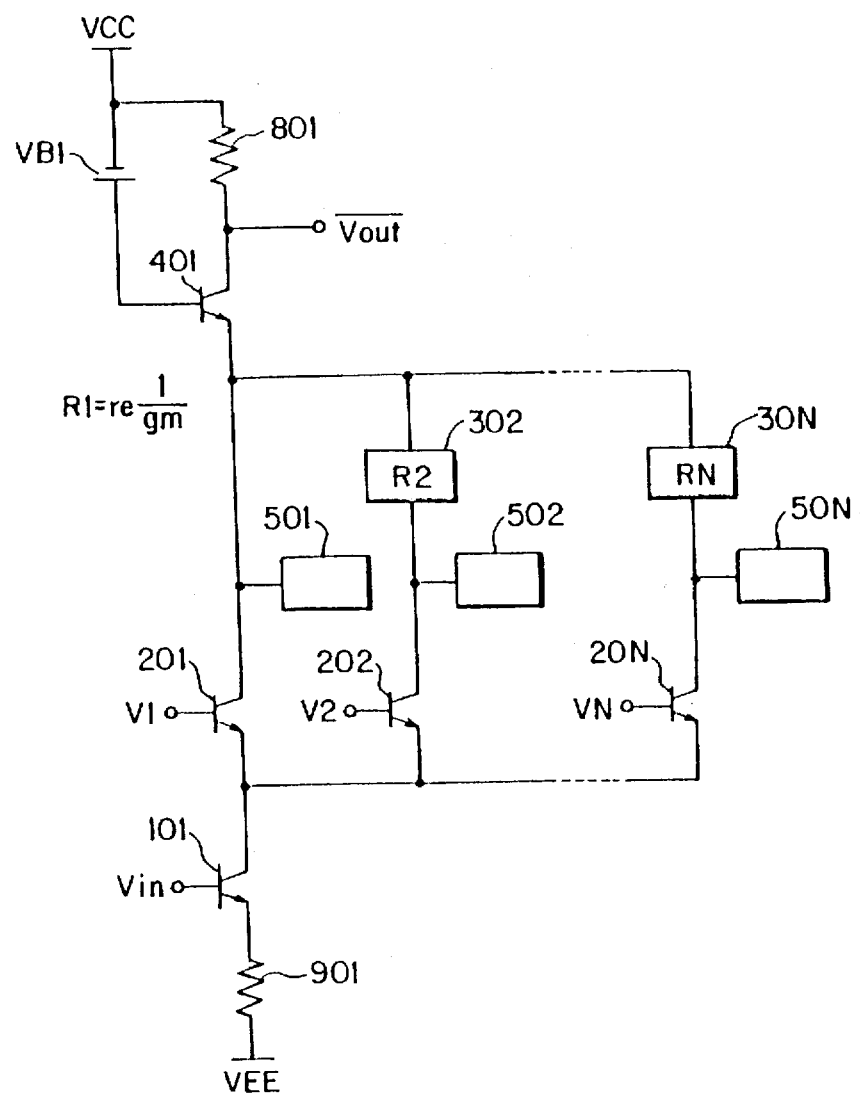
FIG. 27 is a block diagram showing the frequency band variable filter circuit according to the first embodiment of the present invention.

FIG. 27 is a diagram showing the frequency band variable filter circuit according to the first embodiment of the present invention. As shown in FIG. 27, according to the present invention, the signal path switching unit 21 shown in FIG. 26 is formed of the common-emitter transistor 101 having the emitter grounded via the resistor 901, and transistors 201, 202, ..., and 20N connected to the collector of the emitter ground transistor 101.

The frequency range control units 51, 52, ..., and 5N consists of the frequency range control circuits 501, 502, ..., and 50N connected respectively to the collectors of the transistors 201, 202, ..., and 20N, and the resistors 302, ..., and 30N with different impedances R2, ..., and RN connected respectively to the transistors 202, ..., and 20N.

Moreover, the transistor 401 has the emitter connected to the collector of the common-emitter transistor 101 and to the collectors of the common-emitter transistors 202, ..., and 20N respectively via the resistors 302, ..., and 30N.

In the circuit shown in FIG. 27, the collector signal current flowing through the common-emitter transistor 101 varies its transmission path in accordance with the control voltages V1, V2, ..., and VN.

In other words, if VN>VM (M≠N), the collector signal current flows through the transistor 20N (N≠1, 2, 3, ... ).

If N=1, the frequency range f of the control unit is fCNTL(MIN)<FORG. Like the conventional circuit, if N=1, the frequency fCNTL of the control unit is expressed by the following formula:

$$f_{CNTL(MIN)} = 1/2\pi(r_e + R_N) \cdot (Cd(I_B) + C_{JE} + C_{JC})$$

The minimum frequency range fCNTL(MIN) of the control unit is expressed by the following formula:

$$f_{CNTL(MIN)} = 1/2\pi(r_e + R_N) \cdot Cd(I_{B(MAX)})$$

Hence, the minimum frequency range can be determined by the resistance value RN of the resistor RN.

When the resistor RN is suitably selected and the control voltages V1, V2, ..., and VN select the transmission path, the frequency range can be widely varied without degrading the maximum frequency range.

As described above, according to the first embodiment of the present invention, the frequency band variable filter circuit can widely vary its frequency range. Hence the frequency range of the amplifying circuit arranged in the optical communications system can be set to the optimum frequency range corresponding to the transmission speed of the received signal. Thus, there is an advantage in that the amplifying circuit can effectively amplify signals.

Figure 28:
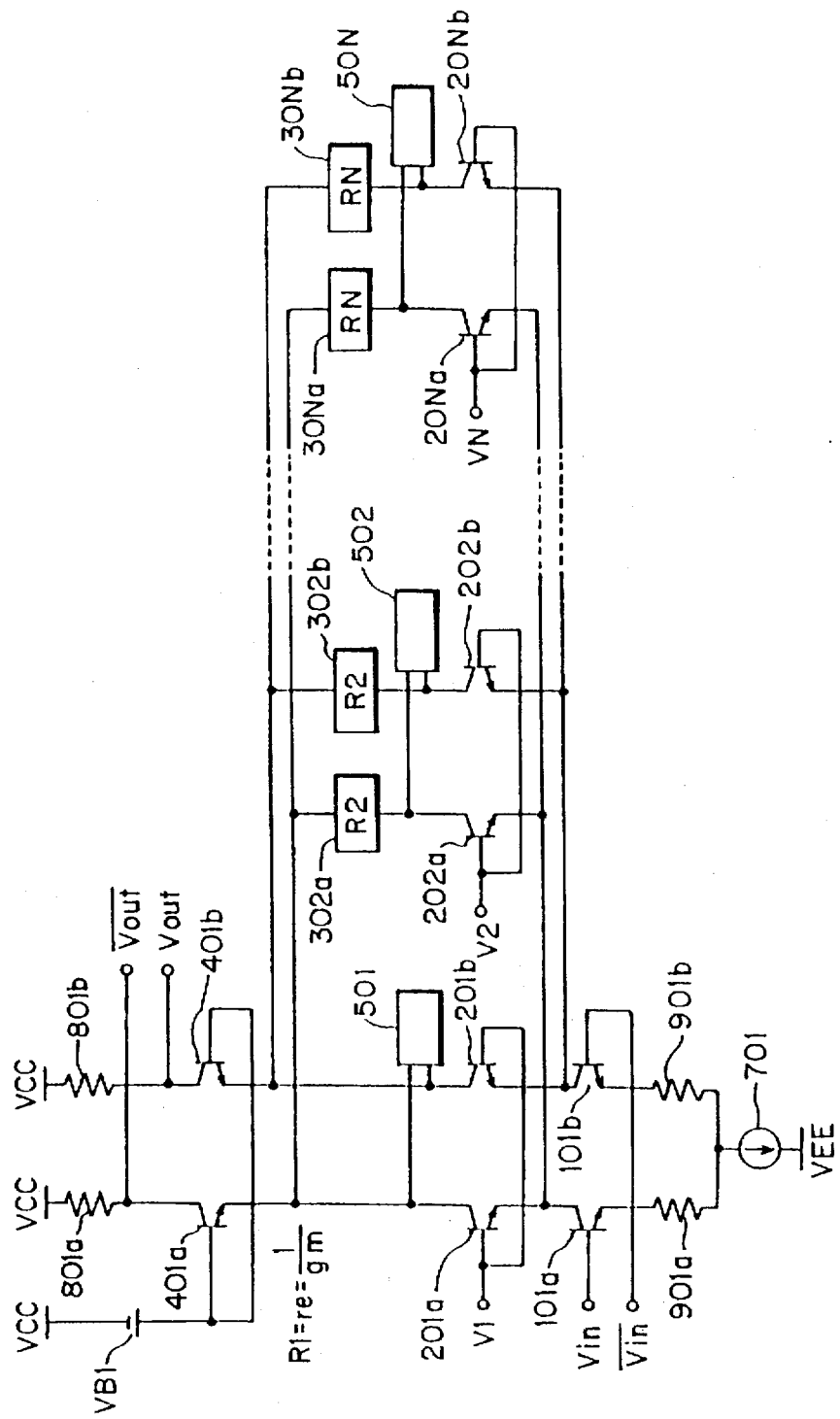
FIG. 28 is a block diagram showing the frequency band variable filter circuit according to the second embodiment of the present invention.

FIG. 28 is a diagram showing the frequency band variable filter circuit according to the second embodiment of the present invention. The circuit shown in FIG. 27 includes the common-emitter transistor 101 having the emitter grounded via the resistor 901; the transistors 201, 202, ..., and 20N; the resistors 302, ..., and 30N; the frequency range control circuits 501, 502, ..., and 50N; and the cascade transistor 401. However, the circuit shown in FIG. 28 has a differential pair configuration which includes the current source 701 connected to the commonemitter transistors 101a and 101b having the emitters connected to the resistors 901a and 901b; the current source 701 connected to the juncture between the resistors 910a and 901b; the transistors 201a, 201b, ..., 20Na, and 20Nb; the resistors 302a, 302b, ..., 30Na, and 30Nb; the frequency range control circuits 501, 502, ..., and 50N; and the cascade transistors 401a and 401b.

Like the first embodiment shown in FIG. 27, in the circuit shown in FIG. 28, the transistor differential pair 101a and 101b changes the transmission path of the collector signal current in accordance with the control voltage V1, V2, ..., or VN.

In this case, if VN>VM (M≠N), the collector signal current flows through the transistor 20N (N=1, 2, 3, ...). If N≠1, the minimum frequency range fCNTL(MIN) of the control unit is ½π(r_e+RN)·Cd(IE(MAX)). Hence, since the minimum frequency range fCNTL(MIN) of the control unit can be determined by selecting suitably the resistance value RN of the resistor RN, the frequency range can be widely varied by switching the transmission path by means of the control voltages V1, V2, ..., and VN, without degrading the maximum frequency range.

It is possible to vary the frequency range by constructing the filter circuit in a differential configuration like the transistor differential pair 101a and 101b.

According to the frequency band variable filter circuit of the second embodiment of the present invention, like the first embodiment, the frequency range of the amplifying circuit arranged in the optical communications system, for example, can be matched with the optimum frequency range corresponding to the received signal. Hence, there is an advantage in that the amplifying circuit can effectively amplify the signals.

Figure 29:
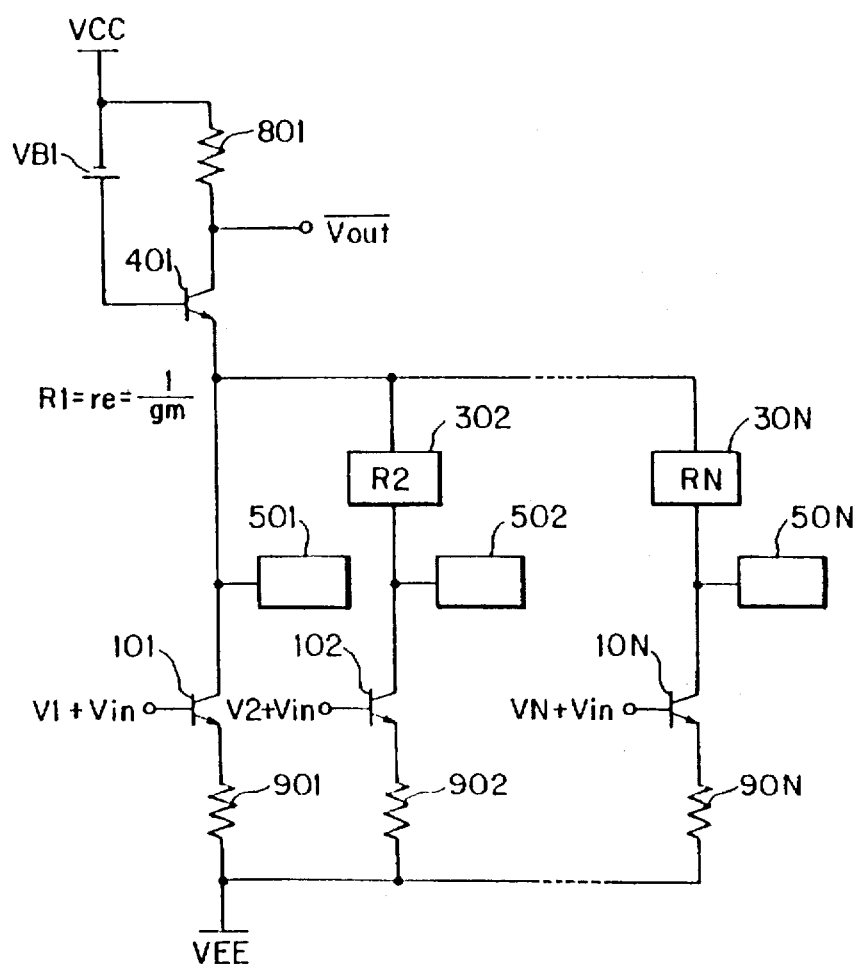
FIG. 29 is a block diagram showing the frequency band variable filter circuit according to the third embodiment of the present invention.

FIG. 29 is a diagram showing the frequency band variable filter circuit according to the third embodiment of the present invention. As shown in FIG. 29, according to the present embodiment, the signal path switching unit 21 shown in FIG. 26 is formed of the common-emitter transistor 101 grounded via the resistor 901, and the common-emitter transistors 102, ..., and 10N having the emitters grounded respectively via the resistors 902, ..., and 90N.

Figure 30:
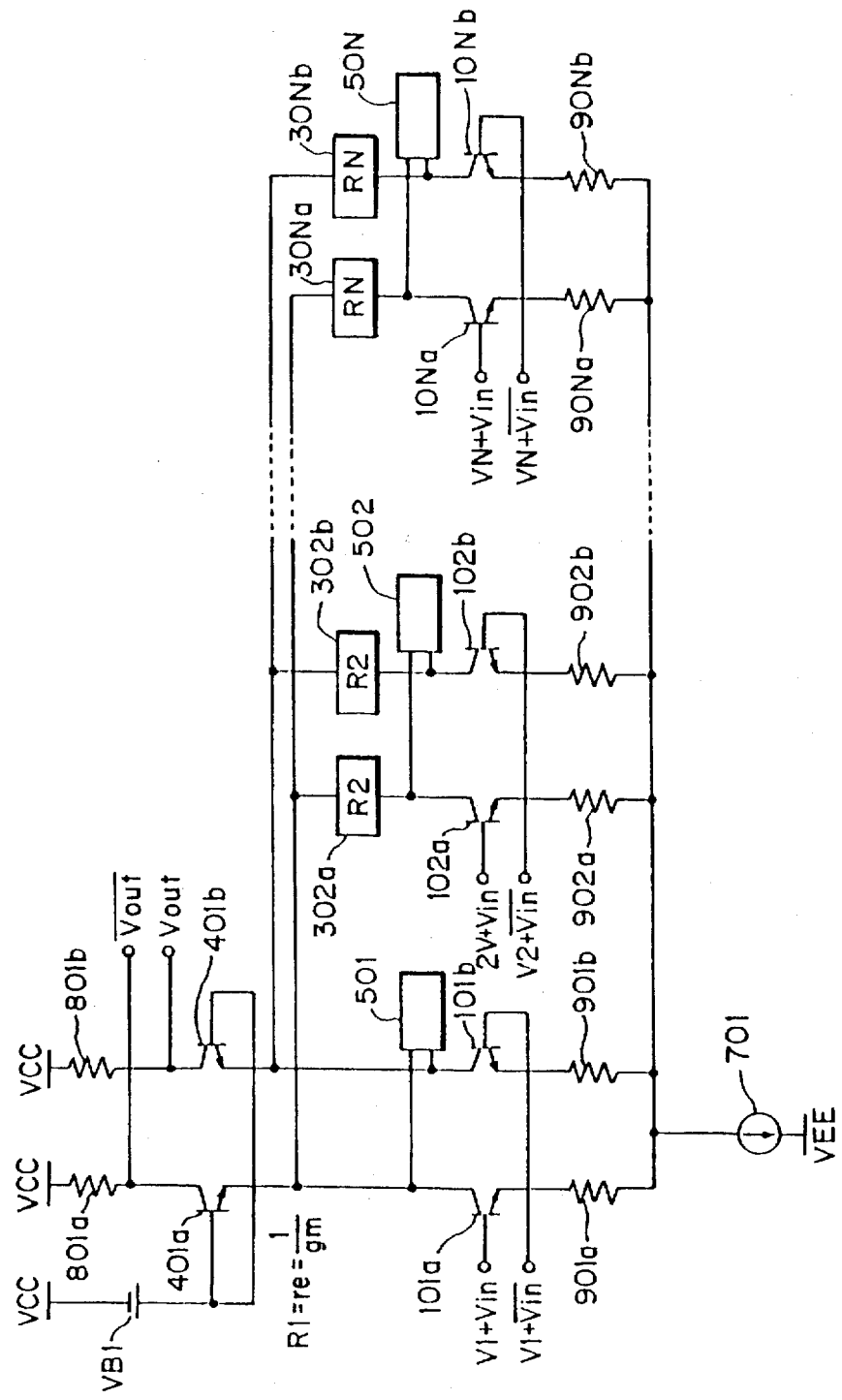
FIG. 30 is a block diagram showing the frequency band variable filter circuit according to the fourth embodiment of the present invention.

FIG. 30 is a diagram showing the frequency band variable filter circuit according to the fourth embodiment of the present invention. In FIG. 29, the circuit system is formed of the common-emitter transistors 101, 102 ..., and 10N, the resistors 302, ..., and 30N, the frequency range control circuits 501, 502, ..., and 50N, and the cascade transistors 401. However, as shown in FIG. 30, the circuit system has a differential pair configuration which includes the common-emitter transistors 101a, 101b, 102a, 102b, ..., 10Na, and 10Nb having the emitters connected to the constant current source 701 respectively via the resistors 901a, 901b, 902a, 902b, ..., 90Na, and 90Nb; the resistors 302a, 302b, ..., 30Na, and 30Nb; the frequency range control circuits 501, 502 ..., and 50N; and the cascade transistors 401a and 401b.

Figure 31:
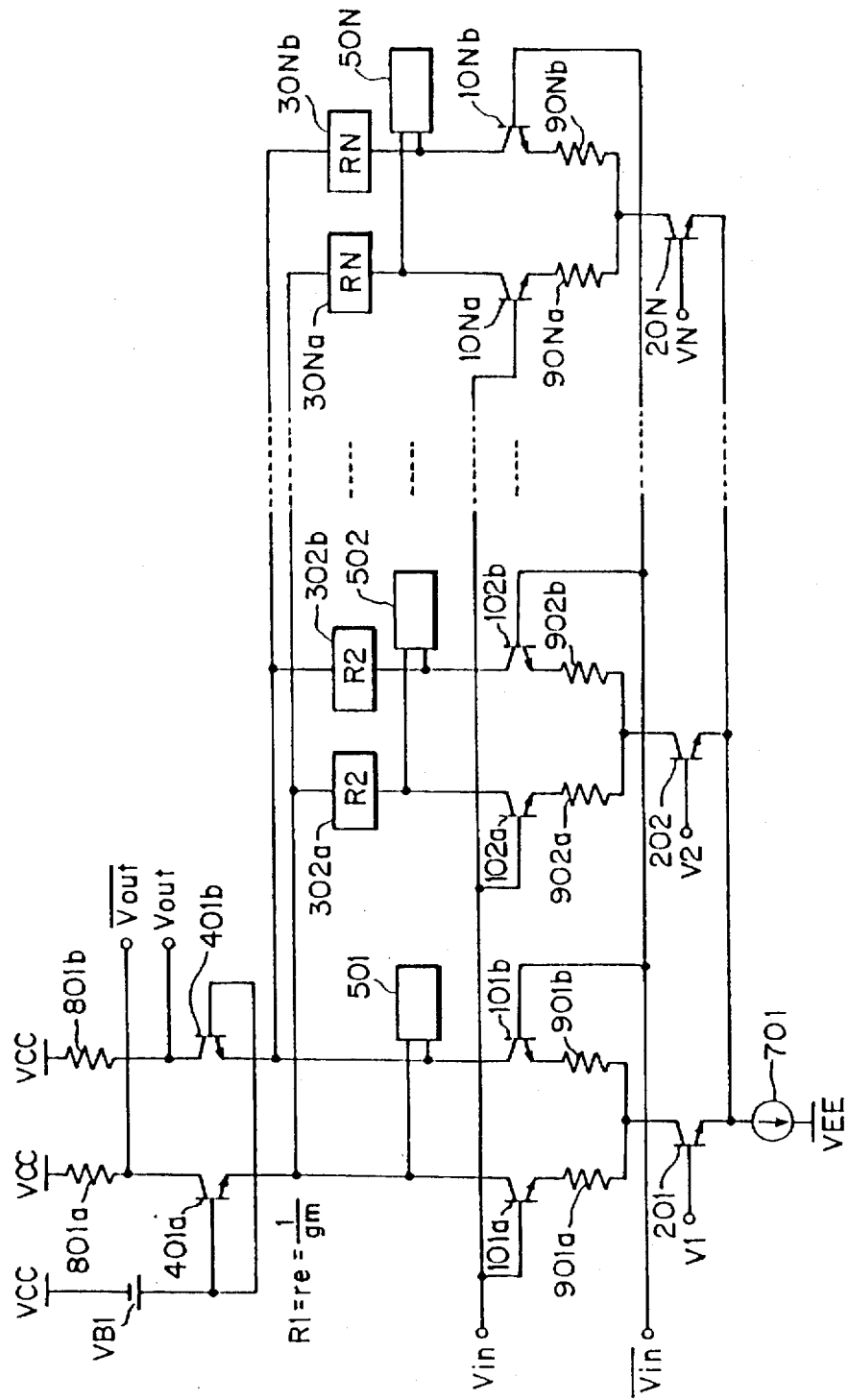
FIG. 31 is a block diagram showing the frequency band variable filter circuit according to the fifth embodiment of the present invention.

FIG. 31 is a diagram showing the frequency band variable filter circuit according to the fifth embodiment of the present invention. As shown in FIG. 31, the signal path switching units 21 formed of the common-emitter transistors 101a, 102a, ..., and 10Na, and 101b, 102b, ..., and 10Nb include differential transistor pairs 101a, 101b, 102a, 102b, ..., 10Na, 10Nb; the transistors 201 202, ..., and 20N 202, .. .. and 20N having the collectors connected in common to the emitters of the transistors 101a, 101b, 102a, 102b, ..., 10Na, and 10Nb; and the current source 701 connected in common to the emitters of the transistors 201, 202, ..., and 20N.

In the fourth to sixth embodiments, the emitter ground transistors, or the differential transistor pairs, can be switched by means of the control voltages V1, V2, ..., and VN. Since the control voltages V1, V2, ..., and VN are interposed to the input voltage Vin, the signal input transistor 101 shown in FIG. 2 as well as the signal input transistors 101a and 101b shown in FIG. 28 can be omitted.

As described above, according to the frequency band variable filter circuit of the fourth to sixth embodiments of the present invention, like the second and third embodiments, the frequency range of the amplifying circuit arranged in the optical communications system, for example, can be matched with the optimum frequency range corresponding to the transmission rate of the received signal. Hence, there is an advantage in that the amplifying circuit can effectively amplify the signals and that the differential transistor configuration can be easily realized as an integrated filter circuit. Moreover, there is an advantage in that the control voltage added to the input signal allows the simplified filter circuit configuration, whereby an integrated filter circuit can be easily realized.

The frequency control range can be widened as described with reference to FIGS. 27 and 28.

Figure 32:
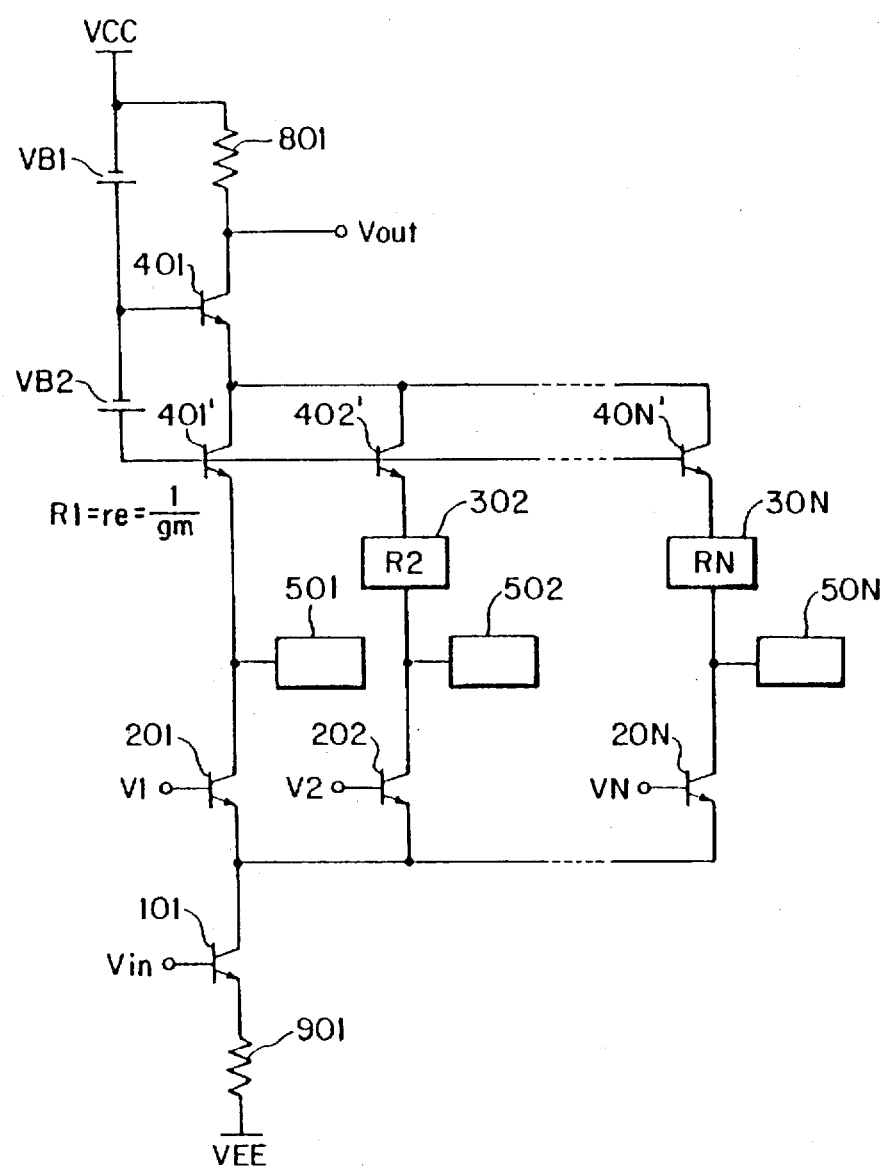
FIG. 32 is a block diagram showing the frequency band variable filter circuit according to the sixth embodiment of the present invention.

FIG. 32 is a diagram showing the frequency band variable filter circuit according to the sixth embodiment of the present invention. As shown in FIG. 32, in the first embodiment (refer to FIG. 27), the filter circuit includes the transistors 401', 402', ..., and 40N' having the collector connected in common to the emitter of the cascade transistor 401, the emitter connected to the collector of the transistor 201 and to the resistors 302, ..., and 30N, and the base connected in common to the bias power source VB2.

Figure 34:
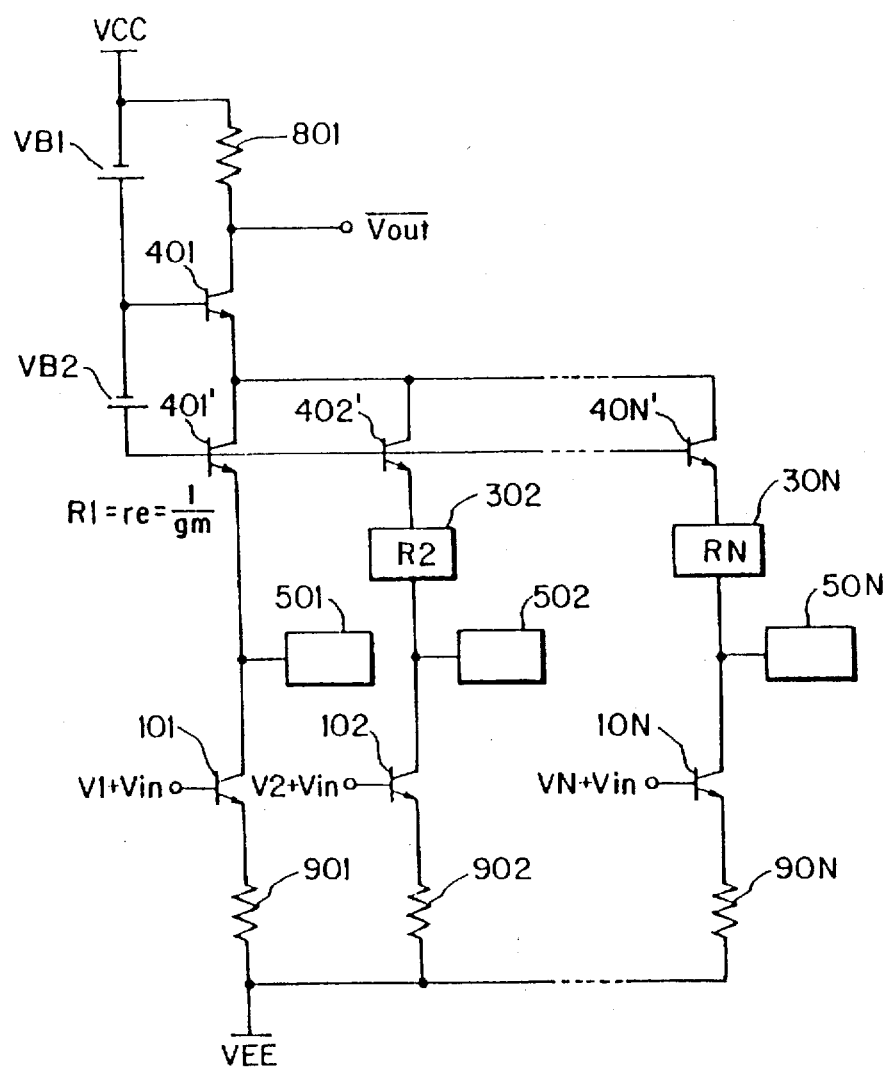
FIG. 34 is a block diagram showing the frequency band variable filter circuit according to the eighth embodiment of the present invention.
Figure 35:
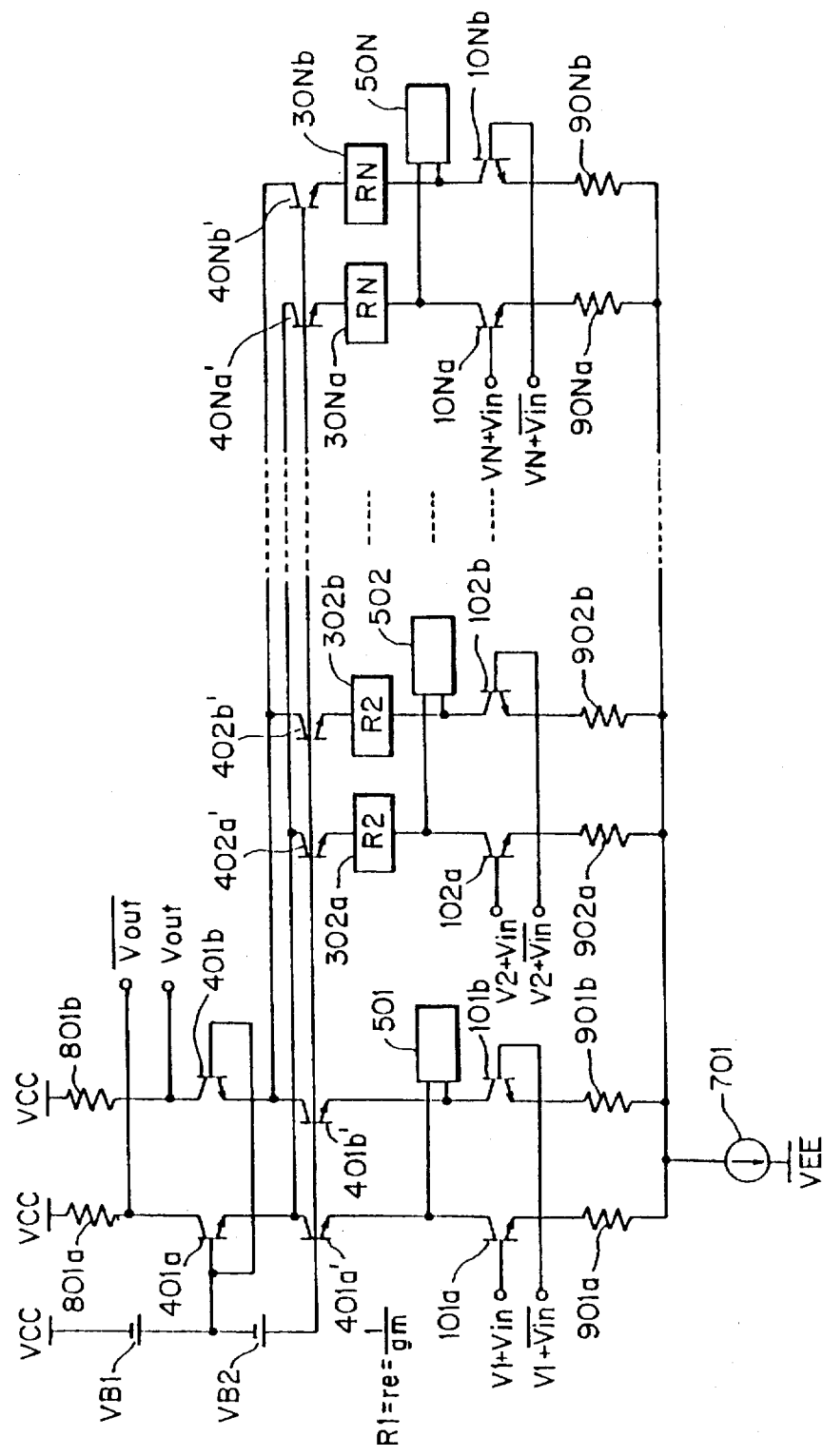
FIG. 35 is a block diagram showing the frequency band variable filter circuit according to the ninth embodiment of the present invention.

FIG. 34 is a diagram showing the frequency band variable filter circuit according to the eighth embodiment of the present invention. As shown in FIG. 34, in the third embodiment (refer to FIG. 29), the filter circuit includes the cascade transistors 401', 402', ..., and 40N' having the collectors connected in common to the emitter of the transistor 401, the emitters connected to collector of the emitter ground transistor 101 and to the resistors 302, ..., and 30N, and the bases connected in common to the bias power source VB2.

In the first to fifth embodiments described with reference to FIGS. 27 to 31, when the resistor RN is relatively small at N=1, the parasitic capacitance of the N (N≠1)-th control circuit is apparently added in parallel to the first range control unit, thus not being dumped by means of the resistor RN, whereby the maximum frequency range is adversely affected. However, the seventh to ninth embodiments relates to the circuit configuration which can prevent the adverse effect.

That is, the degradation in the maximum frequency range can be avoided by inserting the transistors 401', 402', ..., and 40N' each which has the emitter connected to the resistor RN, and the collector connected to the emitter of the cascade transistor 401.

As described above, according to the frequency band variable filter circuit of the seventh to ninth embodiments of the present invention, like the above-mentioned embodiments, the frequency range of the amplifying circuit arranged in the optical communications system, for example, can be matched with the optimum frequency range corresponding to the transmission rate of the received signal. Hence, there is an advantage in that the amplifying circuit can effectively amplify the signals and the differential transistor configuration can easily realize an integrated filter circuit. Moreover, there is an advantage in that the differential transistor configuration can easily realize as an integrated filter circuit. In addition, since the cascaded transistors 401', 402', . . . , and 40N' can advantageously avoid the degradation in the maximum frequency, the optimum frequency range can be widened.

Figure 33:
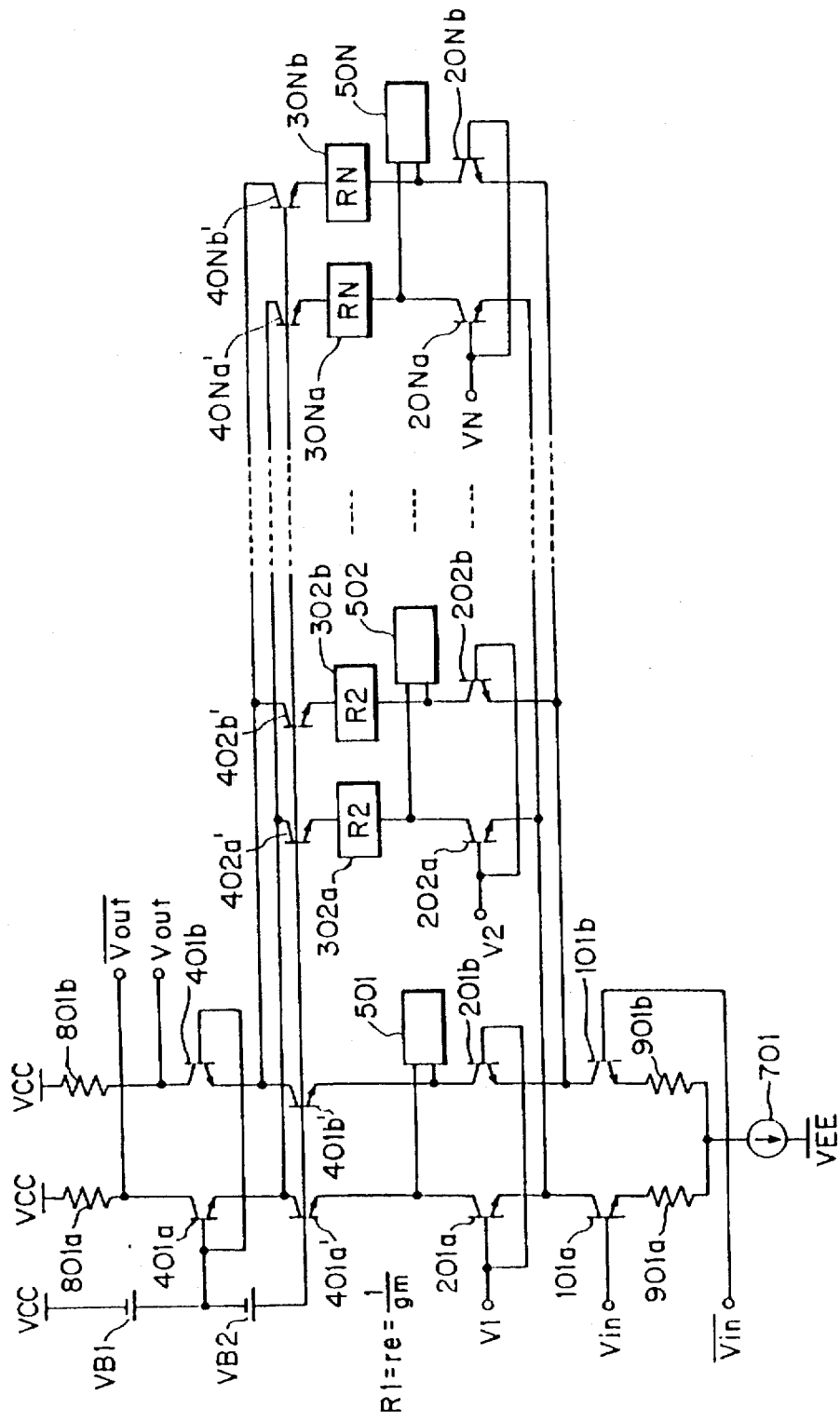
FIG. 33 is a block diagram showing the frequency band variable filter circuit according to the seventh embodiment of the present invention.
Figure 36:
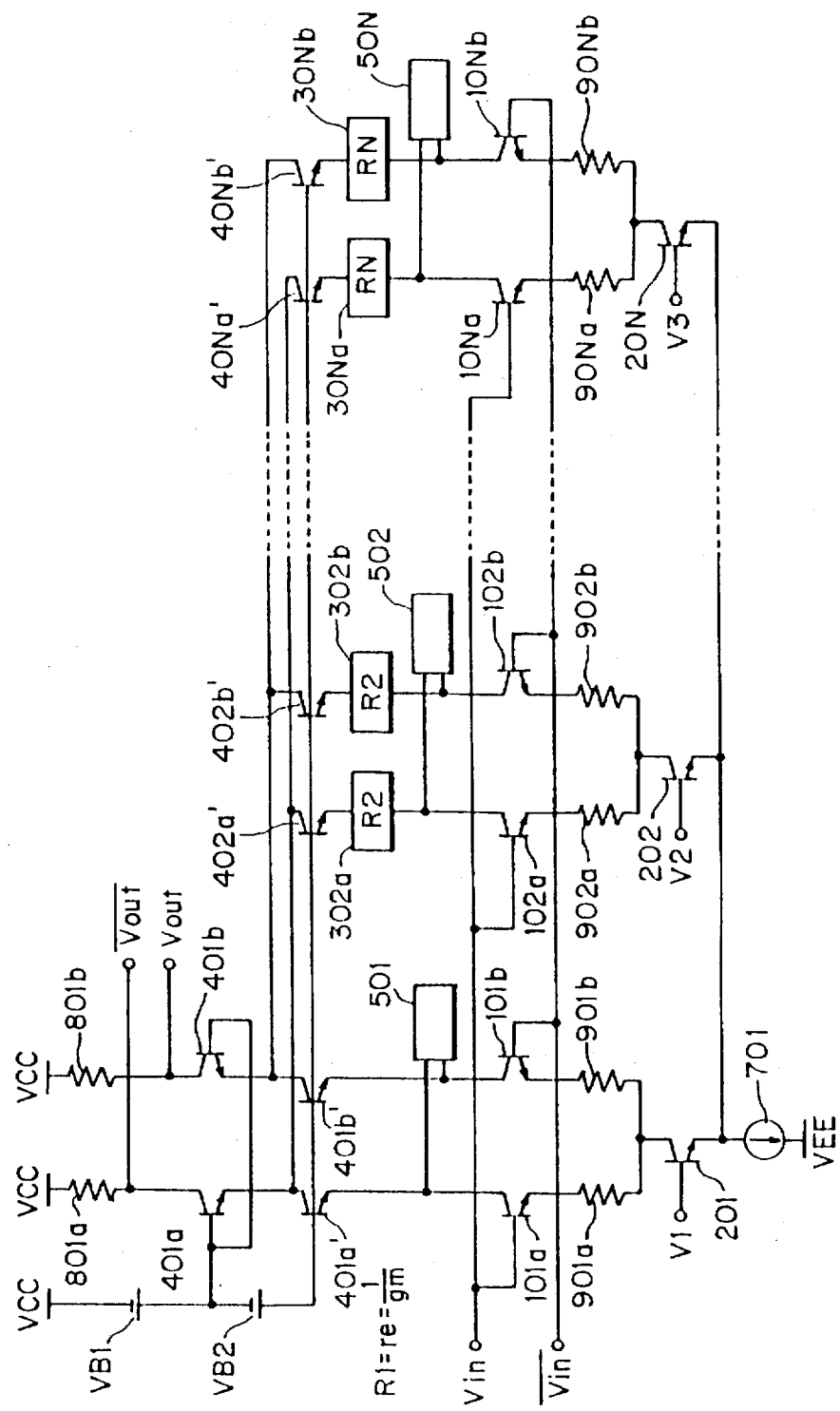
FIG. 36 is a block diagram showing the frequency band variable filter circuit according to the tenth embodiment of the present invention.
Figure 37:
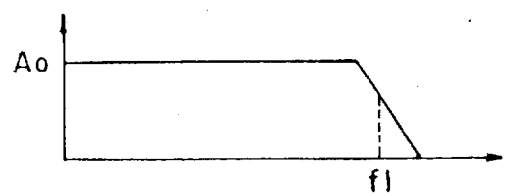
FIGS. 37(a), 37(b), and 37(c) are diagrams each explaining the frequency characteristic of the frequency band variable filter circuit according to the eleventh embodiment of the present invention.
Figure 37:
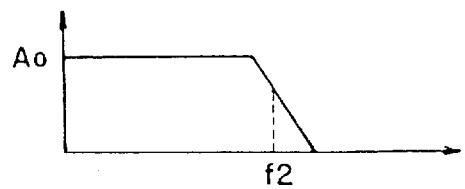
Figure 37:
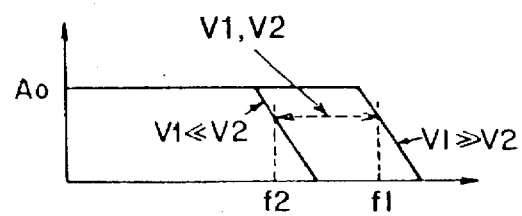

FIGS. 33, 34, and 36 are diagrams each showing the configuration of the frequency band variable filter circuit relating to the seventh, ninth and tenth embodiments of the present invention. The transistors 401a', 401b', 402a', 402b', . . . , 40Na', and 40Nb', each of which has the emitter connected to the resistor RN and the collector connected to the emitters of the transistors 401a', and 401b', are inserted to the circuit configuration, shown in FIGS. 28, 30, and 31 according to the second, fourth, and fifth embodiments. Thus, the degradation in the maximum frequency range can be avoided.

For that reason, in the frequency band variable filter circuits according to the seventh, ninth and tenth embodiments of the present invention (shown in FIGS. 33, 35 and 36), the transistors 401', 402', . . . , and 40N' can avoid the degradation in the maximum range, in addition to the effect described with the second, fourth, and fifth embodiments. Hence there is an advantage in that the maximum frequency range can be broadly obtained.

FIGS. 37(a), 37(b), and 37(c) are diagrams each explaining the operational of the frequency band variable filter circuit according to the eleventh embodiment of the according to the present invention. To describe the operation of the above-mentioned circuit, the circuit of the second embodiment, shown in FIG. 28, is shown below as an example. The circuit configuration shown in FIG. 28, for example, has two signal transmission paths. In the first to tenth embodiments, the control voltages V1 and V2 have amplitudes enough to cut off the transistors 201a and 202a, and 201b and 202b necessarily. In the eleventh embodiment, for example, the range control unit in the first signal transmission path is set to a broad range, as shown in 37(a), while the range control unit in the second signal transmission path is set to a narrow range, as shown in FIG. 37(b). At the same time, a potential difference between the control voltages V1 and V2 has an amplitude at which the transistors 201a, 202a, 201b, and 202b are turned on.

As shown in FIG. 37(c), when only the first signal transmission path is in on-state (or V1>>V2), the filter circuit exhibits the maximum frequency range. When only the second signal transmission path is in on-state (or V1<<V2), the filter circuit exhibits the minimum frequency range.

When the potential difference of the control voltage V1 turns on the transistors 201a and 202a, and the potential difference of the control voltage V2 turns on 201b and 202b, the filter circuit shows the frequency characteristics with the two paths overlaid, as shown in FIG. 37(c). Hence, the frequency range between the minimum range and the maximum range can be controlled by setting arbitrarily the control voltages V1 and V2.

In the above explanation, the second embodiment has been explained. However, the operation can be applied to the first embodiment and the third to tenth embodiments.

Figure 38:
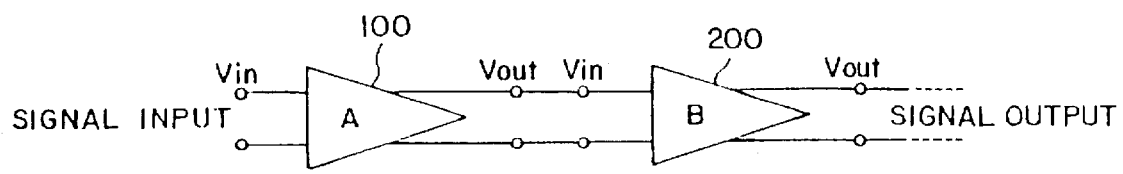
FIG. 38 is a diagram showing the frequency band variable filter circuit according to the twelfth embodiment of the present invention.
Figure 39:
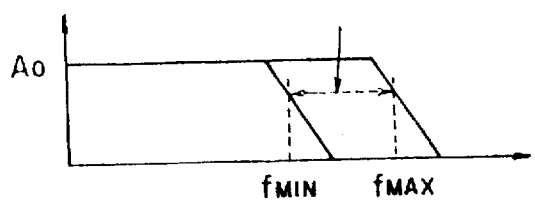
FIGS. 39(a), 39(b), and 39(c) are diagrams each explaining the frequency characteristic of the frequency band variable filter circuit according to the twelfth embodiment of the present invention.
Figure 39:
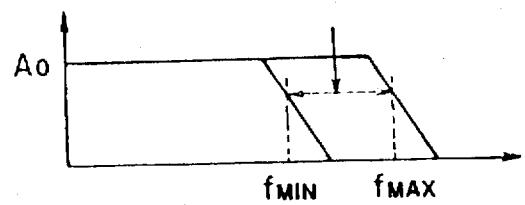
Figure 39:
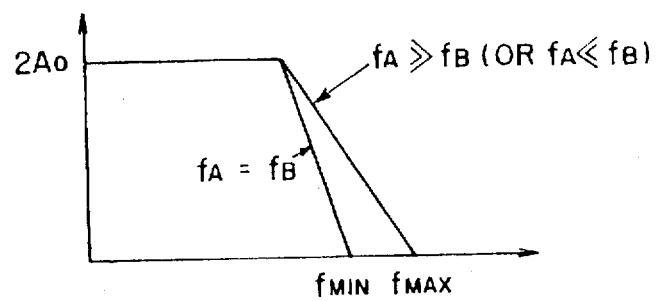

FIG. 38 is a diagram showing the frequency band filter circuit according to the twelfth embodiment of the present invention. The frequency band variable filter circuits according to the first to eighth embodiments (shown in FIGS. 27 to 34) are cascaded in a two stage. The frequency characteristics of the frequency band variable filter circuit 100(A) is shown in FIG. 39(a) while the frequency characteristics of the frequency range variable filter circuit 200(B) is shown in FIG. 39(b). If the frequency range fA of the filter circuit A and the frequency range fB of the filter circuit B are controlled independently, when fA=fB, the frequency characteristics of the cascaded circuit exhibit the composite characteristics of the filter circuits A and B, as shown in FIG. 39(c). The cut-off unit has a secondary order.

As shown in FIG. 39(c), if fA >>fB, the filter circuit B is dominant in the frequency characteristic of the cascaded circuit and if fA<<fB, the filter circuit A is dominant in the frequency characteristic of the cascaded circuit. The cut-off unit has a primary order.

As described above, according to the twelfth embodiment of the present invention, the frequency band variable filter circuit controls each frequency range independently, thus setting the frequency range and the cut-off order. Since the Nstage cascaded circuit can switch its cut-off order from the first stage to the N-th stage, filter circuits with different characteristics can be formed as a single integrated circuit. This structure can suppress the circuit to the minimum scale and improve largely the performance of the amplifying circuit.

In the present embodiment, the circuit has been described, which is formed by cascading the circuits shown in the first to eighth embodiments. In addition, the circuits according to the ninth to tenth embodiments can be applied to the present embodiment.

Figure 40:
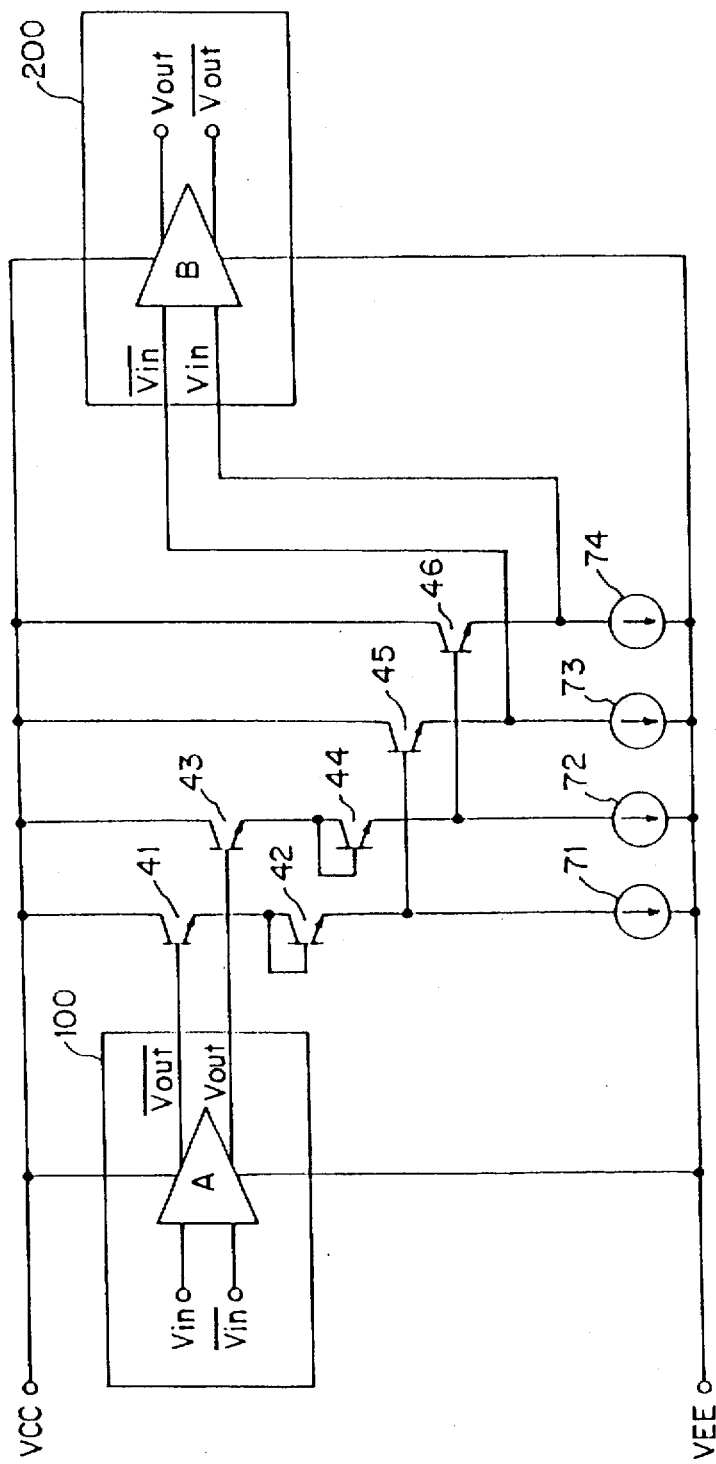
FIG. 40 is a diagram showing the concrete cascode connection configuration of the embodiment shown in FIG. 38.

FIG. 40 is a connection diagram showing the configuration where the frequency band variable filter circuits 100 and 200 are cascaded in a tandem form. This figure shows mainly the connection between the signal output of the frequency band variable filter circuit 100 and the signal input of the frequency band variable filter circuit 200.

Next, explanation will be made below as to three embodiments according to the present invention. For simple explanation, two signal transmission paths are shown.

Figure 41:
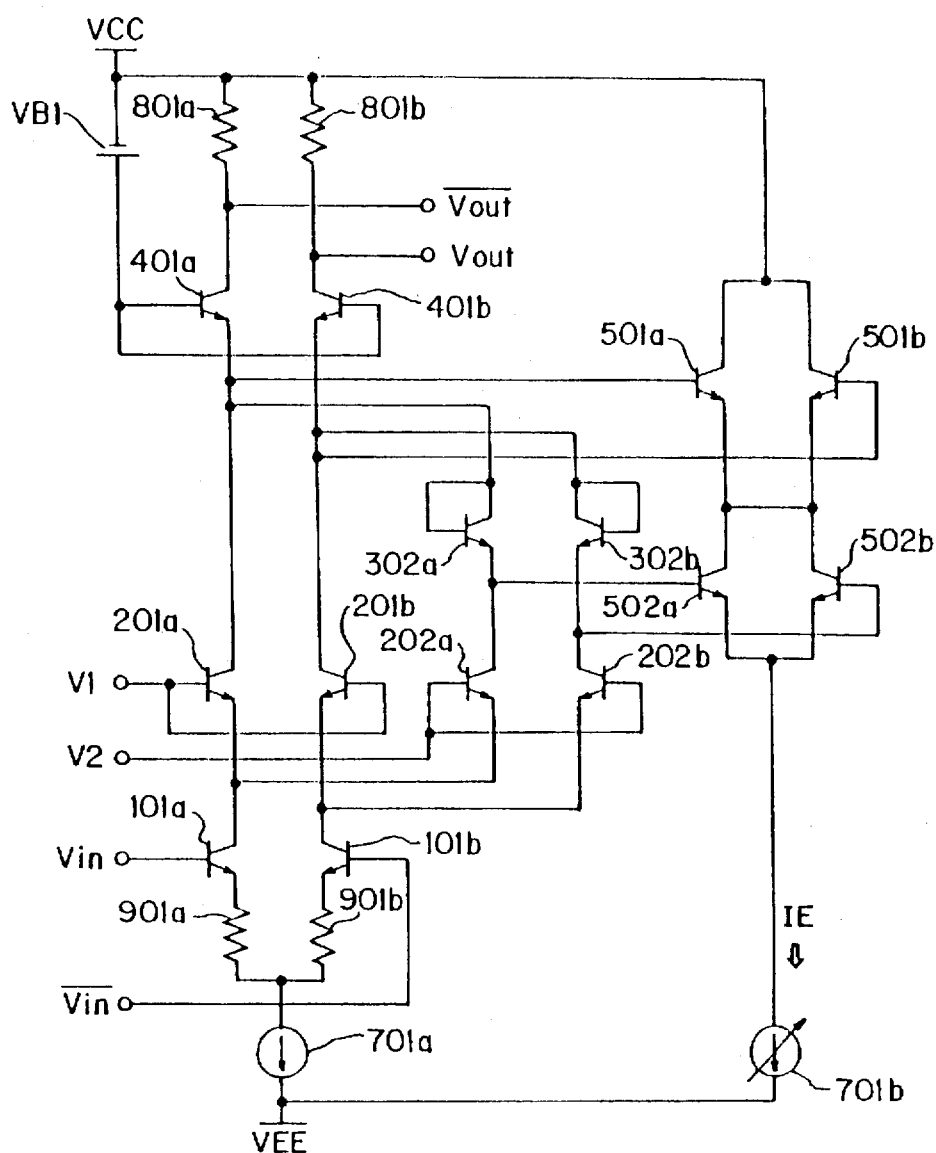
FIG. 41 is a diagram showing the frequency band variable filter according to the second embodiment of the present invention.

FIG. 41 is a diagram showing the frequency band variable filter circuit according to the second embodiment of the present invention (shown in FIG. 28). There are two signal transmission paths. The signal transmission path is switched by a voltage added to the control voltages V1 and V2.

The frequency range control circuit along the first signal transmission path consists of the transistors 401a and 401b, and the differential transistor pair 501a and 501b.

The frequency range of the first signal transmission path is decided by the emitter resistance $r_e$ of each of the cascade transistors 401a and 401b and the emitter diffusion capacitance Cd of each of the differential transistor pair 501a and 501b. The frequency range can be controlled by adjusting the current IE flowing through the differential transistor pair 501a and 501b.

The ranges $f_{CNTL}$, $f_{CNTL(MAX)}$, and $f_{CNTL(MIN)}$ of the control unit can be expressed by the following formulas:

$$f_{CNTL} = \frac{1}{2\pi r_e (Cd(I_E) + C_{JE} + C_{JC})}$$

$$f_{CNTL(MAX)} = \frac{1}{2\pi r_e (C_{JE} + C_{JC})}$$

$$f_{CNTL(MIN)} = \frac{1}{2\pi r_e Cd(I_{E(MAX)})}$$

The frequency range control circuit along the second signal transmission path consists of the transistors 401a and 401b; the diodes 302a and 302b connected respectively and serially to the emitters of the transistors 401a and 401b; and the differential transistor pair 502a and 502b.

The frequency range of the second signal transmission path is decided by the emitter resistance $r_e$ of each of the transistors 401a and 401b, the output resistance $r_e$ of each of the diodes 302a and 302b connected serially to the emitter resistors $r_e$ of the cascade transistors 401a and 401b, respectively, and the emitter diffusion capacitance Cd of each of the differential transistor pair 502a and 502b. The frequency range can be controlled by adjusting the current IE flowing through the differential transistor pair 502a and 502b.

The ranges fCNTL, fCNTL(MAX), and fCNTL(MIN) of the control unit can be expressed by the following formulas:

$$f_{CNTL} = 1/2\pi(r_e+r_d)(Cd(I_E)+C_{JB}+C_{JC})$$

$$f_{CNTL(MAX)} = 1/2\pi(r_e+r_d)(C_{JB}+C_{JC})$$

$$f_{CNTL(MIN)} = 1/2\pi(r_e+r_d)Cd(I_{E(MAX)})$$

Therefore, the entire frequency range controlled ranges from fCNTL(MIN) to fCNTL(MAX).

Figure 42:
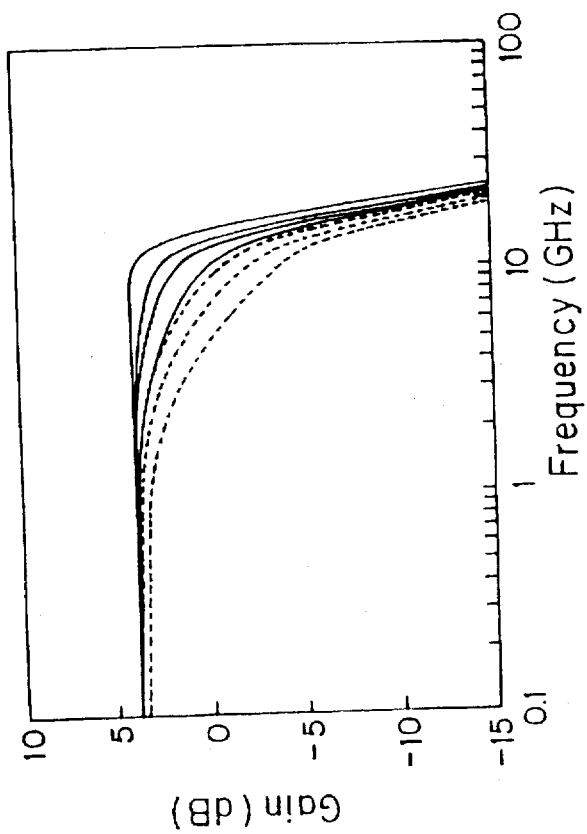
FIG. 42 is a graph showing an example of the result simulated by means of SPICE.

FIG. 42 is a diagram showing the result obtained by simulating the circuit shown in FIG. 41.

Referring to FIG. 42, the solid lines show the simulation result obtained by controlling the current from the variable current source 701b when a signal propagates along the first signal transmission path. The frequency range can be varied by controlling the emitter current of each of the transistors 501a, 501b, 502a, and 502b variable current source 701b, using the variable current source 701b.

Dotted lines show the simulation result obtained by controlling the current from the variable current source 701b when a signal propagates along the second signal transmission path. The frequency range can be varied by controlling the emitter current of each of the transistors 501a, 501b, 502a, and 502b, using the variable current source 701b.

Since the control voltages V1 and V2 switch the signal transmission path switching and control the current from the variable current source 701, the frequency range can be controlled to the extent shown with the solid lines and the dotted lines.

Figure 43:
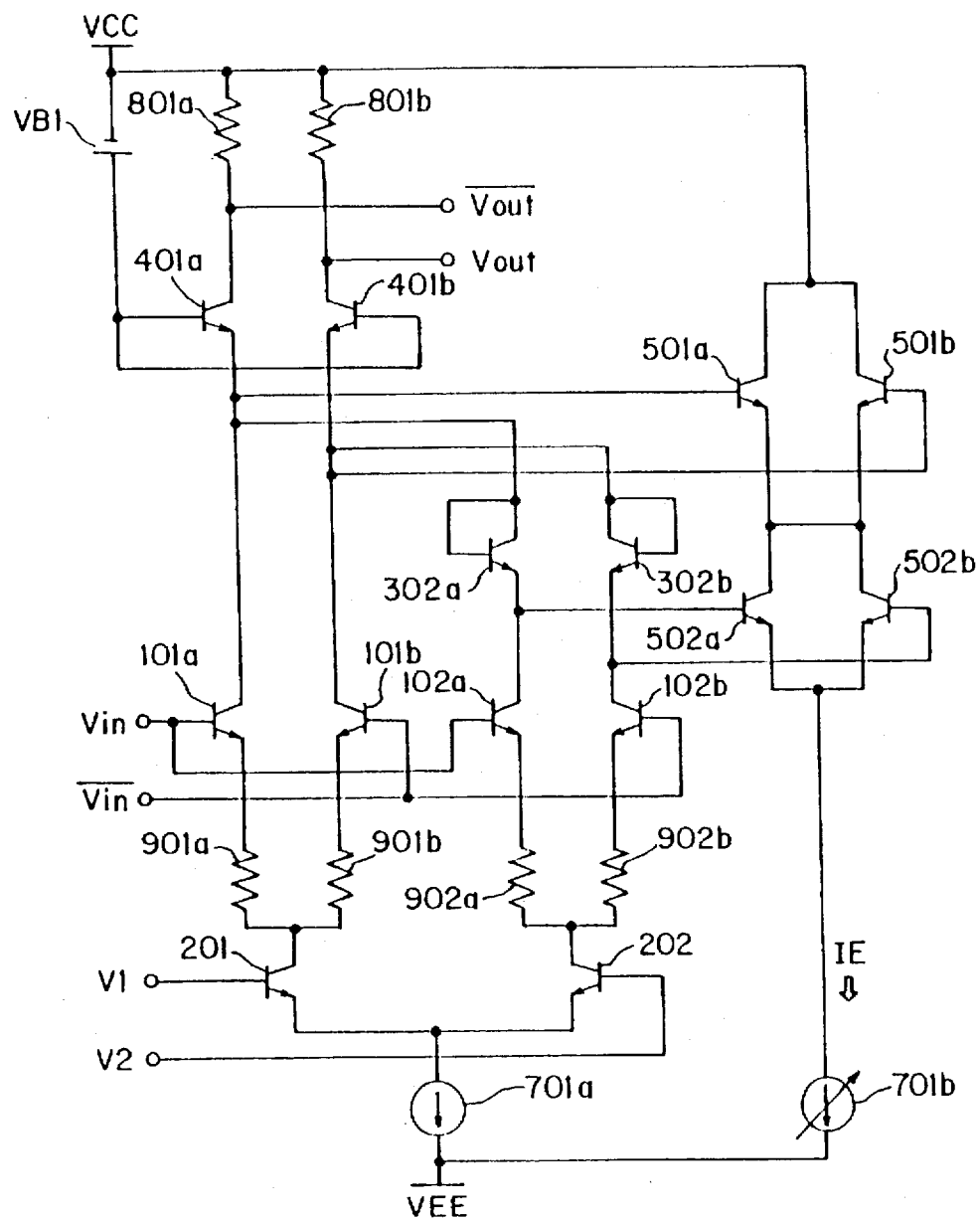
FIG. 43 is a diagram showing the frequency band variable filter according to the fifth embodiment of the present invention.

FIG. 43 shows the fifth embodiment of the present invention shown in FIG. 31. There are two signal transmission paths. The signal transmission path can be switched by means of a voltage added to the control voltages V1 and V2. The frequency range control circuit operates, like that shown in FIG. 41. Hence the duplicate explanation will be omitted here.

Figure 44:
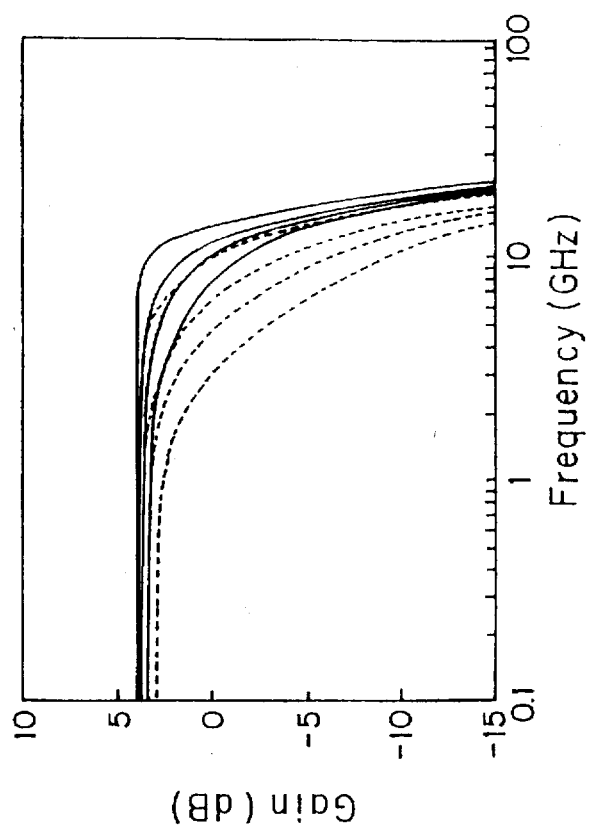
FIG. 44 is a graph showing an example of the result that SPICE simulated the circuit shown in FIG. 43.

FIG. 44 is a diagram showing the result obtained by simulating the circuit shown in FIG. 43. This simulation result is similar to that shown in FIG. 42.

Figure 45:
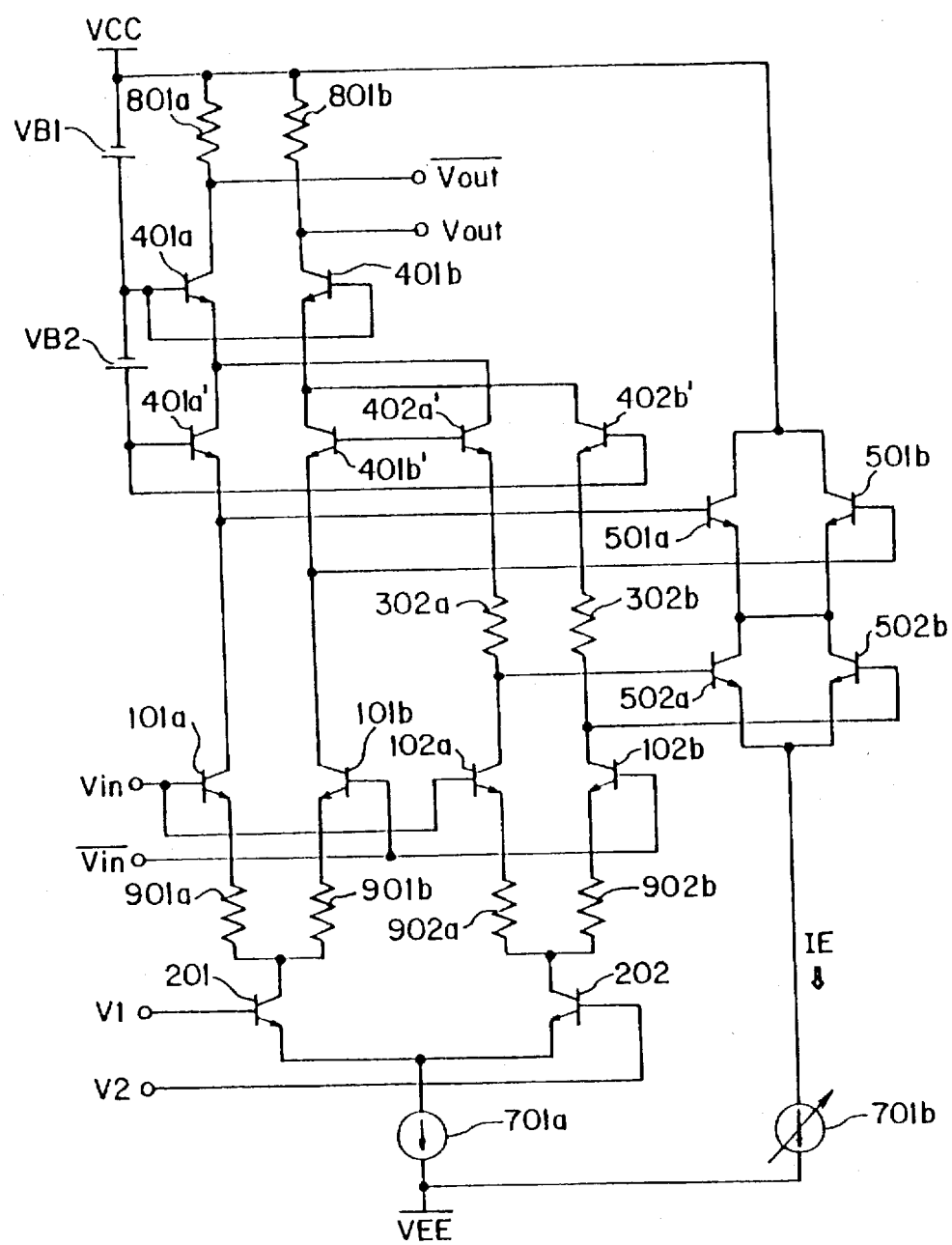
FIG. 45 is a diagram showing the frequency band variable filter according to the tenth embodiment of the present invention.
Figure 46:
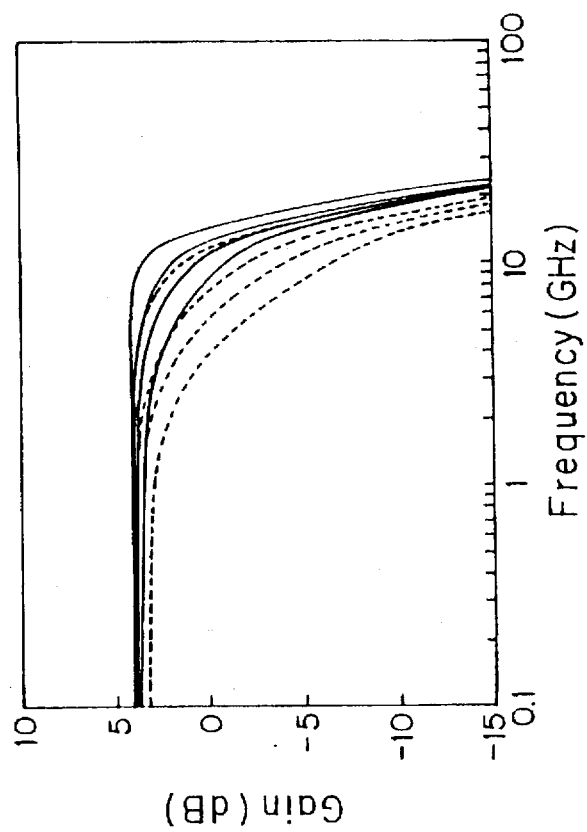
FIG. 46 is a graph showing an example of the result that SPICE simulated the circuit shown in FIG. 45.

FIG. 45 shows the frequency band variable filter circuit according to the tenth embodiment of the invention, related to that shown in FIG. 36. This example shows two signal transmission paths. The signal transmission paths can be switched by applying the control voltages V1 and V2.

The frequency range control circuit along the first transmission path consists of the transistors 401a', and 401b', and the differential transistor pair 501a and 501b. The frequency range control circuit along the second transmission path consists of the transistors 402a', and 402b', the resistors 302a and 302b connected serially to the emitters of the transistors 402' and 402b', respectively, and the differential transistor pair 502a and 502b.

The operation of the frequency range control circuit is similar to that shown in FIG. 41. Hence the duplicate explanation will be omitted here.

Figure 47A:
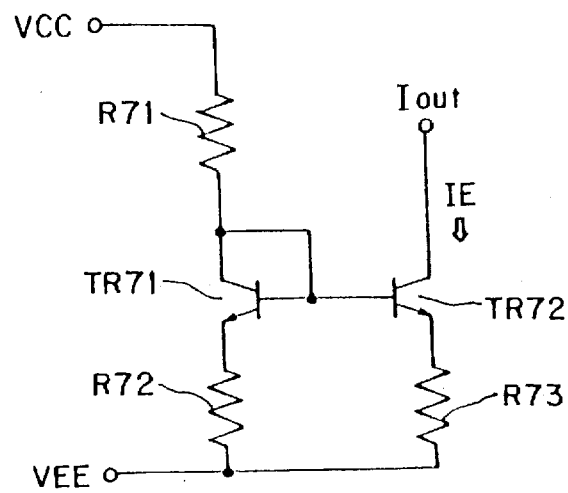
FIGS. 47(a) and 47(b) are diagrams each showing the structural example of a current source.
Figure 47B:
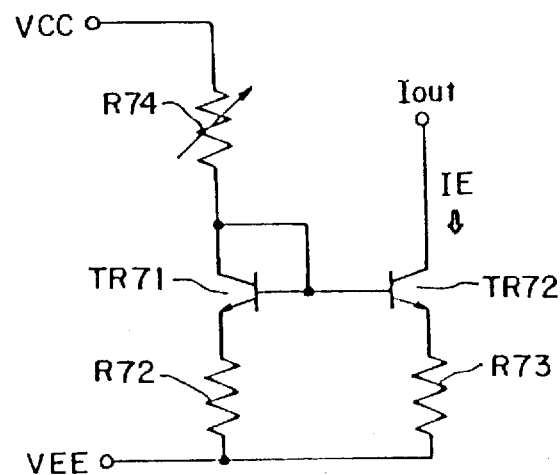
Figure 48:
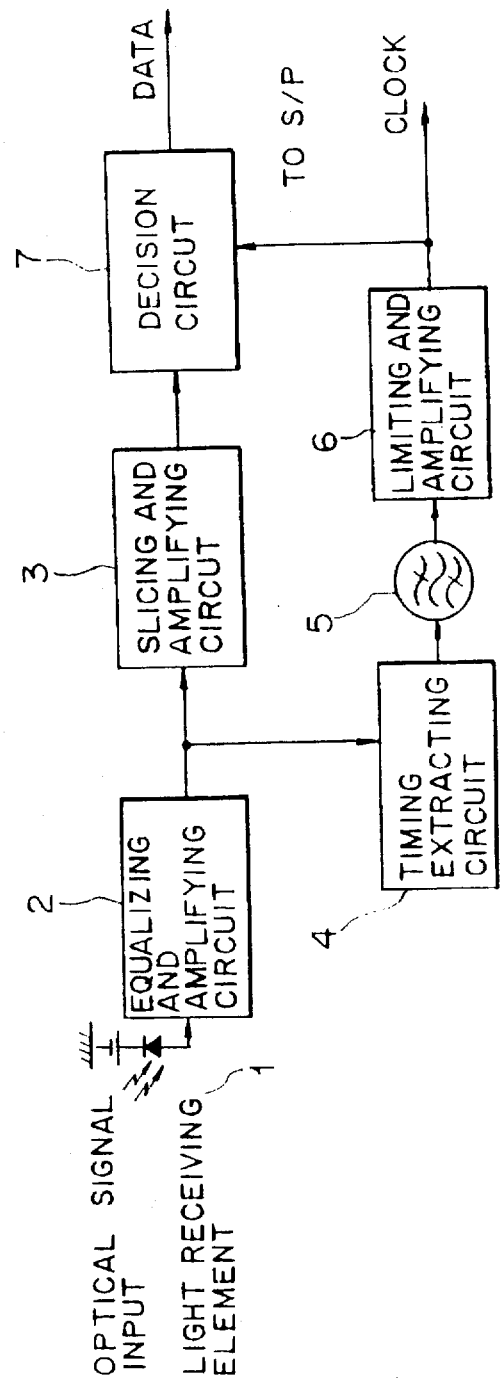
FIG. 48 is a diagram showing the configuration of the optical signal receiving unit in an optical communications system.

FIG. 47(a) shows the configuration of the constant current source used for the embodiments according to the present invention. FIG. 47(b) shows the configuration of the variable current source used for the embodiments according to the present invention. The current source with a current Miller circuit, shown in FIG. 47(a), can produce the current Iout at the same value as that flowing through the transistor TR71.

The variable current source, shown in FIG. 47(b), can vary its output current Iout by adjusting the resistor R74.

The frequency band variable filter circuits including cascade transistors or bipolar transistors ' acting as active elements have been described throughout all the above-mentioned embodiments. However, in the fundamental operation, similar circuits can be formed of field-effect transistors.

Use of the field-effect transistors allows digital circuits to be integrated very easily with the filter circuit on the same chip.

INDUSTRIAL APPLICABILITY

As described above, according to the present invention, the active secondary low-pass filter circuit, the secondary high-pass filter circuit, the secondary band-pass filter circuit, the resonance circuit, and the frequency band variable filter circuit which can vary the cut-off frequency and resonance frequency can be easily realized and integrated without using discrete components such as coils and capacitors. Hence these filter circuits are effective in improvement of its characteristics and shrinkage in size. The filter circuits also are suitable to control the frequency band of the amplifier that amplifies weakened signals particularly used for the optical communications system to an optimum value.

We claim:

1. A low pass filter circuit having a secondary cut-off frequency characteristic comprising:

a first transistor T1 having a base or gate connected to a voltage point through a first resistor R1, said voltage point is stable to high-frequency components;

a second resistor R2 and a capacitor C1 each having one end connected to an emitter or source of said first transistor T1 and the other end connected to said voltage point which is stable to high-frequency components; and wherein said first resistor R1 and said first transistor T1 function as an inductive element of said circuit having an inductance value Leq1 defined by: $Leq_1 = R1/2\pi fT$, where fT is the transition frequency of T1.

2. A low pass circuit having a secondary cut-off frequency characteristic comprising:

a first transistor T7 having a base or gate connected to a first resistor R10, a collector or drain connected to a first voltage point which is stable to high-frequency components, and an emitter or source connected to a constant current source CCS3;

a second resistor R11 and a capacitor C5 each having one terminal connected to the emitter or source of said first transistor T7 and the other terminal connected to a second voltage point which is stable to high-frequency components;

wherein said first resistor R10 and said first transistor T7 function as an inductive element of said circuit having an inductance value Leq2 defined by: $Leq_2 = R10/2\pi fT$, where fT is the transition frequency of T7.

* * * * *